US008441839B2

(12) United States Patent
Azuma et al.

(10) Patent No.: US 8,441,839 B2
(45) Date of Patent: May 14, 2013

(54) CROSS POINT VARIABLE RESISTANCE NONVOLATILE MEMORY DEVICE

(75) Inventors: Ryotaro Azuma, Osaka (JP); Kazuhiko Shimakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 18 days.

(21) Appl. No.: 13/380,624

(22) PCT Filed: Jun. 2, 2011

(86) PCT No.: PCT/JP2011/003125
§ 371 (c)(1),
(2), (4) Date: Dec. 23, 2011

(87) PCT Pub. No.: WO2011/152061
PCT Pub. Date: Dec. 8, 2011

(65) Prior Publication Data
US 2012/0099367 A1    Apr. 26, 2012

(30) Foreign Application Priority Data
Jun. 3, 2010    (JP) .................................. 2010-128354

(51) Int. Cl.
*G11C 11/00*    (2006.01)
(52) U.S. Cl.
USPC ........................................................ 365/148
(58) Field of Classification Search .................. None
See application file for complete search history.

(56) References Cited

U.S. PATENT DOCUMENTS

| | | |
|---|---|---|
| 2006/0268594 A1 | 11/2006 | Toda |
| 2007/0165442 A1 | 7/2007 | Hosoi et al. |
| 2007/0285966 A1 | 12/2007 | Toda et al. |
| 2007/0285967 A1 | 12/2007 | Toda et al. |
| 2007/0285968 A1 | 12/2007 | Toda et al. |
| 2008/0123393 A1 | 5/2008 | Kinoshita |

(Continued)

FOREIGN PATENT DOCUMENTS

| | | |
|---|---|---|
| JP | 2006-203098 | 8/2006 |
| JP | 2007-188603 | 7/2007 |

(Continued)

OTHER PUBLICATIONS

International Search Report issued Jul. 12, 2011 in corresponding International Application No. PCT/JP2011/003125.

*Primary Examiner* — Hoai V Ho
*Assistant Examiner* — James G Norman
(74) *Attorney, Agent, or Firm* — Wenderoth, Lind & Ponack, L.L.P.

(57) ABSTRACT

A cross point variable resistance nonvolatile memory device includes memory cells having the same orientation for stable characteristics of all layers. Each memory cell (51) is placed at a different one of cross points of bit lines (53) in an X direction and word lines (52) in a Y direction formed in layers. In a multilayer cross point structure where vertical array planes sharing the word lines are aligned in the Y direction each for a group of bit lines aligned in a Z direction, even and odd layer bit line selection switch elements (57, 58) switch electrical connection and disconnection between a global bit line (56) and commonly-connected even layer bit lines and commonly-connected odd layer bit lines, respectively. A bidirectional current limiting circuit (92) having parallel-connected P-type current limiting element (91) and N-type current limiting element (90) is provided between the global bit line and the switch elements.

29 Claims, 42 Drawing Sheets

U.S. PATENT DOCUMENTS

| | | |
|---|---|---|
| 2008/0310211 A1 | 12/2008 | Toda et al. |
| 2009/0052225 A1 | 2/2009 | Morimoto |
| 2009/0273964 A1 | 11/2009 | Yamazaki et al. |
| 2009/0279344 A1* | 11/2009 | Toda .......................... 365/148 |
| 2010/0046273 A1 | 2/2010 | Azuma et al. |
| 2010/0165702 A1 | 7/2010 | Toda |
| 2010/0172171 A1 | 7/2010 | Azuma et al. |
| 2010/0177555 A1 | 7/2010 | Shimakawa et al. |
| 2011/0019462 A1 | 1/2011 | Toda |
| 2011/0044088 A1 | 2/2011 | Muraoka et al. |

FOREIGN PATENT DOCUMENTS

| | | |
|---|---|---|
| JP | 2008-147343 | 6/2008 |
| JP | 2009-4725 | 1/2009 |
| JP | 4377817 | 9/2009 |
| WO | 2004/084229 | 9/2004 |
| WO | 2006/137111 | 12/2006 |
| WO | 2008/149493 | 12/2008 |
| WO | 2009/001534 | 12/2008 |
| WO | 2009/141857 | 11/2009 |
| WO | 2010/021134 | 2/2010 |

* cited by examiner

FIG. 16
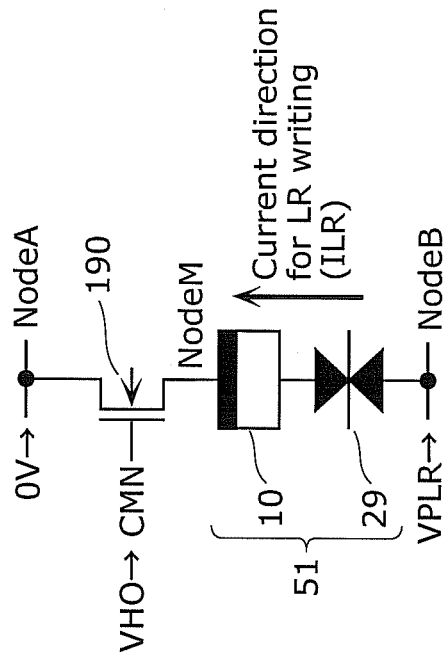
(b) Connection relation in saturation current limiting mode
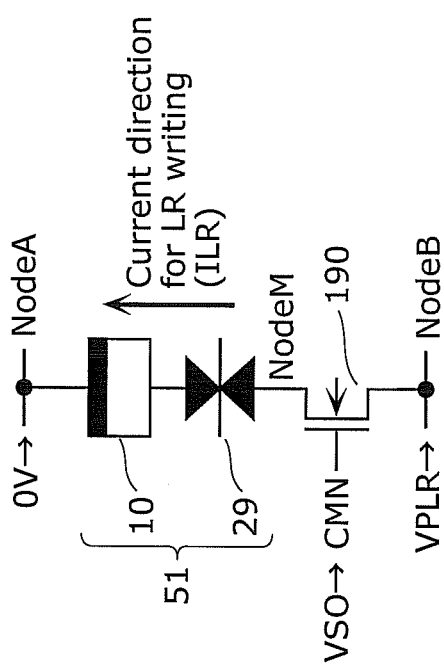
(a) Connection relation in source follower mode

FIG. 20

Characteristics of current limiting circuit in each writing in source follower mode

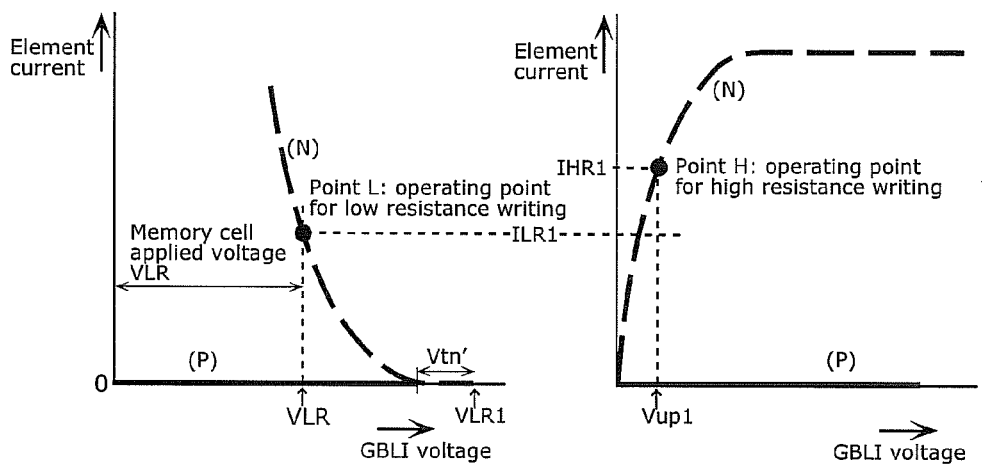

(a) Low resistance writing of odd layer memory cell (b) High resistance writing of odd layer memory cell (N): I-V characteristics of N-type current limiting element 90@Vg = VCMN
(P): I-V characteristics of P-type current limiting element 91@Vg = Vpof

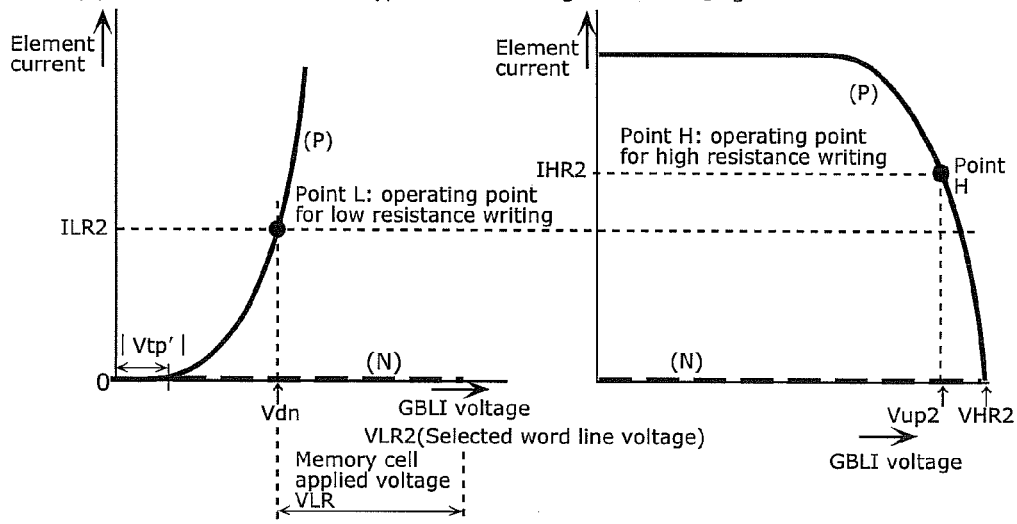

(c) Low resistance writing of even layer memory cell (d) High resistance writing of even layer memory cell (N): I-V characteristics of N-type current limiting element 90@Vg = 0V
(P): I-V characteristics of P-type current limiting element 91@Vg = VCMP

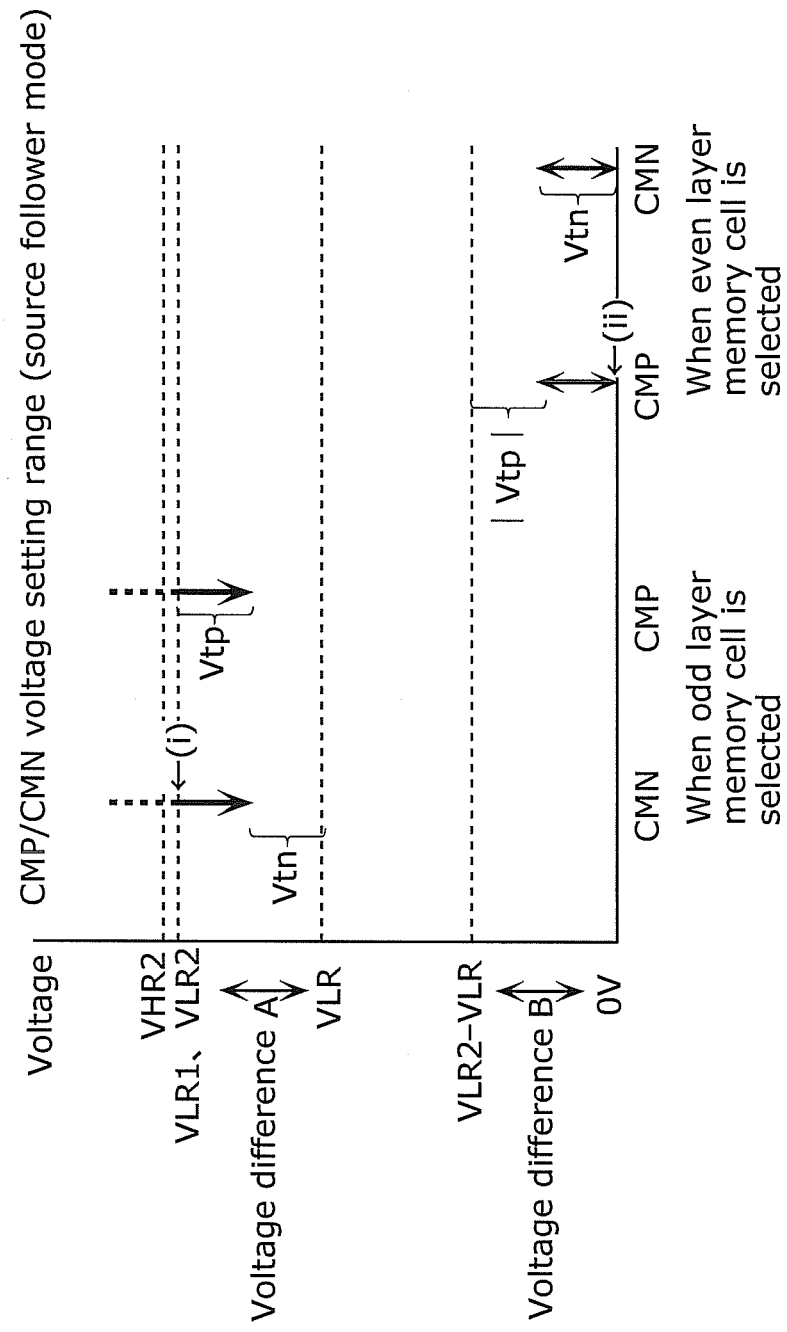

FIG. 24
Characteristics of current limiting circuit in each writing in saturation current limiting mode
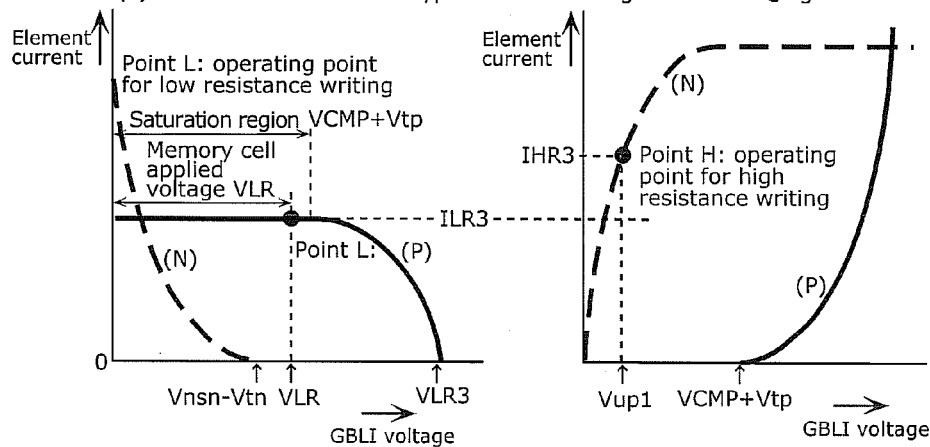
(a) Low resistance writing of odd layer memory cell
(b) High resistance writing of odd layer memory cell
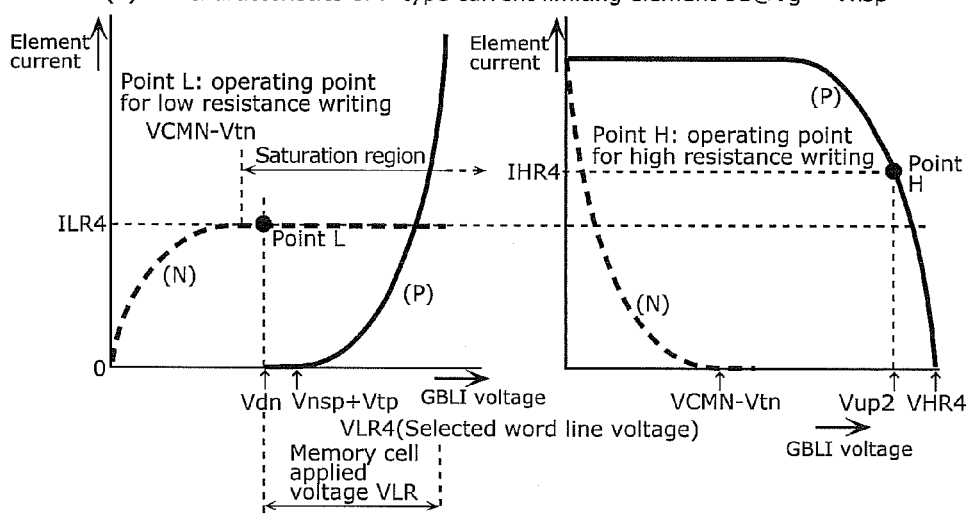
(c) Low resistance writing of even layer memory cell
(d) High resistance writing of even layer memory cell

CROSS POINT VARIABLE RESISTANCE NONVOLATILE MEMORY DEVICE

TECHNICAL FIELD

The present invention relates to a nonvolatile memory device having cross point memory cells that use variable resistance elements.

BACKGROUND ART

In recent years, research and development are conducted on a nonvolatile memory device having memory cells that use variable resistance elements. A variable resistance element is an element that has a property of changing in resistance value (changing between a high resistance state and a low resistance state) according to an electrical signal and enables information to be written by this change in resistance value.

One structure of memory cells using variable resistance elements is a cross point structure. In the cross point structure, each memory cell is placed at a different one of cross points of orthogonally arranged bit lines and word lines so as to be sandwiched between a bit line and a word line. Various types of such cross point variable resistance nonvolatile memory devices are developed in recent years (for example, see Patent Literatures (PTLs) 1 to 4).

PTL 1 discloses a nonvolatile memory device having memory cells that use bidirectional variable resistors in the cross point structure. In this nonvolatile memory device, for example a varistor is used as a bidirectional nonlinear element included in each memory cell, in order to reduce a leakage current which flows into an unselected memory cell.

PTL 2 discloses a writing method in a nonvolatile semiconductor memory device having resistance memory elements each of which has a high resistance state and a low resistance state and changes between the high resistance state and the low resistance state by voltage application. In the writing method, when changing a resistance memory element from the low resistance state to the high resistance state, a predetermined constant voltage that enables a resistance change is applied to the resistance memory element, thereby changing the resistance memory element to the high resistance state. When changing the resistance memory element from the high resistance state to the low resistance state, a predetermined constant current that enables a resistance change is caused to flow through the resistance memory element, thereby changing the resistance memory element to a resistance state of a low resistance value corresponding to the value of the current.

PTL 3 describes a memory device that achieves higher integration. The memory device includes: a semiconductor substrate; a cross point memory cell array formed above the semiconductor substrate and having memory cells in a three-dimensional multilayer arrangement, each of the memory cells having a stack structure of a programmable resistance element and an access element, the programmable resistance element being written to a high resistance state or a low resistance state in a nonvolatile manner according to a polarity of an applied voltage, and the access element having a resistance value in an OFF state in a certain voltage range that is at least ten times as high as that in a selected state; and a read/write circuit formed on the semiconductor substrate so as to be situated below the memory cell array, for reading and writing data from and to the memory cell array.

However, PTL 3 does not disclose such a writing method as described in PTL 2 in which, when changing a programmable resistance element from the high resistance state to the low resistance state, a predetermined constant current that enables a resistance change is caused to flow through the programmable resistance element to thereby change the programmable resistance element to a resistance state of a low resistance value corresponding to the value of the current.

PTL 4 discloses, in a three-dimensional multilayer cross point variable resistance memory cell array, a hierarchical bit line structure realized in a small area and a layout method for such a structure. In the hierarchical bit line structure, short-segmented local bit lines are connected to global bit lines via switches for selectively switching the connection, in order to reduce a leakage current to an unselected memory cell and ensure a stable operation.

CITATION LIST

Patent Literature

[PTL 1]
Japanese Unexamined Patent Application Publication No. 2006-203098 (FIGS. 2 and 5)
[PTL 2]
International Patent Application Publication No. 2006/137111 (FIG. 3)
[PTL 3]
Japanese Patent No. 4377817 (FIG. 18)
[PTL 4]
International Patent Application Publication No. 2009/1534

SUMMARY OF INVENTION

Technical Problem

FIG. 1(a) is a diagram showing a three-dimensional structure of a single-layer cross point memory cell array. FIG. 1(a) shows memory cells 51, multiple word lines (for example, second layer wiring) 52 arranged in parallel with each other in one arbitrary direction, and multiple bit lines (for example, first layer wiring) 53 arranged in parallel with each other in one direction so as to be orthogonal to the word lines 52. Each memory cell 51 is placed at a different one of cross points of the word lines 52 and the bit lines 53 so as to be sandwiched between the corresponding word line 52 and bit line 53. FIG. 1(b) is a diagram showing a three-dimensional structure of a multilayer cross point memory cell array. FIG. 1(b) shows a stack structure in multiple layers in which: bit lines 53 (first layer bit lines 53a) are placed in a first wiring layer; word lines 52 (first layer word lines 52a) are placed in a second wiring layer above the first wiring layer so as to be orthogonal to the bit lines 53; bit lines 53 (second layer bit lines 53b) are placed in a third wiring layer above the second wiring layer so as to be orthogonal to the word lines 52; word lines 52 (second layer word lines 52b) are placed in a fourth wiring layer above the third wiring layer so as to be orthogonal to the bit lines 53; and bit lines 53 (third layer bit lines 53c) are placed in a fifth wiring layer above the fourth wiring layer so as to be orthogonal to the word lines 52. Each memory cell 51 is placed at a different one of cross points of the word lines 52 and the bit lines 53 so as to be sandwiched between the corresponding word line 52 and bit line 53.

Thus, a cross point memory achieves a reduction in memory cell area per unit area without relying on a miniaturization process, by vertically stacking simple structures in each of which memory cells are formed at cross points of wires. Hence, a cross point memory is known as a structure suitable for high integration.

The following describes problems newly found when actually configuring a multilayer cross point memory, using a multilayer cross point memory invented earlier by the inventors of the present invention as an example.

[Specific Structure of Cross Point Memory Cell Array]

A specific three-dimensional structure of a multilayer cross point memory is described below.

FIG. 2 is a diagram showing an example (PTL 4) of a multilayer cross point memory invented by the inventors of the present invention, in a cross section as viewed from a word line direction. According to this structure, an increase in chip area can be prevented even when a memory cell array is multiple-divided in relatively small units in order to reduce a leakage current to an unselected memory cell.

FIG. 2 shows memory cells 51, word lines 52 arranged in parallel with a substrate and perpendicular to the plane of paper, and bit lines 53 (local bit lines in a hierarchical bit line structure) arranged in parallel with the substrate so as to be orthogonal to the word lines 52. The word lines 52 and the bit lines 53 are alternately stacked as in FIG. 1(b). In this structure, the bit lines 53 are formed in five layers (first to fifth layer bit lines 53a to 53e), and the word lines 52 are formed in four layers (first to fourth layer word lines 52a to 52d). Each memory cell 51 is placed at a different one of cross points of the word lines 52 and the bit lines 53 in each layer. FIG. 2 also shows an even layer bit line via 54 commonly connecting even layer wires (the second layer bit line 53b and the fourth layer bit line 53d) of the bit lines 53, an odd layer bit line via 55 commonly connecting odd layer wires (the first layer bit line 53a, the third layer bit line 53c, and the fifth layer bit line 53e) of the bit lines 53, a global bit line 56 arranged so as to longitudinally cut through a region below the multilayer cross point memory cell array, an even layer bit line selection switch element 57 that is connected to the global bit line 56 and the even layer bit line via 54 and controls the connection between the global bit line 56 and the even layer bit line via 54 according to an even layer bit line selection signal, and an odd layer bit line selection switch element 58 that is connected to the global bit line 56 and the odd layer bit line via 55 and controls the connection between the global bit line 56 and the odd layer bit line via 55 according to an odd layer bit line selection signal.

The following describes an operation of writing a predetermined memory cell in the multilayer cross point memory of the structure shown in FIG. 2.

In this structure, the operation is different depending on whether the selected memory cell is included in memory cells (first layer memory cells 51a, fourth layer memory cells 51d, fifth layer memory cells 51e, and eighth layer memory cells 51h) belonging to first, fourth, fifth, and eighth layers connected to the odd layer bit line via 55 or included in memory cells (second layer memory cells 51b, third layer memory cells 51c, sixth layer memory cells 51f, and seventh layer memory cells 51g) belonging to second, third, sixth, and seventh layers connected to the even layer bit line via 54.

In FIG. 2, in the case of writing an arbitrarily selected 1-bit memory cell (one of the first layer memory cells 51a, the fourth layer memory cells 51d, the fifth layer memory cells 51e, and the eighth layer memory cells 51h) respectively belonging to memory cell arrays in the first, fourth, fifth, and eighth layers, a predetermined first write voltage (e.g. 0 V) is applied to one word line 52 related to the selected memory cell, and at the same time the odd layer bit line selection signal is applied to the odd layer bit line selection switch element 58, to turn ON the odd layer bit line selection switch element 58 (and turn OFF the even layer bit line selection switch element 57). Moreover, a predetermined second write voltage (e.g. Vp) is applied to the global bit line 56, as a result of which the write voltage Vp is transmitted, through the odd layer bit line selection switch element 58, to the bit lines 53 connected to the odd layer bit line via 55. Thus, the voltage Vp is applied to the selected memory cell, thereby executing the writing. During this time, a predetermined unselection voltage (e.g. Vp/2) is applied to word lines 52 related to other unselected memory cells.

On the other hand, in the case of writing an arbitrarily selected 1-bit memory cell (one of the second layer memory cells 51b, the third layer memory cells 51c, the sixth layer memory cells 51f, and the seventh layer memory cells 51g) respectively belonging to the second, third, sixth, and seventh layers, the predetermined first write voltage (e.g. 0 V) is applied to one word line 52 related to the selected memory cell, and at the same time the even layer bit line selection signal is applied to the even layer bit line selection switch element 57, to turn ON the even layer bit line selection switch element 57 (and turn OFF the odd layer bit line selection switch element 58). Moreover, the predetermined second write voltage (e.g. Vp) is applied to the global bit line 56, as a result of which the write voltage Vp is transmitted, through the even layer bit line selection switch element 57, to the bit lines 53 connected to the even layer bit line via 54. Thus, the voltage Vp is applied to the selected memory cell, thereby executing the writing. During this time, the predetermined unselection voltage (e.g. Vp/2) is applied to word lines 52 related to other unselected memory cells.

Writing a high resistance state and writing a low resistance state (also referred to as high resistance (HR) writing and low resistance (LR) writing, respectively) to a memory cell 51 are bidirectional writing performed by reversing a polarity of a predetermined voltage applied across both ends of the memory cell 51. Accordingly, in the case of performing opposite data writing in the above-mentioned example, the predetermined first write voltage (e.g. 0 V) is applied to the global bit line 56, and the predetermined second write voltage (e.g. Vp) is applied to the word line 52.

Note that "writing a high resistance state (or a low resistance state) to a memory cell" or "writing a memory cell to a high resistance state (or a low resistance state)" means to change the memory cell to the high resistance state (or the low resistance state).

[Memory Cell Structure]

FIG. 3 is a diagram showing a cross section of a memory cell 51 used in the cross point memory.

The memory cell 51 is a 1-bit memory cell including a variable resistance element 10 and a current steering element 29 that are connected in series with each other.

The variable resistance element 10 has the following structure. Oxygen-deficient tantalum oxide ($TaO_x$, $0<x<2.5$) is formed on a lower electrode 14 comprising tantalum nitride (TaN), as a first variable resistance layer 13 (a first region included in a variable resistance layer). An upper interface of the first variable resistance layer 13 is irradiated with oxygen plasma at 300° C. and 200 W for 20 seconds, thereby forming a thin second variable resistance layer 12 (a second region included in the variable resistance layer) comprising $TaO_y$, ($x<y$) lower in oxygen deficiency than $TaO_x$ in the first variable resistance layer 13. An upper electrode 11 comprising platinum (Pt) is formed on the second variable resistance layer 12. The term "oxygen-deficient" means a composition state of a metal oxide that is lower in oxygen content than a metal oxide having a stoichiometric composition typically exhibiting an insulating property, and exhibits a semiconducting electric property. The term "oxygen deficiency" means a proportion of oxygen short of the composition of the metal oxide having the stoichiometric composition. Moreover, while platinum (Pt) is used in the upper electrode 11 which is an electrode in contact with the second variable resistance layer 12, a feature lies in that a material having a higher standard electrode potential than tantalum (Ta) in the first variable resistance layer 13 and tantalum nitride (TaN) in the lower electrode 14 is used in the upper electrode 11.

In this structure, a resistance change occurs at the second variable resistance layer 12 that comprises $TaO_y$ lower in oxygen deficiency and that is in contact with the upper electrode 11 comprising platinum (Pt). When performing voltage application so that the upper electrode 11 is higher in voltage than the lower electrode 14 by a predetermined voltage or more, the variable resistance element 10 changes to the high resistance state. Conversely, when performing voltage application so that the lower electrode 14 is higher in voltage than the upper electrode 11 by a predetermined voltage or more, the variable resistance element 10 changes to the low resistance state.

The current steering element 29 is a diode element having nonlinear current-voltage characteristics in both positive and negative directions of an applied voltage, and is formed by sandwiching a current steering layer 22 comprising nitrogen-deficient silicon nitride between a lower electrode 23 and an upper electrode 21 comprising tantalum nitride (TaN) or the like. The bidirectional nonlinear current-voltage characteristics are such characteristics of the current steering element 29 that is in a high resistance (OFF) state in a predetermined voltage range and in a low resistance (ON) state in voltage ranges higher and lower than the predetermined voltage range. That is, the current steering element 29 is in the high resistance (OFF) state when the applied voltage has an absolute value equal to or less than a predetermined value, and in the low resistance (ON) state when the applied voltage has an absolute value more than the predetermined value.

The memory cell 51 is a memory cell formed by connecting the variable resistance element 10 and the current steering element 29 in series by a via 27. The upper electrode 11 of the variable resistance element 10 is connected to an upper wire 70 (corresponding to a bit line 53 or a word line 52) by a via 26, while the lower electrode 23 of the current steering element 29 is connected to a lower wire 71 (corresponding to a bit line 53 or a word line 52) by a via 28.

Note that, in FIG. 3, the current steering element 29 and the variable resistance element 10 may be vertically reversed with each other.

Moreover, the memory cell 51 may have a structure that does not include the via 27, as shown in FIG. 10 (described in detail later).

FIG. 4 is a circuit diagram showing a connection relationship corresponding to the structure of the variable resistance element 10, i.e. an equivalent circuit diagram corresponding to the memory cell 51. In an equivalent circuit diagram of the variable resistance element 10, an orientation of the second variable resistance layer 12 positioned on the upper electrode 11 side is shown in black color for the sake of clarity.

[Memory Cell Characteristics]

The following describes an operation of the memory cell 51, with reference to FIG. 5. FIG. 5 is a characteristic diagram obtained by actually measuring a current-voltage relationship in the case of applying a voltage that is positive in polarity when the upper wire 70 has a higher voltage than the lower wire 71.

Suppose the memory cell 51 is initially in the high resistance state. When a voltage of a negative polarity where the lower wire 71 is higher in potential than the upper wire 70 is gradually applied from an applied voltage of 0 V, a current begins to flow at about −2.5 V (point C), and the variable resistance element starts to change from the high resistance state to the low resistance state around a time when the voltage exceeds −3.0 V. When the voltage is further applied up to −4.0 V (point A), the change to the low resistance state rapidly progresses according to the applied voltage. Subsequently, the voltage is gradually applied until it reaches 0 V, while the variable resistance element is in the low resistance state.

After this, when a voltage of a positive polarity where the upper wire 70 is higher in potential than the lower wire 71 is applied to the memory cell 51, a current begins to flow at about 1.5 V (point D), and the variable resistance element starts to change from the low resistance state to the high resistance state at about 3.9 V (point B) that is substantially point-symmetrical to the voltage (point A) at which the low resistance state is reached. When the voltage is further applied up to 5.1 V, a current increase takes place. Subsequently, when the applied voltage is decreased, the current is lower than when the applied voltage is increased, indicating that the variable resistance element has changed to the high resistance state.

That is, the actual measurement data shown in FIG. 5 indicates, for the memory cell 51 of the structure shown in FIG. 3, bidirectional resistance change characteristics of changing to the low resistance state when the voltage of the lower wire 71 is equal to or more than a predetermined voltage VLth with respect to the voltage of the upper wire 70 and changing to the high resistance state when the voltage of the upper wire 70 is equal to or more than a predetermined voltage VHth with respect to the voltage of the lower wire 71, where the applied voltage in the low resistance state (point A) and the voltage at which the change to the high resistance state starts (point B) are in a substantially symmetrical current-voltage relationship.

Besides, when changing the variable resistance element 10 in this memory cell 51 from the high resistance state to the low resistance state, the variable resistance element 10 changes to a resistance state of a low resistance value corresponding to a value of a current that is caused to flow through the variable resistance element 10 by applying a predetermined voltage that enables a resistance change, in the same way as disclosed in PTL 2. Furthermore, the applied voltage in the low resistance state (point A) and the voltage at which the change to the high resistance state starts (point B) are substantially symmetrical. This means that high resistance writing requires a current equal to or more than a current for low resistance writing.

In other words, for a stable resistance change operation, low resistance writing needs to be performed by limiting a current to a predetermined current value to thereby attain a predetermined low resistance state, whereas high resistance writing needs to be performed by applying a voltage in an opposite direction to that in low resistance writing and causing a larger current to flow than in low resistance writing.

Note that a voltage section from 0 V to point C in low resistance writing (high resistance state) and a voltage section from 0 V to point D in high resistance writing (low resistance state) are a voltage range in which there is no noticeable current flow even when a voltage is applied to the memory cell 51.

Point C and point D each correspond to a total voltage of a threshold voltage (hereafter denoted as VF) of the current steering element 29 and a resistance change voltage of the variable resistance element 10. An operation of reading or writing the cross point array is desirably performed by applying a voltage equal to or more than this total voltage to a selected cell while controlling an operating point to be between point C and point D for an unselected memory cell, to reduce a leakage current to the unselected memory cell.

[Optimal Cross Point Structure Based on Disclosed Conventional Art and its Problem]

FIG. 7 is a diagram showing an example of a more desirable structure for a stable resistance change based on the conventionally known variable resistance element structure and characteristics and multilayer cross point memory structure.

FIG. 7 is the same as FIG. 2, except that the vertical orientation of each memory cell 51 is shown. FIG. 8 is a cross section diagram of a part designated as cross section A in FIG. 7.

The variable resistance element 10 in each memory cell (the second layer memory cells 51b, the fourth layer memory cells 51d, the sixth layer memory cells 51f, and the eighth layer memory cells 51h) belonging to the even layers, i.e. the second, fourth, sixth, and eighth layers, has a structure that is opposite in a Z direction to the variable resistance element 10 in each memory cell (the first layer memory cells 51a, the third layer memory cells 51c, the fifth layer memory cells 51e, and the seventh layer memory cells 51g) belonging to the odd layers, i.e. the first, third, fifth, and seventh layers. The orientation of the variable resistance element 10 alternates on a layer-by-layer basis in such a manner that the second variable resistance layer 12 lower in oxygen deficiency is located on the upper side in each odd layer memory cell array and located on the lower side in each even layer memory cell array. This structure is optimal for the following reason.

As mentioned above, in the case of changing the variable resistance element 10 from the high resistance state to the low resistance state, the electrode 11 in contact with the second variable resistance layer 12 needs to be negative in voltage with respect to the other electrode 14 by a predetermined voltage or more. Here, the variable resistance element 10 can be set to a resistance value of a predetermined low resistance state by limiting a flow of a current to a predetermined current value. In the case of changing the variable resistance element 10 from the low resistance state to the high resistance state, on the other hand, the variable resistance element 10 needs to be driven with a current equal to or more than the current limit value in low resistance writing, in a direction opposite to that in low resistance writing.

For example, consider an operation of setting a memory cell included in the second layer memory cells 51b and a memory cell included in the third layer memory cells 51c to the low resistance state. The two memory cells share the second layer bit line 53b, and are connected to the global bit line 56 through the even layer bit line via 54 and the even layer bit line selection switch element 57. The predetermined second write pulse voltage Vp is applied to the global bit line 56. Moreover, the predetermined first write pulse voltage (e.g. 0 V) is applied to, in the case of setting the memory cell 51b included in the second layer memory cells 51b to the low resistance state, a predetermined first layer word line 52a connected to the selected memory cell, and in the case of setting the memory cell 51c included in the third layer memory cells 51c to the low resistance state, a predetermined second layer word line 52b connected to the selected memory cell.

The variable resistance element 10 in the second layer and the variable resistance element 10 in the third layer are opposite in structure to each other in the Z direction (up and down symmetry). Accordingly, the writing to the memory cell included in the second layer memory cells 51b and the writing to the memory cell included in the third layer memory cells 51c can both be performed by the same control (polarity) of the global bit line, with there being only a need to change the position of the selected word line.

FIG. 6 is an equivalent circuit diagram of one selected memory cell and the odd or even layer bit line selection switch element in FIG. 7, for the sake of simplicity. An NMOS transistor 578 representing the odd layer bit line selection switch element 58 or the even layer bit line selection switch element 57 is shown in FIG. 6.

Low resistance writing is performed in a direction in which a current flows from the global bit line (GBL) 56 side to the word line (WL) 52 side as designated by arrow Ib. Here, the NMOS transistor 578 has a source on the bit line 53 side. The global bit line 56 is set to such a voltage that makes the source voltage equal to or more than a voltage for low resistance writing of the memory cell 51. This being so, when causing a current to flow in this direction, a substrate bias effect occurs in the NMOS transistor 578, which leads to a reduction in current drive capability of the NMOS transistor 578 as compared with when causing a current to flow in the opposite direction. By setting a gate voltage of the NMOS transistor 578 to a predetermined voltage equal to or more than a sum of the voltage for low resistance writing and a threshold voltage of the NMOS transistor 578, the NMOS transistor 578 operates (source follower operation) as a constant current source determined by the gate voltage even when a high voltage is applied to the global bit line 56.

On the other hand, high resistance writing is performed in a direction in which a current flows from the word line 52 side to the global bit line 56 side as designated by arrow Ia. The substrate bias effect of the NMOS transistor 578 is small in this direction of high resistance writing. Hence, merely by applying a voltage same as and opposite in direction to that in low resistance writing, a larger current than in low resistance writing can be caused to flow, enabling a stable resistance change operation. The above structure allows a low resistance writing operation and a high resistance writing operation to be performed stably.

In terms of cross point memory cell array manufacturing, however, a structure shown in FIG. 9 is more desirable as its manufacturing process is easier. In the structure shown in FIG. 9, the first variable resistance layer 13 and the second variable resistance layer 12 are stacked in the same order in the Z direction, in each variable resistance element 10 of all memory cell array layers.

There is a manufacturing method of the variable resistance element 10 in which the oxygen-deficient first variable resistance layer 13 is formed in an upper layer of the lower electrode 14, and the upper interface of the first variable resistance layer 13 is oxidized to form the second variable resistance layer 12 lower in oxygen deficiency than the first variable resistance layer 13. In the case of applying this formation method to the multilayer cross point memory, odd layer memory cells (the first layer memory cells 51a, the third layer memory cells 51c, the fifth layer memory cells 51e, and the seventh layer memory cells 51g, which are hereafter referred to as odd layer memory cells) in FIG. 7 can be formed by this method. In even layer memory cells (the second layer memory cells 51b, the fourth layer memory cells 51d, the sixth layer memory cells 51f, and the eighth layer memory cells 51h, which are hereafter referred to as even layer memory cells) in FIG. 7, however, the second variable resistance layer 12 cannot be formed first.

As a means of independently forming the second variable resistance layer 12, there is a method of depositing the second variable resistance layer 12 by sputtering. By applying this method to the structure shown in FIG. 8, the odd layer memory cells and the even layer memory cells can be formed with the same structure. In this case, however, there is a possibility that a state of a boundary (interface) between the first variable resistance layer 13 and the second variable resistance layer 12 or a state of a boundary (interface) between the second variable resistance layer 12 and the electrode 11 or between a second variable resistance layer 12a and an electrode 11a slightly differs between the odd layer memory cells and the even layer memory cells, resulting in a difference in resistance change characteristics.

For example, in the odd layer memory cells, the second variable resistance layer 12 which is a high resistance layer is sputtered after depositing the first variable resistance layer 13. This raises a possibility that a natural oxide film, even slightly, adheres to the surface of the first variable resistance layer 13.

Meanwhile, in the even layer memory cells, a first variable resistance layer 13a is formed after depositing the second variable resistance layer 12a which is a high resistance layer, with there being no such adhesion of a natural oxide film and the like.

This incurs a possibility that the odd layer memory cells and the even layer memory cells differ in writing and reading performance, yields, reliability, and so on. Therefore, the structure in which each memory cell 51 has the same orientation in all layers and so can be manufactured in the same manufacturing process condition in all layers as shown in FIG. 9 is desirable.

However, the following problem arises in the case where this structure is employed.

As operations in the case where this desirable structure is employed, for example, consider the case of writing a memory cell (i.e. an even layer memory cell) included in the second layer memory cells 51b to the low resistance state and the case of writing a memory cell (i.e. an odd layer memory cell) included in the third layer memory cells 51c to the low resistance state in the structure shown in FIG. 9.

In the case of writing the memory cell included in the second layer memory cells 51b to the low resistance state, the predetermined first write voltage (e.g. 0 V) needs to be applied to a second layer bit line 71 (53b) shared with the memory cell included in the third layer memory cells 51c. In the case of writing the memory cell included in the third layer memory cells 51c to the low resistance state, the predetermined second write voltage (e.g. Vp>0) needs to be applied to the second layer bit line 71 (53b) shared with the memory cell included in the second layer memory cells 51b. In the equivalent circuit shown in FIG. 6, this means that the writing of the memory cell included in the second layer memory cells 51b to the low resistance state is performed in the direction of arrow Ia whereas the writing of the memory cell included in the third layer memory cells 51c to the low resistance state is performed in the direction of arrow Ib, with a need to limit a current to the same current value in both cases.

In the case where the even layer bit line selection switch element 57 and the odd layer bit line selection switch element 58 are each composed of the NMOS transistor 578, a limited current flows in the direction of arrow Ib due to the source follower operation of the NMOS transistor 578, but a larger current flows in the direction of arrow Ia because the NMOS transistor 578 does not operate as a source follower, as mentioned earlier.

In other words, there is a problem that a stable resistance change operation is possible in the odd layer memory cells but is not possible in the even layer memory cells according to this structure.

In view of the problem stated above, the present invention has an object of providing a multilayer cross point variable resistance nonvolatile memory device that includes memory cells positioned in the same orientation so as to attain stable characteristics in all layers, and that is capable of stably setting a resistance value of a low resistance state for each memory cell by a uniform current limiting method common to all layers.

Solution to Problem

The present invention provides, for a nonvolatile memory device using variable resistance elements, the following multilayer cross point variable resistance nonvolatile memory device. The multilayer cross point variable resistance nonvolatile memory device employs a multilayer cross point structure in which each memory cell includes a variable resistance element and a current steering element connected in series with the variable resistance element, and also a hierarchical bit line structure having local bit lines and global bit lines. The multilayer cross point variable resistance nonvolatile memory device includes a bidirectional current limiting circuit capable of stably setting a resistance value in low resistance writing, in addition to a structure of preventing an increase in layout area caused by bit line selection switch elements for realizing the hierarchical bit line structure.

In detail, the present invention is a cross point variable resistance nonvolatile memory device including: a substrate; a memory cell array formed on the substrate and having a plurality of memory cells each of which includes a variable resistance element and a bidirectional current steering element, the variable resistance element reversibly changing between at least two states including a low resistance state and a high resistance state by application of voltages of different polarities, and the current steering element being connected in series with the variable resistance element and having nonlinear current-voltage characteristics, wherein each of the plurality of memory cells is placed at a different one of cross points of a plurality of bit lines and a plurality of word lines so as to be sandwiched between a corresponding bit line and a corresponding word line, the plurality of bit lines being formed in a plurality of layers and extending in an X direction, and the plurality of word lines being formed in layers between the plurality of bit lines and extending in a Y direction, a memory cell of the plurality of memory cells that is placed at a cross point of a bit line and a word line above the bit line is an odd layer memory cell, a memory cell of the plurality of memory cells that is placed at a cross point of a bit line and a word line below the bit line is an even layer memory cell, a plurality of XZ planes that each correspond to a different one of a plurality of bit line groups and are aligned in the Y direction are a plurality of vertical array planes, each of the plurality of bit line groups being composed of the plurality of bit lines aligned in a Z direction which is a layer stacking direction, the plurality of vertical array planes share the plurality of word lines that perpendicularly pass through each of the plurality of vertical array planes, in each of the plurality of vertical array planes, bit lines in all even layers of the plurality of layers are commonly connected to a first via extending in the Z direction, and bit lines in all odd layers of the plurality of layers are commonly connected to a second via extending in the Z direction, the variable resistance element in each of the plurality of memory cells: includes a first electrode, a variable resistance layer, and a second electrode that are stacked in the Z direction so that the variable resistance layer is sandwiched between the first electrode and the second electrode; is asymmetrical in that the variable resistance element differs in structure between when viewed in a direction from the first electrode to the second electrode and when viewed in a direction from the second electrode to the first electrode; and has characteristics of changing to the high resistance state when a voltage equal to or more than a predetermined voltage is applied to the second electrode with respect to the first electrode and changing to the low resistance state when a voltage equal to or more than a predetermined voltage is applied to the first electrode with respect to the second electrode, and the variable resistance element in the even layer memory cell and the variable resistance element in the odd layer memory cell are positioned in the same orientation in the Z direction; a plurality of global bit lines each of which is provided for a different one of the plurality of vertical array planes; a plurality of first bit line selection switch elements each of which is provided for a different one of the plurality of vertical array planes, and has one end connected to the first via; a plurality of second bit line selection switch elements each of which is provided for a different one of the plurality of vertical array planes, and has one end connected to the second via; a plurality of bidirectional current limiting circuits each of which is provided for a different one of the plurality of vertical array planes, the bidirectional current limiting circuit being positioned between a global bit line corresponding to the vertical array plane and each of an other end of a first bit line selection switch element corresponding to the vertical array plane and an other end of a second bit line selection switch element corresponding to the vertical array plane, and limiting each bidirectional current flowing between the global bit line and each of the first bit line selection switch element and the second bit line selection switch element; a current limiting control circuit that controls the bidirectional current limiting circuit; a global bit line decoder and driver that supplies a signal for selecting a memory cell and writing or reading the memory cell, to any of the plurality of global bit lines; a word line decoder and driver that supplies a signal for selecting the memory cell and writing or reading the memory cell, to any of the plurality of word lines; a write circuit that writes data to the memory cell selected by the global bit line decoder and driver and the word line decoder and driver; a read circuit that reads data from the memory cell selected by the global bit line decoder and driver and the word line decoder and driver; and a control circuit that controls the global bit line decoder and driver, the word line decoder and driver, the write circuit, and the read circuit, wherein the bidirectional current limiting circuit includes an N-type current limiting element and a P-type current limiting element that are connected in parallel with each other, the N-type current limiting element including an NMOS transistor, and the P-type current limiting element including a PMOS transistor, and when changing the selected memory cell to the low resistance state, the current limiting control circuit activates one current limiting element, from among the N-type current limiting element and the P-type current limiting element, that is more capable of limiting an amount of current flowing in the selected memory cell.

According to the present invention, each memory cell is placed at a different one of cross points of a plurality of bit lines that extend in the X direction and are formed in a plurality of layers and a plurality of word lines that extend in the Y direction and are formed in layers between the bit lines. A plurality of vertical array planes that share the word lines are aligned in the Y direction, where the plurality of vertical array planes each correspond to a bit line group of bit lines aligned in the Z direction. Thus, a multilayer cross point structure is realized. In each vertical array plane, even layer bit lines are commonly connected, and odd layer bit lines are commonly connected. A first bit line selection switch element switches electrical connection and disconnection between a global bit line and the commonly-connected even layer bit lines, whilst a second bit line selection switch element switches electrical connection and disconnection between the global bit line and the commonly-connected odd layer bit lines.

Moreover, a bidirectional current limiting circuit capable of limiting to a predetermined amount of current in both current directions is provided between the global bit line and the first and second bit line selection switch elements.

That is, a hierarchical bit line system is realized by the two bit line selection switch elements in each vertical array plane. This contributes to a smaller array size while minimizing an increase in layout area, and a leakage current to an unselected memory cell can be adequately reduced. Furthermore, by connecting the bidirectional current limiting circuit in series with the first and second bit line selection switch elements, the variable resistance elements in the memory cells of all layers can be positioned in the same orientation, and a resistance value in low resistance writing can be stably set in each memory cell. Therefore, stable resistance change characteristics can be attained in all layers.

Advantageous Effects of Invention

The cross point variable resistance nonvolatile memory device of the multilayer memory structure according to the present invention has a component (bidirectional current limiting circuit) that is based on a structure of simply stacking memory cells of the same structure, and so can be manufactured easily. In addition, an operation of writing a memory cell can be performed in such a manner that the memory cell is written to the low resistance state with a current limited to a predetermined amount of current and written to the high resistance state with a larger current than in low resistance writing, regardless of which layer the accessed memory cell belongs to. Hence, a stable writing operation can be achieved in all layers.

BRIEF DESCRIPTION OF DRAWINGS

FIGS. 16(a) and 16(b) is a diagram showing connection relations in a source follower mode and a saturation current limiting mode, respectively.

FIGS. 20(a) to 20(d) is a characteristic diagram of the bidirectional current limiting circuit for describing a bias in low resistance writing of an odd layer memory cell, high resistance writing of an odd layer memory cell, low resistance writing of an even layer memory cell, and high resistance writing of an even layer memory cell in the source follower mode, respectively.

FIG. 21 is a diagram showing a set voltage range of a gate of a current limiting element in the source follower mode.

FIGS. 24(a) to 24(d) is a characteristic diagram of the bidirectional current limiting circuit for describing a bias in low resistance writing of an odd layer memory cell, high resistance writing of an odd layer memory cell, low resistance writing of an even layer memory cell, and high resistance writing of an even layer memory cell in the saturation current limiting mode, respectively.

DESCRIPTION OF EMBODIMENTS

The following describes embodiments of the present invention in detail, with reference to drawings.

The present invention is based on a premise that a relation between an application direction of a pulse voltage applied to a variable resistance element and a resistance change polarity, i.e. a relation between an application direction of a pulse voltage applied to a variable resistance element and whether the variable resistance element changes to a high resistance state or a low resistance state, is clear. This can be realized by an electrode material of a variable resistance element or a structure of a variable resistance layer.

International Patent Application Publication No. 2009/141857 (PTL 5) discloses that, in a 1T1R variable resistance memory in which a variable resistance element formed by sandwiching a transition metal oxide between electrodes comprising materials of different standard electrode potentials is connected to a transistor, a predetermined low resistance state can be set by applying a predetermined voltage to the electrode of the lower standard electrode potential with respect to the electrode of the higher standard electrode potential while limiting a current, whereas a high resistance state can be set by applying a predetermined voltage to the electrode of the higher standard electrode potential with respect to the electrode of the lower standard electrode potential.

An earlier patent application (International Patent Application Publication No. 2010/021134 (PTL 6)) by the inventors of the present invention discloses that, in a 1T1R variable resistance memory in which a variable resistance element formed by stacking a transition metal oxide and another transition metal oxide lower in oxygen deficiency than the former transition metal oxide and sandwiching this stack structure between electrodes is connected to a transistor, a predetermined low resistance state can be set by applying a predetermined voltage to the electrode in contact with the transition metal oxide of the higher oxygen deficiency with respect to the electrode in contact with the transition metal oxide of the lower oxygen deficiency while limiting a current, whereas a high resistance state can be set by applying a predetermined voltage to the electrode in contact with the transition metal oxide of the lower oxygen deficiency with respect to the electrode in contact with the transition metal oxide of the higher oxygen deficiency.

Thus, the resistance change polarity can be controlled by a difference in standard electrode potential of electrodes, a difference in oxygen deficiency of variable resistance layers, or a combination thereof. These basic data are described in detail in PTL 5 and PTL 6, and so their detailed description is omitted here.

Embodiment 1

[Description of Circuit Structure According to Present Invention]

Figure 10:
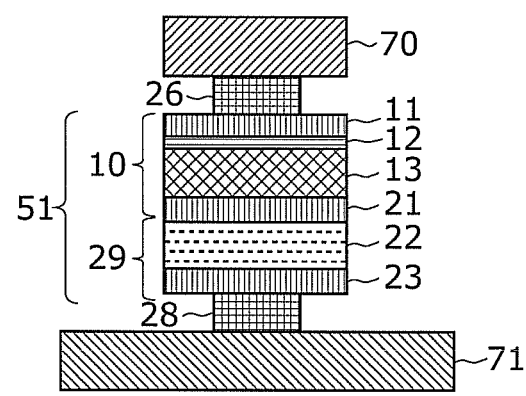
FIG. 10 is a cross section diagram of a memory cell.

FIG. 10 is a diagram showing a cross section structure of a memory cell 51 included in a cross point variable resistance nonvolatile memory device having a multilayer memory cell array in an embodiment of the present invention.

The memory cell 51 has a structure in which a first electrode 23 comprising tantalum nitride (TaN), a current steering layer 22 comprising nitrogen-deficient silicon nitride, a second electrode 21 comprising TaN, a first variable resistance layer 13 comprising oxygen-deficient tantalum oxide ($TaO_x$), a second variable resistance layer 12 formed by oxidation of the first variable resistance layer 13 in an oxygen plasma atmosphere and comprising $TaO_y$ (x<y) lower in oxygen deficiency than $TaO_x$, and a third electrode 11 comprising platinum (Pt) are stacked in this order. A lower wire 71 comprising aluminum (Al) is disposed below the memory cell 51, and connected to the first electrode 23 of the memory cell 51 by a first via 28. An upper wire 70 comprising aluminum (Al) is disposed above the memory cell 51, and connected to the third electrode 11 of the memory cell 51 by a third via 26. The lower wire 71 and the upper wire 70 are arranged so as to be orthogonal to each other.

In this structure, the first electrode 23, the current steering layer 22, and the second electrode 21 constitute a current steering element 29, and the second electrode 21, the first variable resistance layer 13, the second variable resistance layer 12, and the third electrode 11 constitute a variable resistance element 10. That is, the memory cell 51 includes the variable resistance element 10 that reversibly changes between at least two states including a low resistance state and a high resistance state by application of voltages of different polarities, and the current steering element 29 that is connected in series with the variable resistance element 10.

The second electrode 21 serves both as an electrode of the current steering element 29 and an electrode of the variable resistance element 10. As described in the background art section, in this memory cell structure, a resistance change occurs at the second variable resistance layer 12 that is in contact with the third electrode 11 comprising a material (platinum (Pt) in this example) having a higher standard electrode potential than tantalum which is the material of the first variable resistance layer 13 or TaN which is the material of the second electrode 21 serving as a lower electrode of the variable resistance element 10, and that comprises $TaO_y$ lower in oxygen deficiency than the first variable resistance layer 13. When applying a voltage equal to or more than a predetermined voltage to the upper wire 70 with respect to the lower wire 71, the variable resistance element 10 changes to the high resistance state. When applying a voltage equal to or more than a predetermined voltage to the lower wire 71 with respect to the upper wire 70, the variable resistance element 10 changes to the low resistance state. That is, the variable resistance element 10: includes the second electrode, the first variable resistance layer 13, the second variable resistance layer 12, and the third electrode that are stacked in the Z direction (stacking direction described later) so that the first variable resistance layer 13 and the second variable resistance layer 12 are sandwiched between the second electrode and the third electrode; is asymmetrical in that the variable resistance element 10 differs in structure between when viewed in a direction from the second electrode to the third electrode and when viewed in a direction from the third electrode to the second electrode; and has characteristics of changing to the high resistance state when a voltage equal to or more than a predetermined voltage is applied to the third electrode with respect to the second electrode and changing to the low resistance state when a voltage equal to or more than a predetermined voltage is applied to the second electrode with respect to the third electrode.

Note that, in this embodiment, the lower wire 71 corresponds to one of a bit line and a word line, and the upper wire 70 orthogonal to the lower wire 71 corresponds to the other one of the bit line and the word line.

Figure 1:
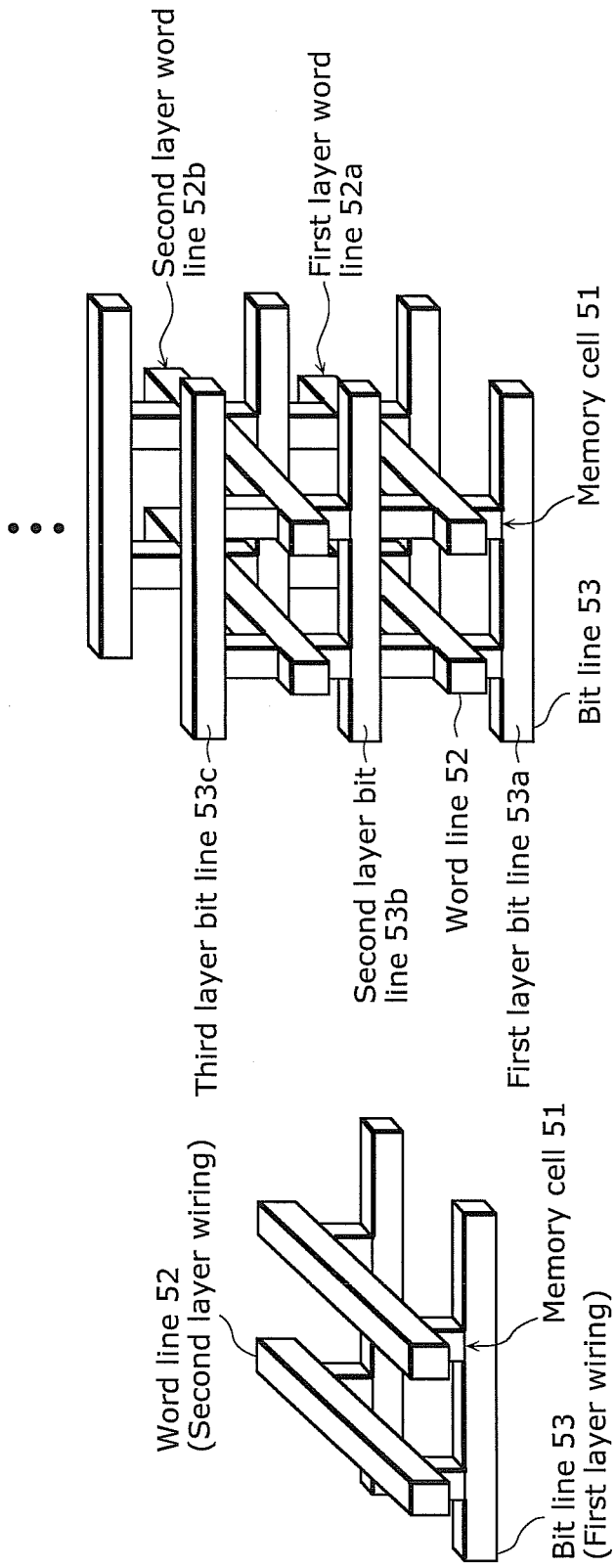
FIGS. 1(a) and 1(b) is a diagram showing three-dimensional structures of single-layer cross point memory cells and multilayer cross point memory cells, respectively.
Figure 2:
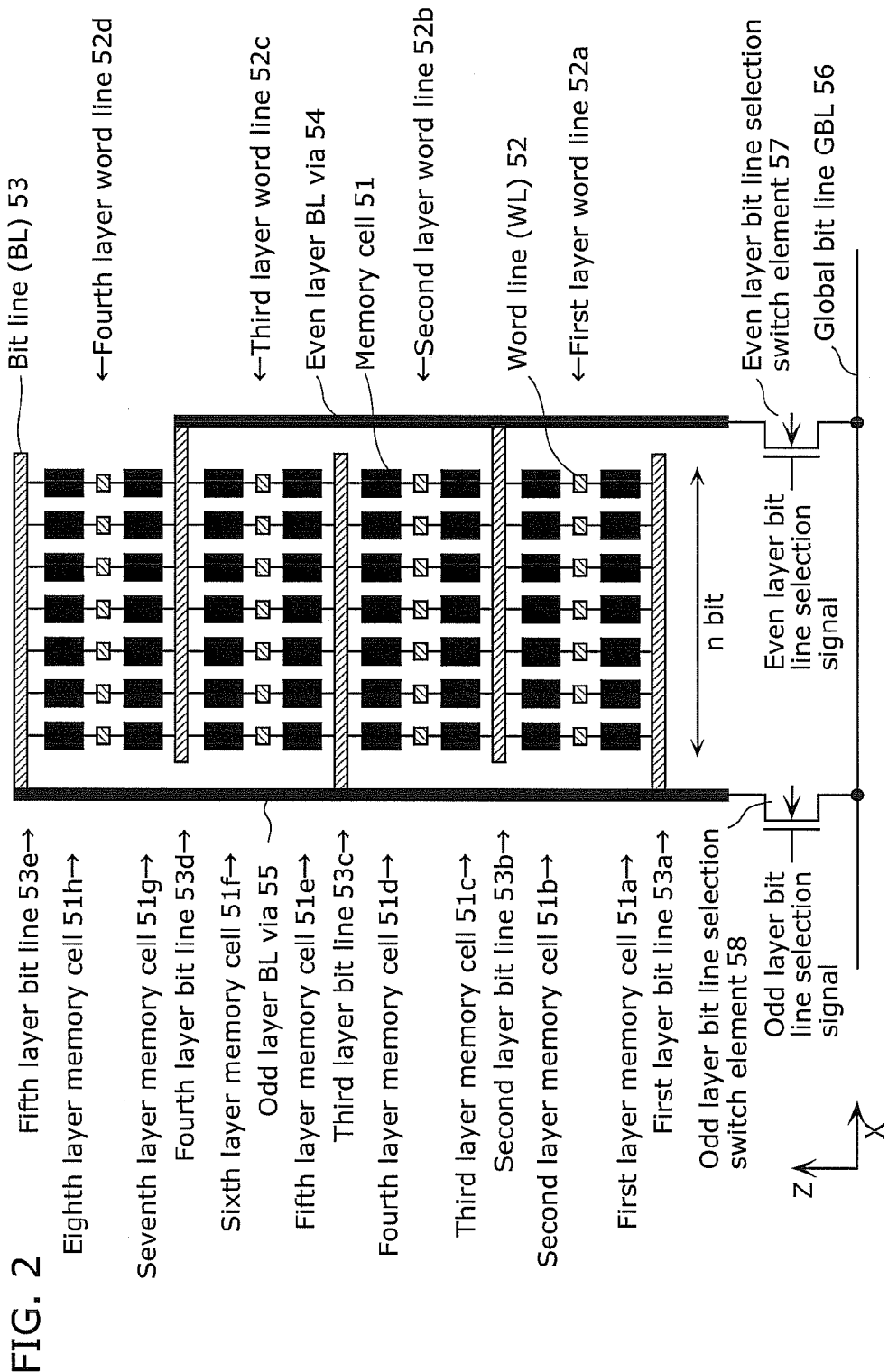
FIG. 2 is a cross section diagram of a conventional multilayer cross point memory.
Figure 3:
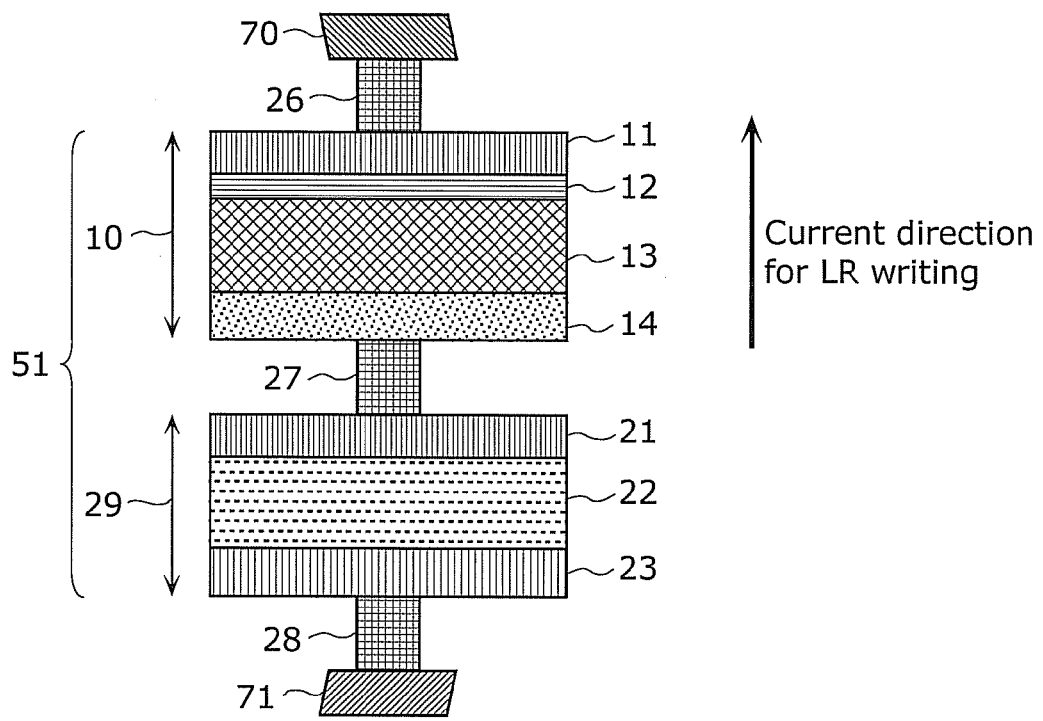
FIG. 3 is a cross section diagram of a memory cell.
Figure 4:
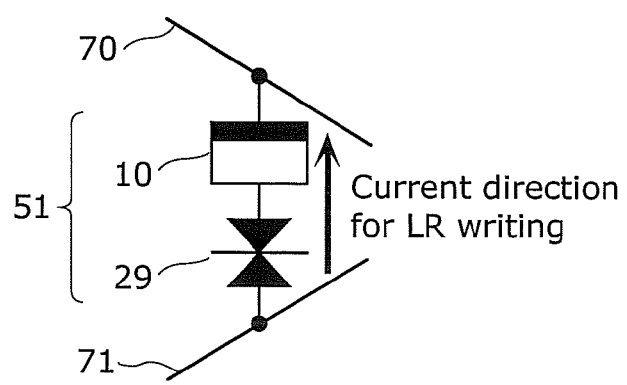
FIG. 4 is an equivalent circuit diagram of a memory cell.
Figure 5:
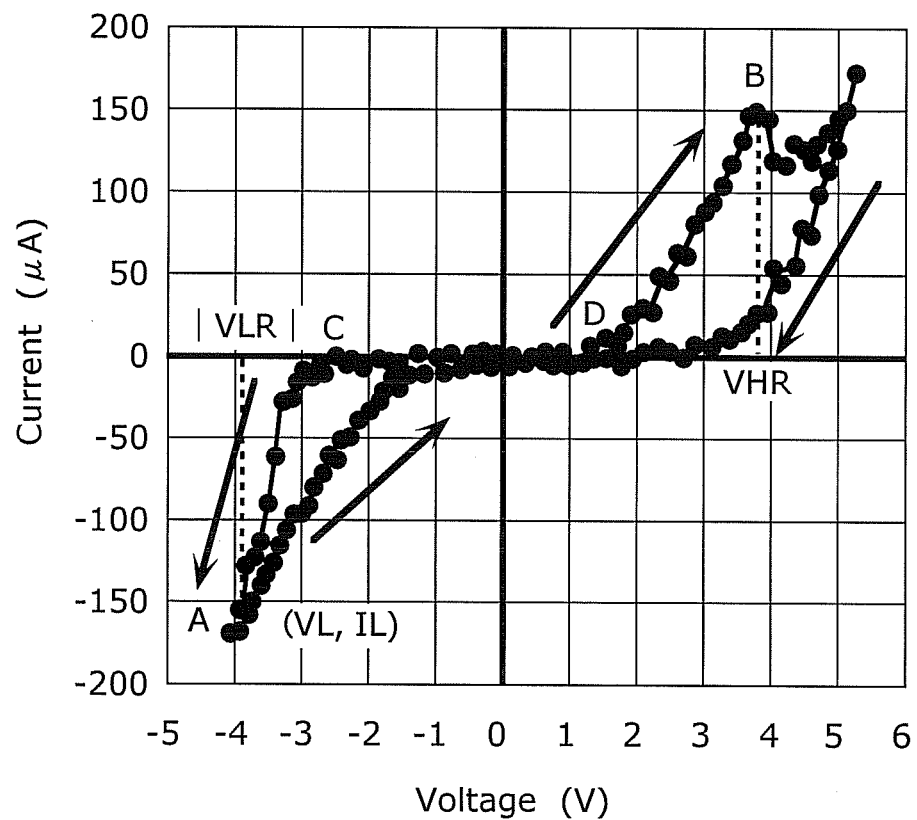
FIG. 5 is a V-I characteristic graph of a memory cell.
Figure 6:
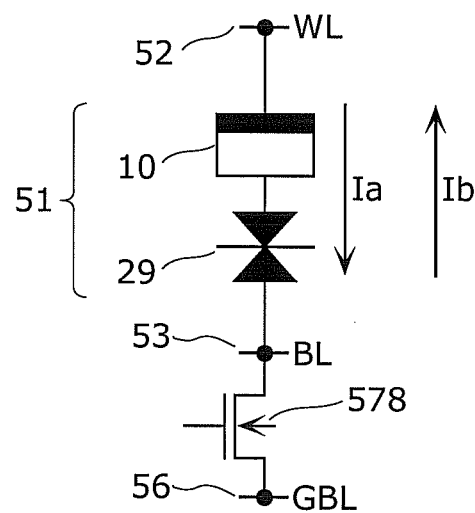
FIG. 6 is an equivalent circuit diagram for describing a current limiting method in low resistance writing.
Figure 7:
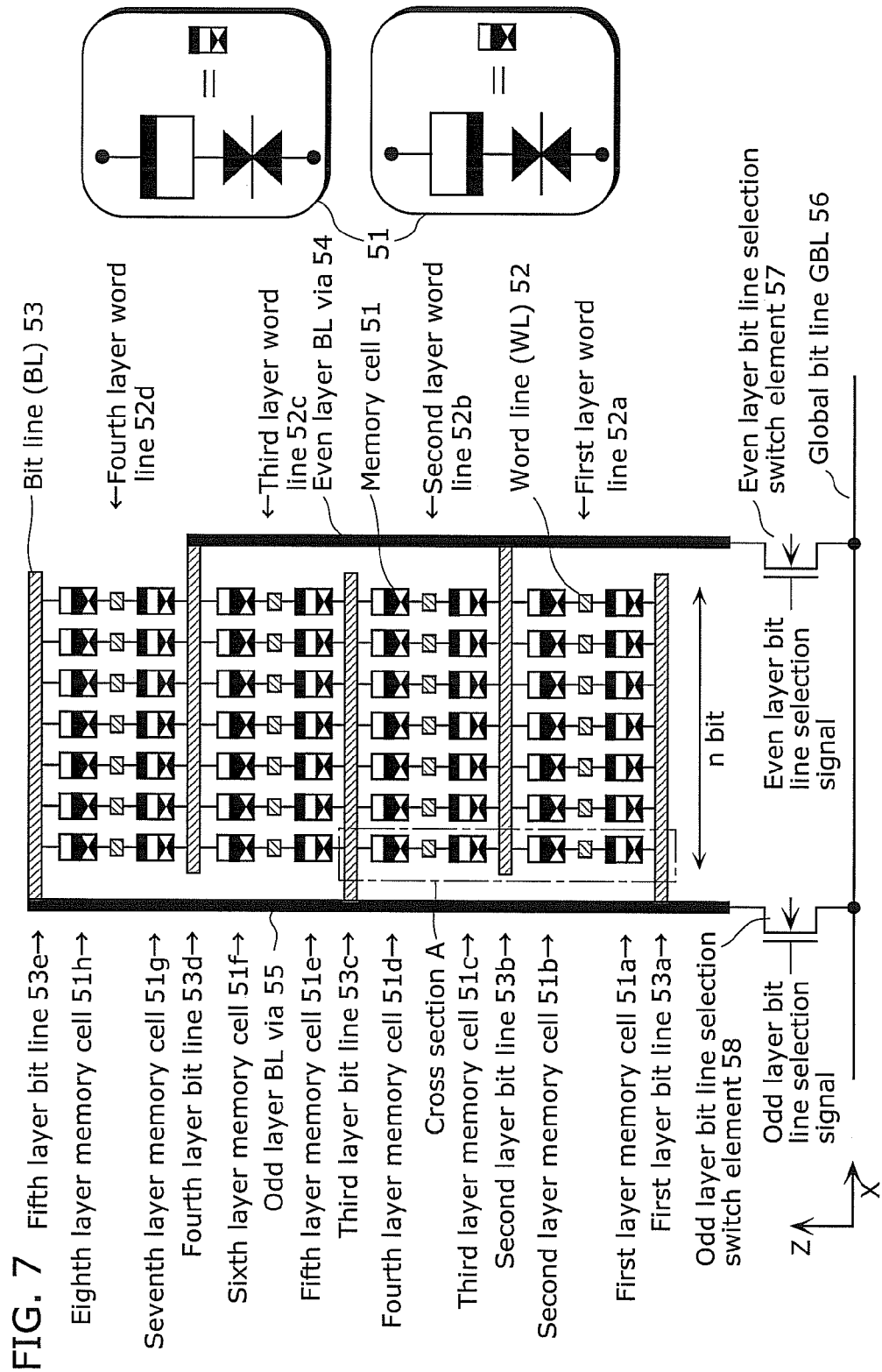
FIG. 7 is a cross section diagram of a multilayer cross point memory cell array.
Figure 8:
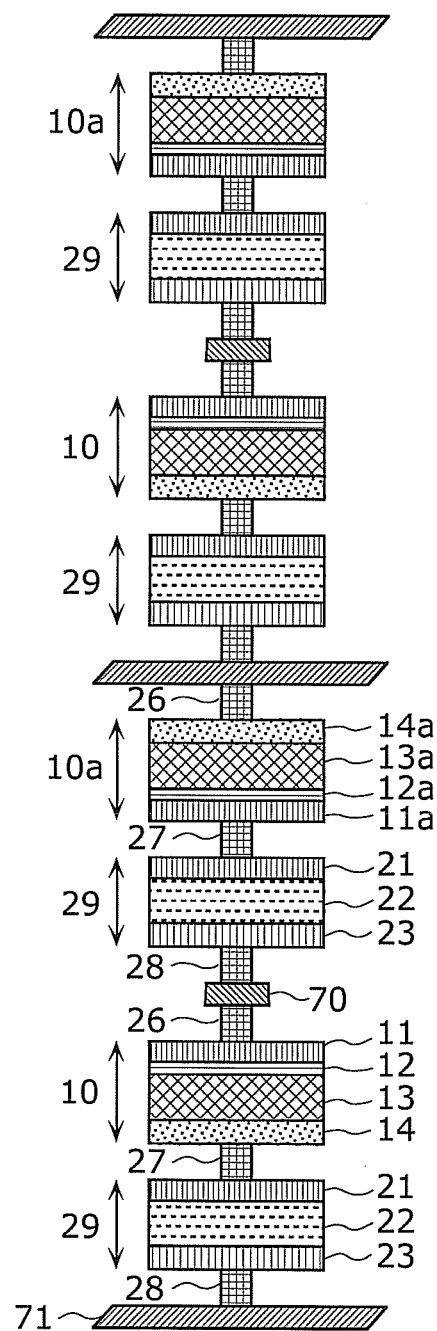
FIG. 8 is a cross section diagram where cross point memory cells positioned in different orientations are stacked.
Figure 9:
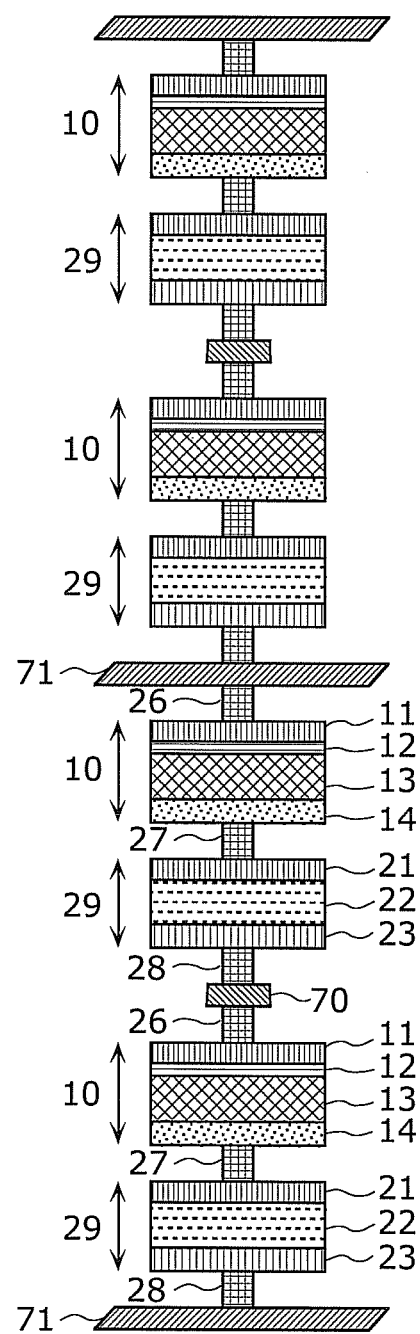
FIG. 9 is a cross section diagram where cross point memory cells positioned in the same orientation are stacked.

A memory cell array formed by stacking a plurality of memory cells 51 shown in FIG. 10 has a structure in which the memory cells 51 are positioned in the same orientation in all layers, as shown in FIG. 9.

In FIG. 9, each variable resistance element 10 in all memory cell array layers has the first variable resistance layer 13 and the second variable resistance layer 12 stacked in this order in the Z direction.

Figure 11:
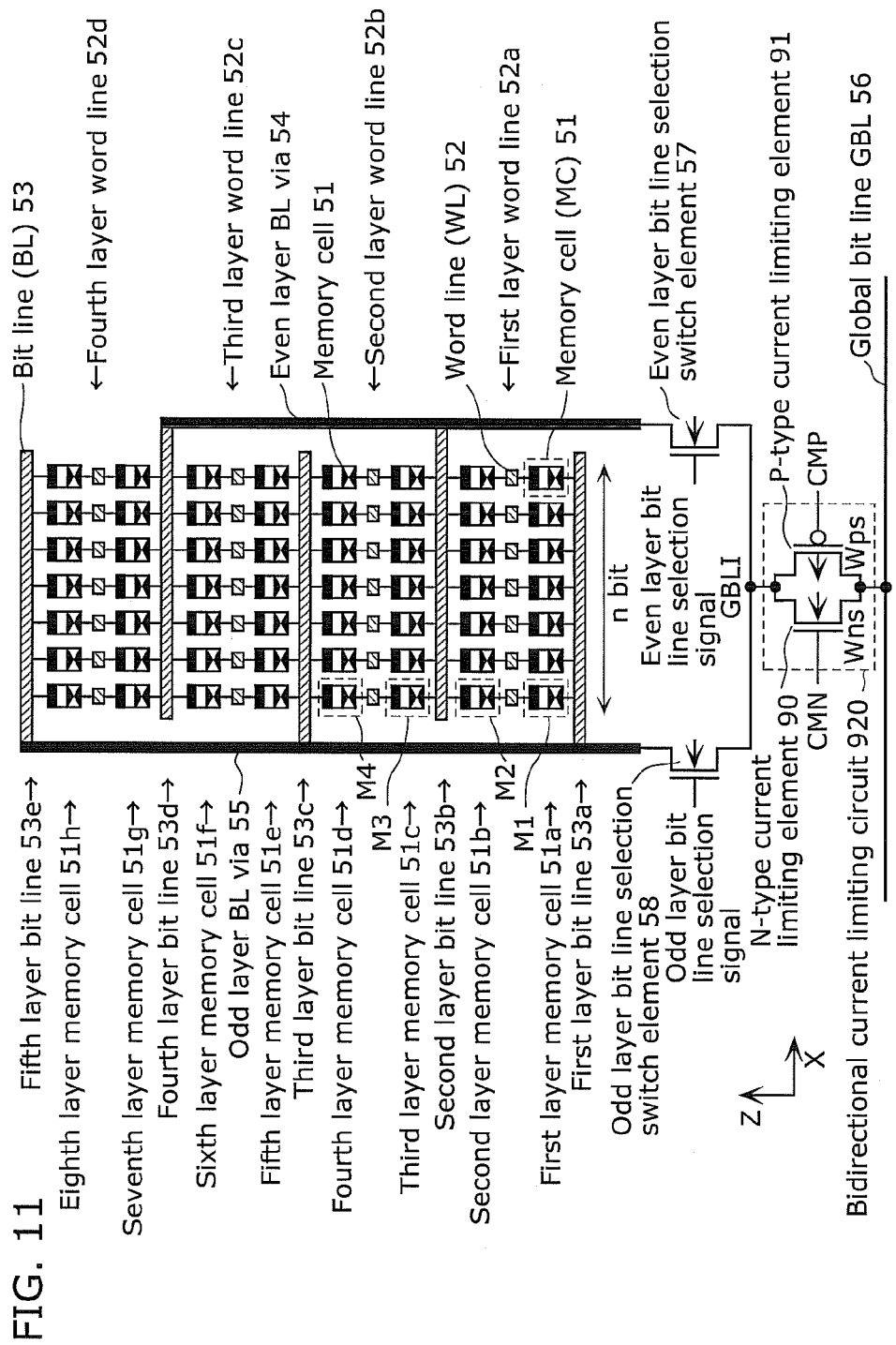
FIG. 11 is a cross section diagram of a multilayer cross point memory in an embodiment of the present invention.

FIG. 11 is a diagram showing a part (one vertical array plane) of the cross point variable resistance nonvolatile memory device in this embodiment. A cross section structure of a multilayer cross point memory cell array in which memory cells are stacked in the same pattern as in FIG. 9 as viewed from a word line direction, and a circuit structure provided below the multilayer cross point memory cell array are shown in FIG. 11.

Each memory cell 51 is placed at a cross point of a first layer bit line 53a comprising a wiring material such as aluminum and extending in a direction (the X direction) horizontal to the plane of paper and a first layer word line 52a comprising a wiring material such as aluminum and extending in a direction (the Y direction not shown) perpendicular to the plane of paper. Memory cells 51 corresponding to n bits are arranged above the first layer bit line 53a along the X direction, constituting first layer memory cells 51a.

In a layer above (the Z direction) the first layer memory cells 51a, each memory cell 51 is placed at a cross point of the first layer word line 52a and a second layer bit line 53b comprising a wiring material such as aluminum and extending in the X direction horizontal to the plane of paper, where the first layer word line 52a is situated below the memory cell 51 this time. Memory cells 51 corresponding to n bits are arranged below the second layer bit line 53b along the X direction, constituting second layer memory cells 51b. Note that the Z direction is a layer stacking direction.

Likewise, in a manner that shares a word line or a bit line, each third layer memory cell 51c is placed at a cross point of the second layer bit line 53b and a second layer word line 52b, each fourth layer memory cell 51d is placed at a cross point of the second layer word line 52b and a third layer bit line 53c, each fifth layer memory cell 51e is placed at a cross point of the third layer bit line 53c and a third layer word line 52c, each sixth layer memory cell 51f is placed at a cross point of the third layer word line 52c and a fourth layer bit line 53d, each seventh layer memory cell 51g is placed at a cross point of the fourth layer bit line 53d and a fourth layer word line 52d, and each eighth layer memory cell 51h is placed at a cross point of the fourth layer word line 52d and a fifth layer bit line 53e. A three-dimensional memory cell array in which memory cells 51 are stacked in eight layers is formed in this way.

Thus, each memory cell 51 is placed at a different one of the cross points of the plurality of bit lines 53a to 53e extending in the X direction and formed in a plurality of layers and the plurality of word lines 52a to 53d extending in the Y direction and formed in layers between the bit lines, so as to be sandwiched between the corresponding bit line and word line. Here, a memory cell placed at a cross point of a bit line and a word line above the bit line is referred to as an odd layer (first, third, fifth, and seventh layers) memory cell, and a memory cell placed at a cross point of a bit line and a word line below the bit line is referred to as an even layer (second, fourth, sixth, and eighth layers) memory cell.

The first layer bit line 53a, the third layer bit line 53c, and the fifth layer bit line 53e are commonly connected by an odd layer bit line via 55 which is an example of a second via, while the second layer bit line 53b and the fourth layer bit line 53d are commonly connected by an even layer bit line via 54 which is an example of a first via. Since memory cell groups of adjacent layers in the Z direction share a bit line or a word line in this way, a multilayer cross point memory can be produced with a minimum number of wiring layers, which contributes to a lower cost.

The present invention has a feature that, in all layers from the first layer memory cells 51a to the eighth layer memory cells 51h, the variable resistance element 10 in each memory cell 51 can be formed in the same manufacturing condition and structure in the Z direction (e.g. in all layers the variable resistance element 10 can be formed by stacking the second electrode 21, the first variable resistance layer 13, the second variable resistance layer 12, and the third electrode 11 in this order from bottom to top). Hence, each memory cell of the same structure can be manufactured regardless of whether the memory cell belongs to an odd layer or an even layer. In other words, the variable resistance element 10 in each even layer memory cell and the variable resistance element 10 in each odd layer memory cell are positioned in the same orientation in the Z direction.

The even layer bit line via 54 is connected to one of a drain and a source of an even layer bit line selection switch element 57 including an NMOS transistor, which is an example of a first bit line selection switch element. The odd layer bit line via 55 is connected to one of a drain and a source of an odd layer bit line selection switch element 58 including an NMOS transistor, which is an example of a second bit line selection switch element. The other one of the drain and the source of the even layer bit line selection switch element 57 and the other one of the drain and the source of the odd layer bit line selection switch element 58 are commonly connected to a common contact (GBLI). A gate of the even layer bit line selection switch element 57 is connected to an even layer bit line selection signal line, while a gate of the odd layer bit line selection switch element 58 is connected to an odd layer bit line selection signal line.

The common contact GBLI is connected to one of a drain and a source of an N-type current limiting element 90 including an NMOS transistor, and also connected to one of a drain and a source of a P-type current limiting element 91 including a PMOS transistor. The other one of the drain and the source of the N-type current limiting element 90 is connected to a global bit line (GBL), and the other one of the drain and the source of the P-type current limiting element 91 is equally connected to the global bit line (GBL). That is, the N-type current limiting element 90 and the P-type current limiting element 91 are connected in parallel with each other, and constitute a bidirectional current limiting circuit 920 that limits each bidirectional current flowing between the global bit line (GBL) and each of the even layer bit line selection switch element 57 and the odd layer bit line selection switch element 58.

A gate of the N-type current limiting element 90 is connected to a signal line that is connected to a node CMN, and a gate of the P-type current limiting element 91 is connected to a signal line that is connected to a node CMP. The P-type current limiting element 91 is designed to have a transistor channel width Wps, and the N-type current limiting element 90 is designed to have a transistor channel width Wns. The N-type current limiting element 90 and the P-type current limiting element 91 constitute a bidirectional current limiting element. Voltage values of signals applied from the nodes CMP and CMN to the respective gates and their control method and how the channel widths Wps and Wns are designed will be described in detail later.

Note that a group having a structure obtained by slicing in the direction in which the bit lines 53 are aligned, as shown in FIG. 11, is referred to as a vertical array plane. In detail, a plurality of XZ planes that each correspond to a different one of a plurality of bit line groups each of which has bit lines aligned in the Z direction which is a layer stacking direction, that share word lines perpendicularly passing through the plurality of XZ planes, and that are aligned in the Y direction are each referred to as a vertical array plane.

Figure 12:
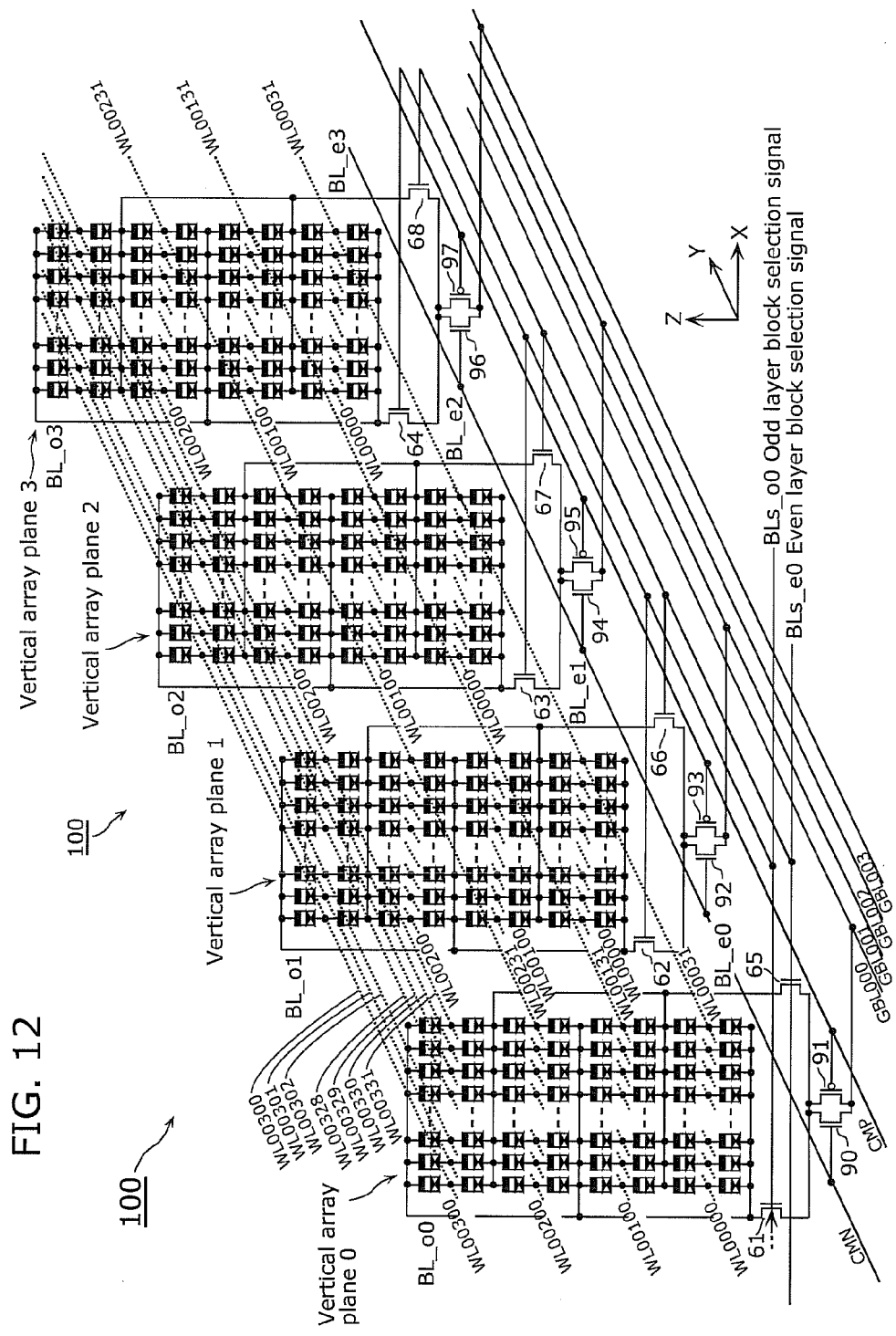
FIG. 12 is a circuit diagram showing a structure of a memory cell array in the embodiment of the present invention.

FIG. 12 is a diagram showing a structure in which four vertical array planes are arranged face to face.

In FIG. 12, the X direction is a direction in which bit lines extend, the Y direction is a direction in which word lines extend, and the Z direction is a direction in which the bit lines or the word lines are stacked in layers.

In FIG. 12, bit lines (BL) 53 extend in the X direction and are formed in a plurality of layers (five layers in FIG. 12), and word lines (WL) 52 extend in the Y direction and are formed in layers (four layers in FIG. 12) between the bit lines. In a memory cell array 100, each memory cell (MC) 51 is placed at a different one of cross points of the bit lines 53 and the word lines 52 so as to be sandwiched between the corresponding bit line 53 and word line 52. Note that a part of the memory cells 51 and a part of the word lines 52 are not shown for the sake of simplicity.

Each of vertical array planes 0 to 3 that correspond to a different one of bit line groups each composed of bit lines BL arranged in layers in the Z direction includes memory cells 51 placed between the bit lines BL and the word lines WL. The vertical array planes 0 to 3 share the word lines WL. In the example shown in FIG. 12, the number of memory cells 51 in the X direction is 32 (n=32 in FIG. 11) and the number of memory cells 51 in the Z direction is 8, in each of the vertical array planes 0 to 3. The memory cell array 100 is composed of the four vertical array planes 0 to 3 aligned in the Y direction.

Note that the number of memory cells in each vertical array plane and the number of vertical array planes in the Y direction are not limited to such.

In each of the vertical array planes 0 to 3, the even layer bit lines BL are commonly connected by the even layer bit line via 54 in FIG. 11 (BL_e0 to BL_e3), and the odd layer bit lines BL are commonly connected by the odd layer bit line via 55 in FIG. 11 (BL_o0 to BL_o3).

Moreover, global bit lines GBL000 to GBL003 respectively corresponding to the vertical array planes 0 to 3 extend in the Y direction. Further, odd layer bit line selection switch elements 61 to 64 and even layer bit line selection switch elements 65 to 68 are respectively provided for the vertical array planes 0 to 3. In FIG. 12, the odd layer bit line selection switch elements 61 to 64 and the even layer bit line selection switch elements 65 to 68 each include an NMOS transistor. In addition, the odd layer bit line selection switch elements 61 to 64 and the even layer bit line selection switch elements 65 to 68 related to N-type current limiting elements 90, 92, 94, and 96 each including an NMOS transistor and P-type current limiting elements 91, 93, 95, and 97 each including a PMOS transistor are respectively connected to the global bit lines GBL000 to GBL003 related to the N-type current limiting elements 90, 92, 94, and 96 and the P-type current limiting elements 91, 93, 95, and 97, each at a diffusion layer terminal of the other one of the drain and the source of the corresponding pair of the odd layer bit line selection switch elements 61 to 64 and the even layer bit line selection switch elements 65 to 68. Gate terminals of the N-type current limiting elements 90, 92, 94, and 96 are commonly connected to the node CMN for a control voltage, and gate terminals of the P-type current limiting elements 91, 93, 95, and 97 are commonly connected to the node CMP for a control voltage. The voltage of the node CMN and the voltage of the node CMP can be arbitrarily set according to the amount of current to which a current flow is to be limited.

The odd layer bit line selection switch elements 61 to 64 respectively switch, according to an odd layer bit line selection signal BLs_o0, electrical connection and disconnection between the global bit lines GBL000 to GBL003 for the vertical array planes 0 to 3 and the odd layer bit lines BL_o0 to BL_o3 commonly connected in each of the vertical array planes 0 to 3, through the N-type current limiting elements 90, 92, 94, and 96 and the P-type current limiting elements 91, 93, 95, and 97. Meanwhile, the even layer bit line selection switch elements 65 to 68 respectively switch, according to an even layer bit line selection signal BLs_e0, electrical connection and disconnection between the global bit lines GBL000 to GBL003 for the vertical array planes 0 to 3 and the even layer bit lines BL_e0 to BL_e3 commonly connected in each of the vertical array planes 0 to 3, through the N-type current limiting elements 90, 92, 94, and 96 and the P-type current limiting elements 91, 93, 95, and 97.

According to this structure, each of the vertical array planes 0 to 3 can be formed by placing the memory cells 51 so that their variable resistance elements 10 have the same structure in the Z direction in all memory cell layers. Moreover, in FIG. 11, the even layer bit lines 53b and 53d are commonly connected and the odd layer bit lines 53a, 53c, and 53e are commonly connected by separate vias (the even layer BL via 54 and the odd layer BL via 55), and these vias are connected to the global bit line GBL through the respective even layer switch 57 and odd layer switch 58 and the bidirectional current limiting circuit 920. A multilayer cross point structure according to a hierarchical bit line system is realized in this way.

Figure 13:
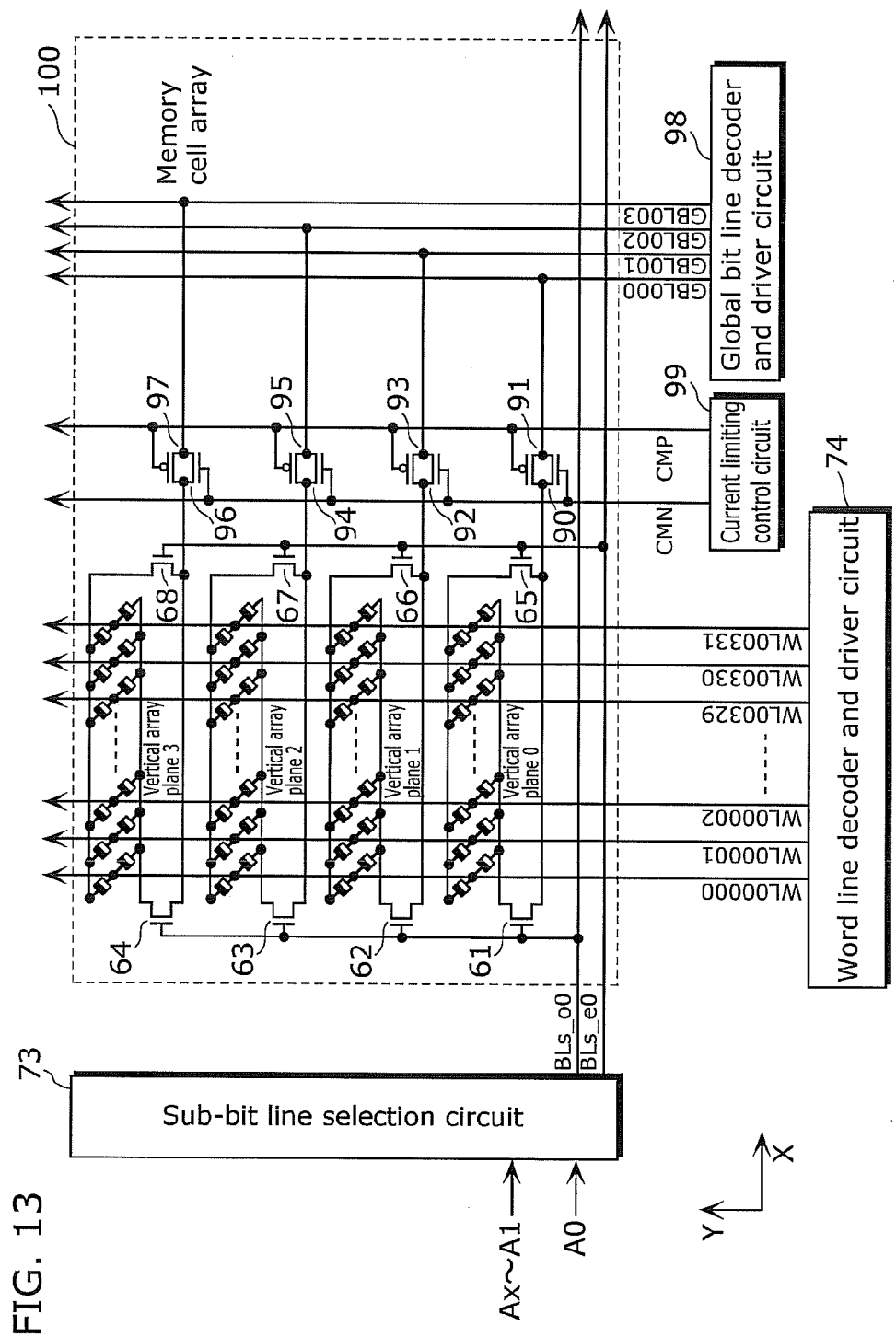
FIG. 13 is a circuit diagram showing the memory cell array shown in FIG. 12 and its peripheral circuitry.

FIG. 13 is a circuit diagram showing the memory cell array 100 in FIG. 12 and its peripheral circuitry.

In FIG. 13, a global bit line decoder and driver circuit 98 is a circuit that supplies a signal for selecting a memory cell 51 to each of the global bit lines GBL000 to GBL003, and selectively drives and controls the global bit lines GBL000 to GBL003.

A current limiting control circuit 99 is a circuit that controls the bidirectional current limiting circuit 920 and, when setting a selected memory cell to the low resistance state, activates a current limiting element that is more capable of limiting the amount of current flowing through the selected memory cell from among the N-type current limiting elements 90, 92, 94, and 96 and the P-type current limiting elements 91, 93, 95, and 97. That is, the current limiting control circuit 99 is a control circuit that turns ON one of a current limiting element pair of the N-type current limiting elements 90, 92, 94, and 96 and the P-type current limiting elements 91, 93, 95, and 97 which are respectively paired with each other, and turns OFF the other one of the current limiting element pair. The current limiting control circuit 99 controls output voltages VCMN and VCMP to the nodes CMN and CMP, according to an operation mode (e.g. a high resistance writing mode, a low resistance writing mode, or a reading mode) and a selected memory cell layer (an even layer or an odd layer). In detail, in the case of changing the selected memory cell from the high resistance state to the low resistance state, the current limiting control circuit 99 generates the voltage VCMN or VCMP for limiting the amount of current for a write pulse. In the case of changing the selected memory cell from the low resistance state to the high resistance state, the current limiting control circuit 99 generates a sufficiently high voltage VCMN or VCMP so as not to limit the amount of current for a write pulse. In the case of the reading mode, too, the current limiting control circuit 99 generates a sufficiently high voltage VCMN or VCMP so as not to limit the amount of current for a read pulse. Various voltage settings for the selected memory cell will be described in detail later.

A sub-bit line selection circuit 73 is a circuit that controls the odd layer bit line selection switch elements 61 to 64 and the even layer bit line selection switch elements 65 to 68, and outputs the even layer bit line selection signal BLs_e0 and the odd layer bit line selection signal BLs_o0 according to address signals A0 to Ax.

A word line decoder and driver circuit 74 is a circuit that supplies a signal for selecting a memory cell 51 to each of word lines WL00000 to WL00331, and selectively drives and controls the word lines WL00000 to WL00331.

Figure 14:
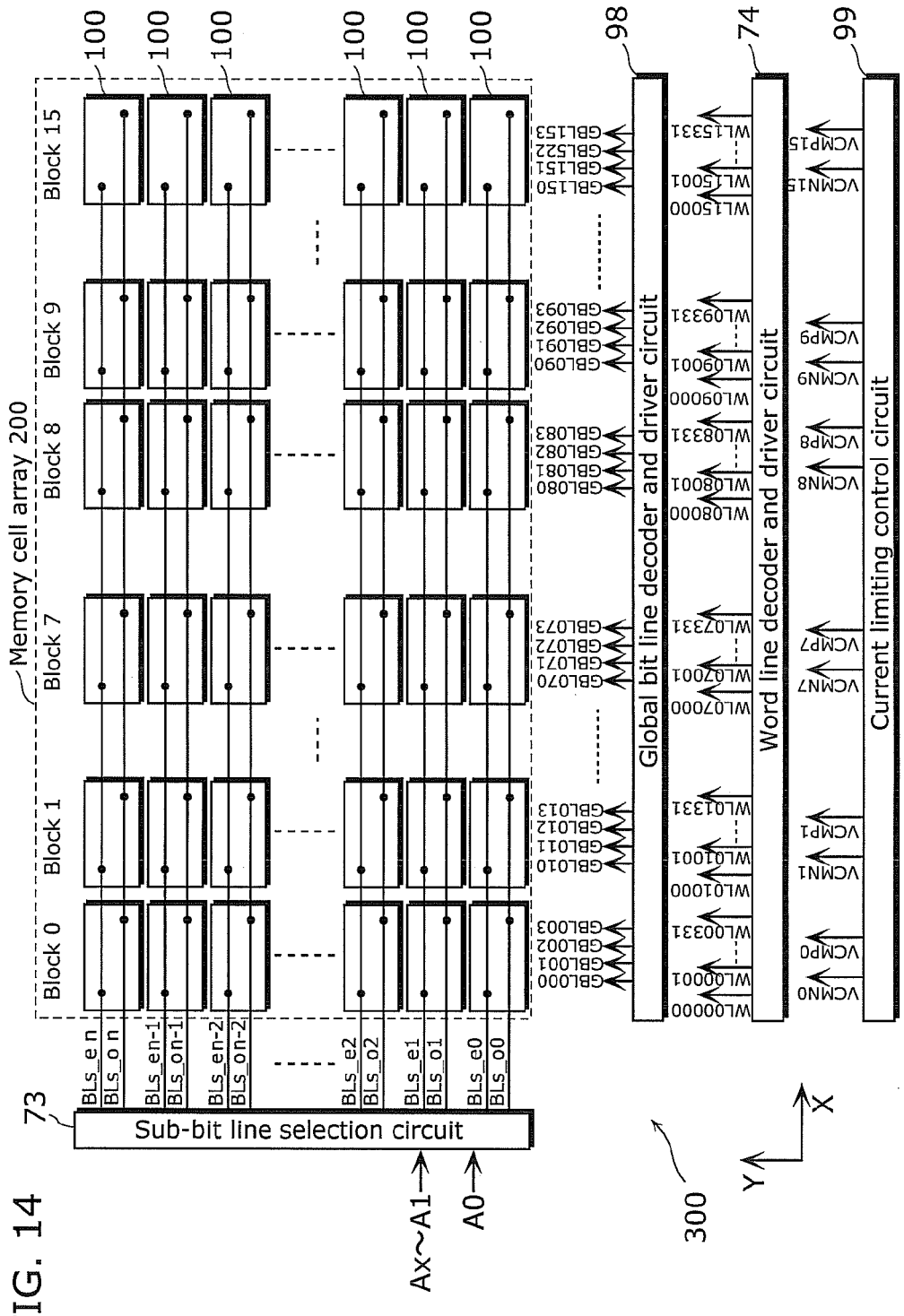
FIG. 14 is a circuit diagram showing a main part of a cross point variable resistance nonvolatile memory device that uses a plurality of memory cell arrays shown in FIG. 12.

FIG. 14 is a circuit diagram showing a main part of the cross point variable resistance nonvolatile memory device in this embodiment.

As shown in FIG. 14, in an actual cross point variable resistance nonvolatile memory device, a memory cell array 200 is formed by providing a plurality of memory cell arrays 100 (each corresponding to the vertical array planes) shown in FIG. 12. (n+1)×16 memory cell arrays 100 are arranged in the example shown in FIG. 14.

The word line decoder and driver circuit 74 selectively drives and controls word lines WL00000 to WL15331.

The global bit line decoder and driver circuit 98 selectively drives and controls global bit lines GBL000 to GBL153.

The current limiting control circuit 99 individually generates voltages VCMNn and VCMPn (n is a number from 0 to 15) for controlling the bidirectional current limiting circuit 920 according to an operation mode.

The sub-bit line selection circuit 73 controls, according to the address signals A0 to Ax, even layer bit line selection signals BLs_e0 to BLs_en and odd layer bit line selection signals BLs_o0 to BLs_on for the memory cell arrays 100 so that, in the memory cell array 200, an odd layer bit line selection switch element (one of the odd layer bit line selection switch elements 61 to 64 in the example shown in FIG. 12) or an even layer bit line selection switch element (one of the even layer bit line selection switch elements 65 to 68 in the example shown in FIG. 12) belonging to a selected vertical array plane becomes conductive.

Figure 15:
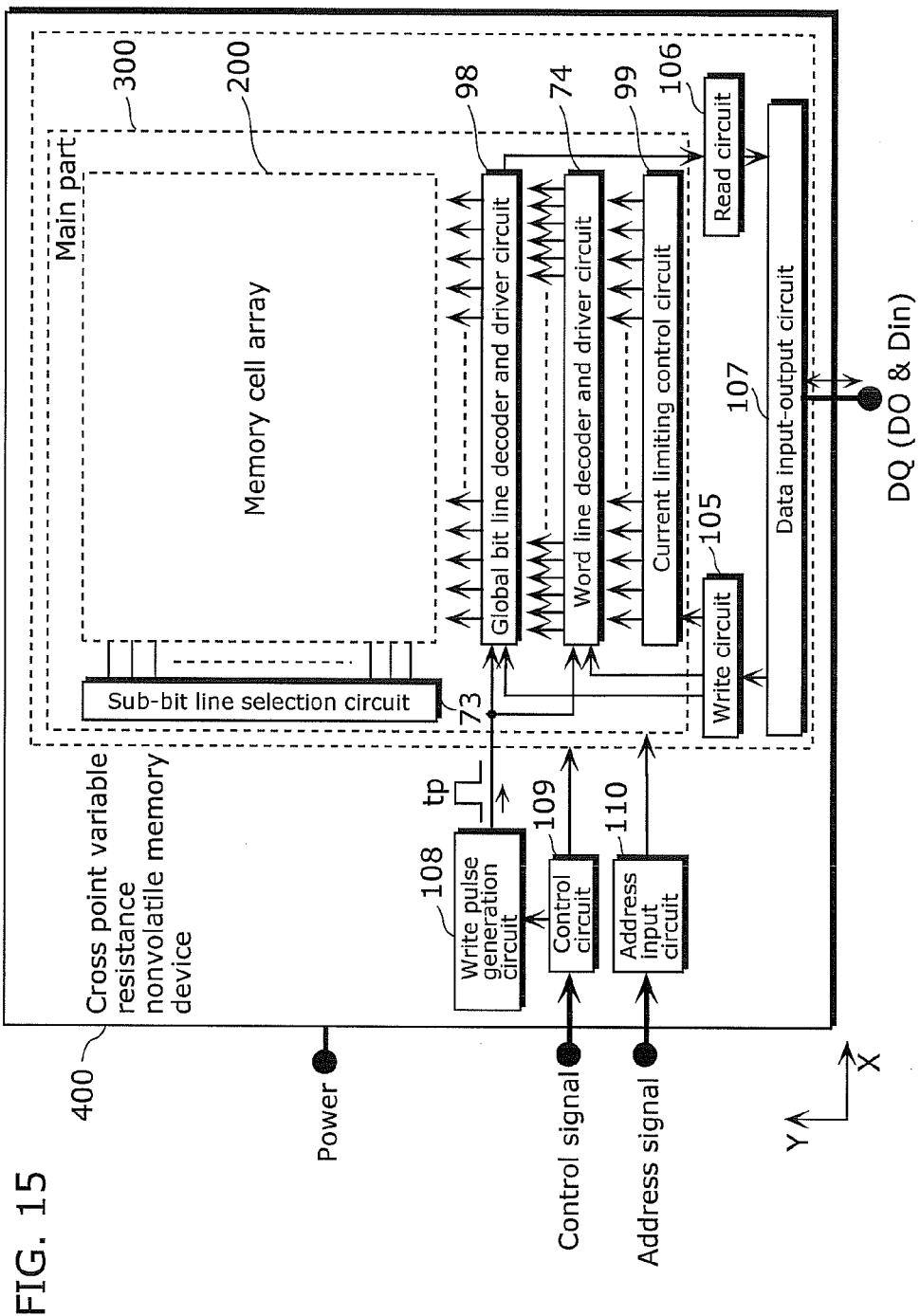
FIG. 15 is a circuit diagram showing a structure of a cross point variable resistance nonvolatile memory device in the embodiment of the present invention.

FIG. 15 is a circuit diagram showing an overall structure of a cross point variable resistance nonvolatile memory device 400 in this embodiment. A main part 300 shown in FIG. 15 corresponds to the structure shown in FIG. 14.

In FIG. 15, an address input circuit 110 temporarily latches address signals from outside during a high resistance writing cycle, a low resistance writing cycle, or a reading cycle, and outputs the latched address signals to the sub-bit line selection circuit 73, the global bit line decoder and driver circuit 98, the word line decoder and driver circuit 74, and the current limiting control circuit 99.

A control circuit 109 receives a plurality of input signals, and outputs a signal indicating a state in the high resistance writing cycle, the low resistance writing cycle, the reading cycle, or standby, to the sub-bit line selection circuit 73, the global bit line decoder and driver circuit 98, the word line decoder and driver circuit 74, the current limiting control circuit 99, a write circuit 105, a read circuit 106, and a data input-output circuit 107. The control circuit 109 also outputs a pulse generation trigger signal for high resistance writing, low resistance writing, or reading in the high resistance writing cycle, the low resistance writing cycle, or the reading cycle, to a write pulse generation circuit 108.

The write pulse generation circuit 108 generates a pulse for a given period (tp_E, tp_P, tp_R) in a high resistance writing time in the high resistance writing cycle, a low resistance writing time in the low resistance writing cycle, or a reading time in the reading cycle, and outputs the generated pulse to the global bit line decoder and driver circuit 98 and the word line decoder and driver circuit 74.

The data input-output circuit 107 is a block that sends or receives data to or from outside. In a writing operation, the data input-output circuit 107 latches data DQ, and outputs the write data to the write circuit 105 until reception of the next data. In a reading operation, the data input-output circuit 107 latches read data from the read circuit 106, and outputs the read data to an external terminal DQ until reception of the next output data.

The write circuit 105 is a circuit that writes data to a memory cell selected by the global bit line decoder and driver circuit 98 and the word line decoder and driver circuit 74. Upon receiving a data signal from the data input-output circuit 107, the write circuit 105 outputs a write command signal to the global bit line decoder and driver circuit 98, the word line decoder and driver circuit 74, and the current limiting control circuit 99.

The read circuit 106 is a circuit that reads data from a memory cell selected by the global bit line decoder and driver circuit 98 and the word line decoder and driver circuit 74. The read circuit 106 detects a stored data state of a memory cell selected by the sub-bit line selection circuit 73 and the global bit line decoder and driver circuit 98, and outputs a detection result to the data input-output circuit 107 as a data signal.

Regarding a threshold of a transistor included in each circuit, the peripheral circuits of the memory cell array 200, namely, the sub-bit line selection circuit 73, the global bit line decoder and driver circuit 98, the word line decoder and driver circuit 74, the current limiting control circuit 99, the write circuit 105, the read circuit 106, the data input-output circuit 107, the write pulse generation circuit 108, the control circuit 109, and the address input circuit 110 each include at least one of an NMOS transistor having a positive first threshold voltage and a PMOS transistor having a negative second threshold voltage. In the bidirectional current limiting circuits 920, on the other hand, the N-type current limiting elements 90, 92, 94, and 96 each include an NMOS transistor having a third threshold voltage (e.g. 100 mV) lower than the first threshold voltage, and the P-type current limiting elements 91, 93, 95, and 97 each include a PMOS transistor having a fourth threshold voltage (e.g. −100 mV) lower in absolute value than the second threshold voltage.

The odd layer bit line selection switch elements and the even layer bit line selection switch elements also each include an NMOS transistor having the third threshold voltage.

[Description of Operating Voltage Setting]

The following describes an operation of the cross point variable resistance nonvolatile memory device 400 having the above-mentioned structure.

One feature of the present invention is that, in the cross point memory shown in FIG. 11, the variable resistance layers and the electrode layers of the variable resistance element 10 in the memory cell 51 shown in FIG. 10 can be stacked in the same order regardless of which memory cell layer the memory cell 51 belongs to.

Meanwhile, the bit line and the word line alternate between the lower connection and the upper connection to the memory cell 51, depending on the placement layer of the memory cell 51. The memory cell 51 has bidirectional writing characteristics of changing to the high resistance state when the electrode 11 in contact with the second variable resistance layer 12 is set to a voltage higher than a predetermined voltage with respect to the electrode 21, and changing to the low resistance state when the electrode 11 is set to a voltage lower than a predetermined voltage with respect to the electrode 21. Therefore, the bit line and the word line are reversed in operation in the case of selecting an odd layer memory cell and in the case of selecting an even layer memory cell. Another feature of the present invention is that a stable resistance change can be achieved in such a manner that one of the odd layer bit line selection switch element 58 and the even layer bit line selection switch element 57 is selectively brought into conduction depending on the layer of the selected bit line and, regardless of which layer the selected memory cell belongs to, low resistance writing is performed by limiting a current to a predetermined value whereas high resistance writing is performed by causing a flow of a current larger than and opposite in direction to that in low resistance writing without current limitation.

To realize this, it is necessary to assume the following eight types of operations corresponding to all combinations of the writing to the low resistance state or the high resistance state and the current direction of the global bit line and the word line depending on the selected memory cell layer.

(A) Operation of writing a memory cell M1 in a (4n+1)th layer (n is a natural number) to the low resistance state.

(B) Operation of writing the memory cell M1 in the (4n+1)th layer (n is a natural number) to the high resistance state.

(C) Operation of writing a memory cell M2 in a (4n+2)th layer (n is a natural number) to the low resistance state.

(D) Operation of writing the memory cell M2 in the (4n+2)th layer (n is a natural number) to the high resistance state.

(E) Operation of writing a memory cell M3 in a (4n+3)th layer (n is a natural number) to the low resistance state.

(F) Operation of writing the memory cell M3 in the (4n+3)th layer (n is a natural number) to the high resistance state.

(G) Operation of writing a memory cell M4 in a (4n+4)th layer (n is a natural number) to the low resistance state.

(H) Operation of writing the memory cell M4 in the (4n+4)th layer (n is a natural number) to the high resistance state.

Here, the memory cells M1 to M4 correspond to the memory cells of the different layers shown in FIG. 11. Operations of memory cells in higher layers than the memory cell M4 are the same as those of the memory cells M1 to M4, except a difference in the selected word line.

The bidirectional current limiting circuit 920 performs a current limiting operation according to the selected memory cell layer. This current limiting operation can be performed in two modes using the same circuit structure, namely, (1) a method that uses source follower characteristics of a transistor (hereafter referred to as a source follower mode) and (2) a method that uses saturation region characteristics of a transistor (hereafter referred to as a saturation current limiting mode).

Figure 17:
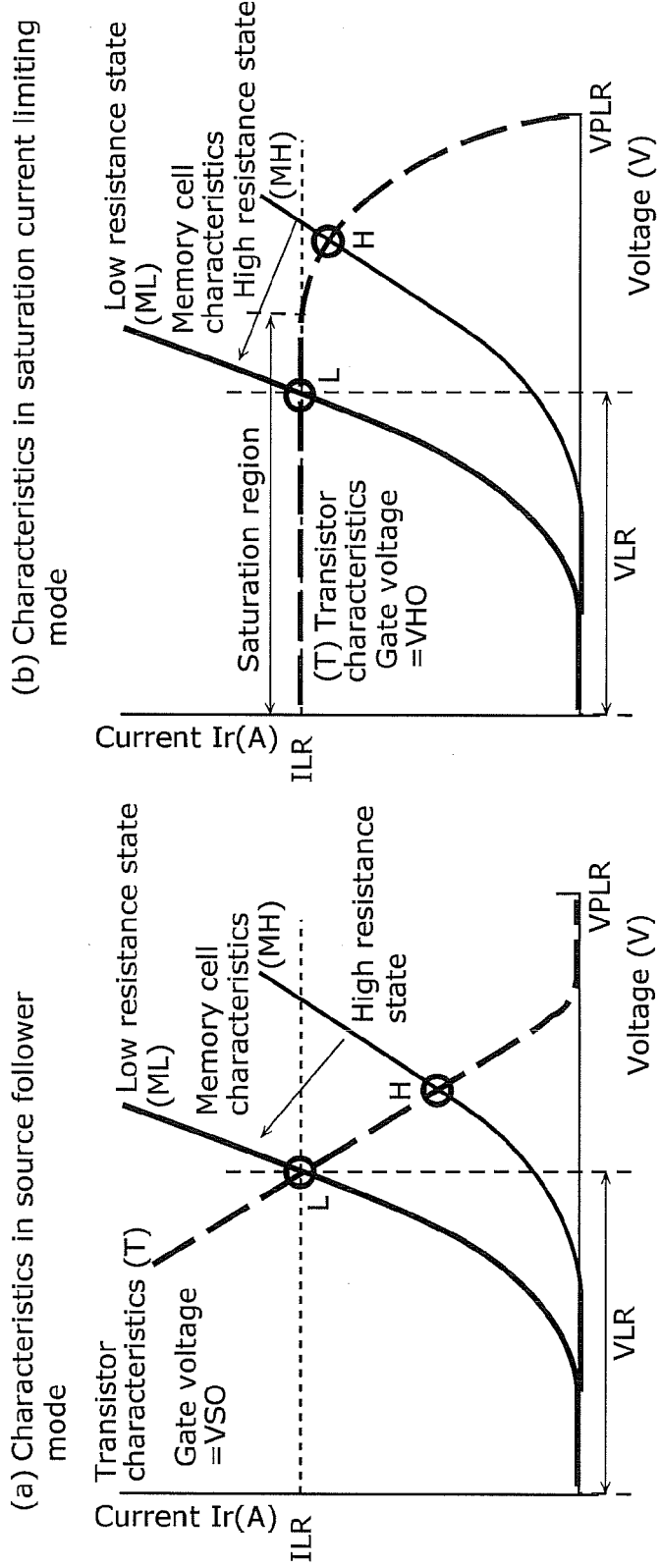
FIGS. 17(a) and 17(b) is a diagram showing characteristics in the source follower mode and the saturation current limiting mode, respectively.

The following describes each of these modes, with reference to a structure example shown in FIGS. 16(a) and 16(b) and a characteristic diagram shown in FIGS. 17(a) and 17(b).

FIGS. 16(a) and 16(b) shows examples of series connection between the memory cell 51 and an NMOS transistor 190 for current limitation. FIG. 16(a) shows an example of connection and applied voltages in the source follower mode, whereas FIG. 16(b) shows an example of connection and applied voltages in the saturation current limiting mode. Both examples correspond to a method of controlling the amount of current flowing through the memory cell 51 to a predetermined value in order to set a resistance value of the low resistance state.

In FIG. 16(a), the source follower mode is used, and accordingly a drain terminal of the NMOS transistor 190 is connected to Node B of a voltage VPLR, and a terminal of the memory cell 51 not connected to a source of the NMOS transistor 190 is connected to Node A of a low voltage (e.g. 0 V). Meanwhile, a voltage VSO is applied to the node CMN connected to a gate terminal of the NMOS transistor 190.

FIG. 17(a) is a characteristic operating point diagram in the case of the connection in FIG. 16(a). In FIG. 17(a), a solid line (MH) represents current-voltage characteristics of the memory cell 51 in the high resistance state, a solid line (ML) represents current-voltage characteristics of the memory cell 51 in the low resistance state, and a dashed line (T) represents load characteristics of the NMOS transistor 190 when the voltage VSO is applied to the gate terminal of the NMOS transistor 190. Since the NMOS transistor 190 operates as a source follower, the characteristic line (T) shifts left and right on a voltage axis according to the gate voltage.

In the case where the memory cell 51 changes from the high resistance state to the low resistance state, its operating point with the NMOS transistor 190 is initially at intersection point H (i.e. Node M in FIG. 16(a) has a voltage at point H), based on the current-voltage characteristics (MH) in the high resistance state. Subsequently, when the memory cell 51 changes to the low resistance state, its current-voltage characteristics are changed to (ML), and its operating point with the NMOS transistor 190 shifts to intersection point L (i.e. Node M has a voltage VLR at point L). The resistance value of the low resistance state of the memory cell 51 is determined by a current ILR when the voltage applied across the memory cell 51 is VLR. For example, in the case of increasing the gate voltage VSO of the NMOS transistor 190, the transistor characteristics (T) shift to the higher voltage side, and as a result operating point L shifts to the higher current side, thus setting a lower resistance value. In the case of decreasing the gate voltage VSO, the transistor characteristics (T) shift to the lower voltage side, and as a result operating point L shifts to the lower current side, thus setting a higher resistance value.

In FIG. 16(b), the saturation current limiting mode is used, and accordingly a source terminal of the NMOS transistor 190 is connected to Node A of a low voltage (e.g. 0 V), and a terminal of the memory cell 51 not connected to a drain of the NMOS transistor 190 is connected to Node B of a high voltage VPLR. Meanwhile, a voltage VHO is applied to the node CMN connected to a gate terminal of the NMOS transistor 190.

FIG. 17(b) is a characteristic operating point diagram in the case of the connection in FIG. 16(b). In FIG. 17(b), a solid line (MH) represents characteristics of the memory cell 51 in the high resistance state, a solid line (ML) represents characteristics of the memory cell 51 in the low resistance state, and a dashed line (T) represents characteristics of the NMOS transistor 190 when the voltage VHO is applied to the gate terminal. Since the NMOS transistor 190 operates with saturation characteristics, the saturation region characteristic line of the characteristic line (T) shifts up and down on a current axis according to the gate voltage.

In the case where the memory cell 51 changes from the high resistance state to the low resistance state, its operating point with the NMOS transistor 190 is initially at intersection point H (i.e. Node M has a voltage obtained by subtracting a voltage at point H from VPLR), based on the current-voltage characteristics (MH) in the high resistance state. Subsequently, when the memory cell 51 changes to the low resistance state, its current-voltage characteristics are changed to (ML), and its operating point with the NMOS transistor 190 shifts to intersection point L in the saturation region (i.e. Node M has a voltage (VPLR−VLR)). The resistance value of the low resistance state of the memory cell 51 is determined by a current ILR when the voltage applied across the memory cell 51 is VLR. For example, in the case of increasing the gate voltage VHO of the NMOS transistor 190, the saturation region characteristic line of the transistor characteristics (T) shifts to the higher current side, and as a result operating point L shifts to the higher current side, thus setting a lower resistance value. In the case of decreasing the gate voltage VHO, the saturation region characteristic line of the transistor characteristics (T) shifts to the lower current side, and as a result operating point L shifts to the lower current side, thus setting a higher resistance value.

As described above, the resistance value of the low resistance state of the memory cell 51 can be controlled in the two current limiting modes.

The following describes a detailed operation in the case of applying each of the above-mentioned two current limiting modes to the structure of the multilayer cross point memory shown in FIG. 11.

Example 1

As an operation of writing the multilayer cross point variable resistance nonvolatile memory device in Example 1, the following describes an operation whereby, when performing low resistance writing to a selected memory cell depending on a memory cell layer to which the selected memory cell belongs to, low resistance writing is performed by activating only one of the N-type current limiting element 90 and the P-type current limiting element 91 that has a higher substrate bias effect, with the source follower mode being used for current limitation in low resistance writing. The saturation current limiting mode will be described in detail later as Embodiment 2.

Table 1 shows set voltages of main signals in the diagram of the basic structure shown in FIG. 11 in association with each of the operations of the memory cells M1 to M4 of the different layers, in the source follower mode. In the table, "(ON: SF)" means that the current limiting element is ON and the source follower current limitation is performed, and "(ON)" and "(OFF)" respectively mean that the corresponding bit line selection switch element or current limiting element is ON and OFF.

bit line selection signal voltage of Vpp to the gate terminal of the odd layer bit line selection switch element 58 to turn ON the odd layer bit line selection switch element 58, and applies an even layer bit line selection signal voltage of 0 V to the gate terminal of the even layer bit line selection switch element 57 to turn OFF the even layer bit line selection switch element 57 (the even layer bit line selection switch element 57 is shown by dashed lines). Here, Vpp is a voltage that is sufficiently higher than the threshold voltage of the odd layer bit line selection switch element 58, and is stepped-up to be equal to or more than a power voltage Vcc.

TABLE 1

|  | Writing to M1 | | Writing to M2 | | Writing to M3 | | Writing to M4 | |
| --- | --- | --- | --- | --- | --- | --- | --- | --- |
|  | LR (A) | HR (B) | LR (C) | HR (D) | LR (E) | HR (F) | LR (G) | HR (H) |
| Gate voltage of odd layer bit line selection switch element 58 | Vpp (ON) | Vpp (ON) | 0 V (OFF) | 0 V (OFF) | 0 V (OFF) | 0 V (OFF) | Vpp (ON) | Vpp (ON) |
| Gate voltage of even layer bit line selection switch element 57 | 0 V (OFF) | 0 V (OFF) | Vpp (ON) | Vpp (ON) | Vpp (ON) | Vpp (ON) | 0 V (OFF) | 0 V (OFF) |
| Voltage of CMN | VCMN (ON: SF) | VCMN (ON) | 0 V (OFF) | 0 V (OFF) | VCMN (ON: SF) | VCMN (ON) | 0 V (OFF) | 0 V (OFF) |
| Voltage of CMP | Vpof (OFF) | Vpof (OFF) | VCMP (ON: SF) | VCMP (ON) | Vpof (OFF) | Vpof (OFF) | VCMP (ON: SF) | VCMP (ON) |
| Global bit line | VLR1 | 0 V | 0 V | VHR2 | VLR1 | 0 V | 0 V | VHR2 |
| Selected word line | 0 V | VHR1 | VLR2 | 0 V | 0 V | VHR1 | VLR2 | 0 V |

The following describes examples of writing the memory cells 51 included in the first to fourth layer memory cells 51a to 51d as designated by M1 to M4 in FIG. 11, with reference to FIGS. 18A to 18H.

Figure 18A:
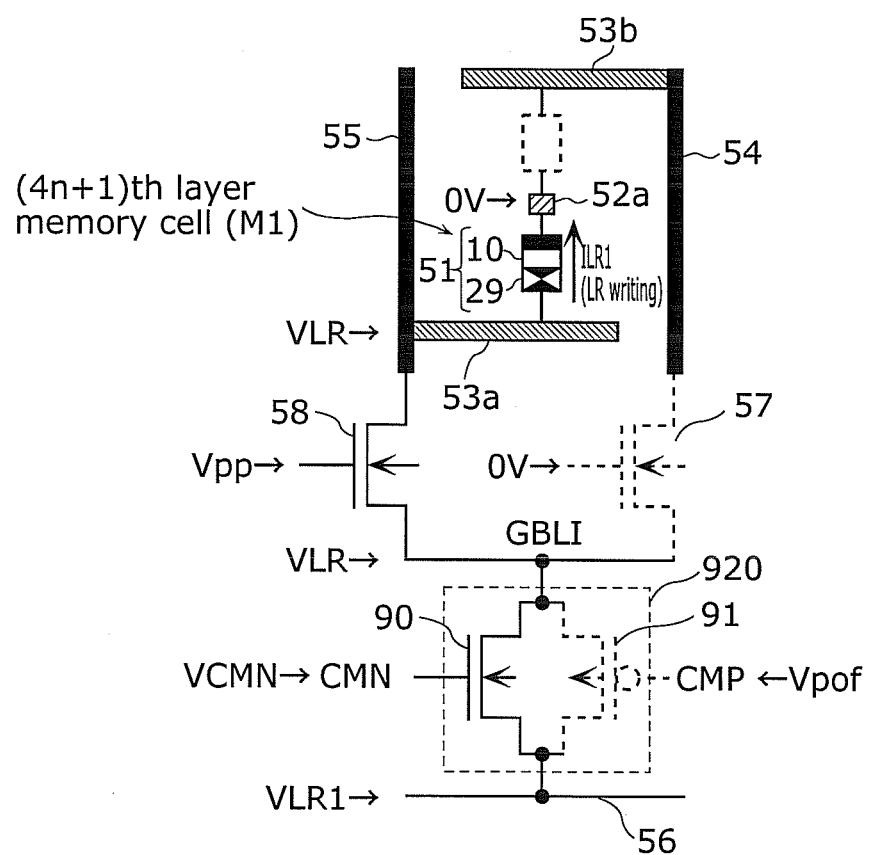
FIG. 18A is a diagram for describing a low resistance writing operation of a (4n+1)th layer memory cell in the source follower mode.

(A) Operation of Writing the Memory Cell M1 in the (4n+1)th Layer (n is a Natural Number) to the Low Resistance State FIG. 18A is an equivalent circuit diagram showing an element connection structure from the global bit line 56 to the word line 52a in the cross section diagram in FIG. 11, for describing an operation of writing the (4n+1)th layer memory cell M1 to the low resistance state.

In FIG. 18A, reference numeral 51 is the selected memory cell M1 in the (4n+1)th layer (M2 is shown by a dashed line box), 58 is the odd layer bit line selection switch element including an NMOS transistor, 90 is the N-type current limiting element including an NMOS transistor, and 91 is the P-type current limiting element including a PMOS transistor.

The N-type current limiting element 90 and the P-type current limiting element 91 are connected in parallel with each other at their source and drain terminals, thereby constituting the bidirectional current limiting circuit 920. In this operation, a voltage VLR1 equal to or more than the voltage VLR required for low resistance writing is applied to the global bit line 56 with respect to the word line 52a so that a current flows in a direction of the global bit line 56→the bidirectional current limiting circuit 920→the odd layer bit line selection switch element 58→the bit line 53a→the selected memory cell 51→the word line 52a.

When writing the memory cell M1 to the low resistance state, the sub-bit line selection circuit 73 applies an odd layer In this case, the current limiting control circuit 99 applies a voltage Vpof equal to or more than Vcc to the node CMP connected to the gate terminal of the P-type current limiting element 91 to turn OFF the P-type current limiting element 91 (the P-type current limiting element 91 is shown by dashed lines), and applies VCMN to the node CMN connected to the gate terminal of the N-type current limiting element 90 to turn ON the N-type current limiting element 90.

The word line decoder and driver circuit 74 applies a reference voltage (0 V in this example) to the word line 52a connected to the selected memory cell 51, and the global bit line decoder and driver circuit 98 applies the voltage VLR1 to the global bit line 56 so that the voltage across both ends of the selected memory cell 51 is equal to or more than the voltage VLR required for low resistance writing, thereby causing a flow of a current in a direction in which the selected memory cell 51 changes to the low resistance state.

Here, the current limiting control circuit 99 applies such a voltage VCMN that limits the current flowing through the N-type current limiting element 90 to a predetermined current value ILR1, to the node CMN connected to the gate terminal of the N-type current limiting element 90. This exploits characteristics that, since the source of the N-type current limiting element 90 including an NMOS transistor is on the side of the contact with the odd layer bit line selection switch element 58, the voltage applied across both ends of the selected memory cell 51 is limited to the voltage VLR as a result of a drop of the threshold voltage Vt including the substrate bias effect from the gate voltage VCMN of the N-type current limiting element 90, thus enabling the N-type current limiting element 90 to function as a constant current source in the source follower mode.

That is, by setting the gate voltage VCMN of the N-type current limiting element 90 to an appropriate value, a current limited to a predetermined current value can be caused to flow through the selected memory cell 51 in a direction from the bit line 53a to the word line 52a, allowing the memory cell 51 to be set to a predetermined low resistance value. According to the above-mentioned control, when changing the (4n+1)th layer memory cell M1 to the low resistance state, the memory cell M1 can be changed to the low resistance state of a desired resistance value by current limitation in the source follower mode.

Figure 18B:
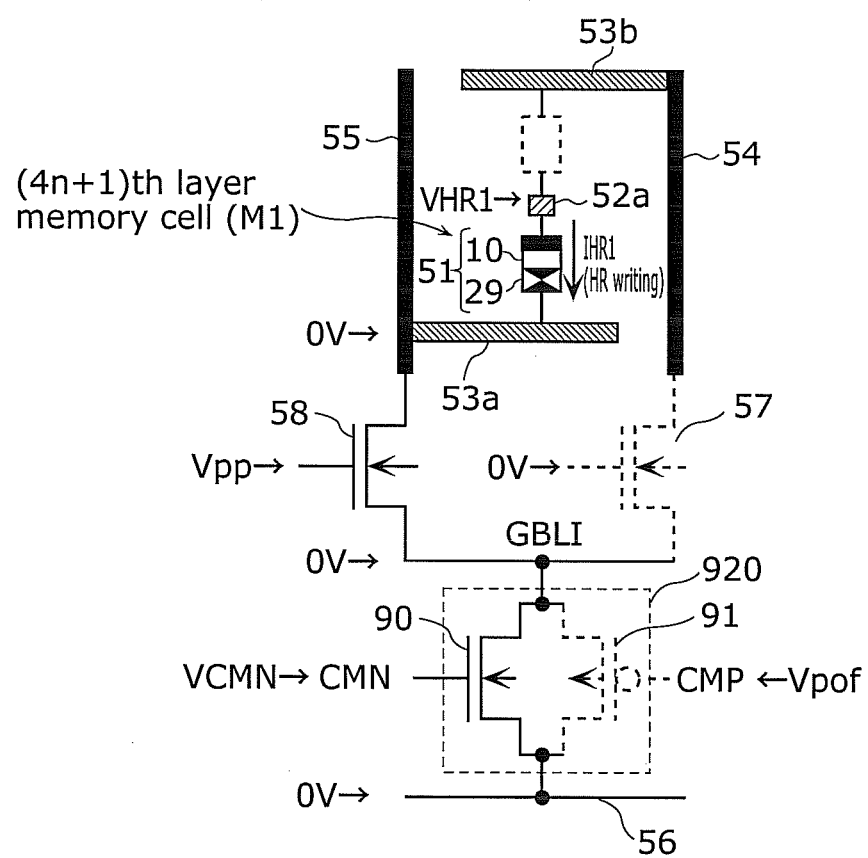
FIG. 18B is a diagram for describing a high resistance writing operation of the (4n+1)th layer memory cell in the source follower mode.

(B) Operation of Writing the Memory Cell M1 in the (4n+1)th Layer (n is a Natural Number) to the High Resistance State FIG. 18B is an equivalent circuit diagram showing an element connection structure from the global bit line 56 to the word line 52a in the cross section diagram in FIG. 11, for describing an operation of writing the (4n+1)th layer memory cell M1 to the high resistance state. Though the same structure as in FIG. 18A is used here, a voltage is applied so that the word line 52a is higher in voltage than the global bit line 56, to cause a flow of a current in a direction from the word line 52a to the bit line 53a.

When writing the memory cell M1 to the high resistance state, too, the sub-bit line selection circuit 73 applies an odd layer bit line selection signal voltage of Vpp to the gate terminal of the odd layer bit line selection switch element 58 to turn ON the odd layer bit line selection switch element 58, and applies an even layer bit line selection signal voltage of 0 V to the gate terminal of the even layer bit line selection switch element 57 to turn OFF the even layer bit line selection switch element 57 (the even layer bit line selection switch element 57 is shown by dashed lines).

In this case, too, the current limiting control circuit 99 applies the voltage Vp of equal to or more than Vcc to the node CMP connected to the gate terminal of the P-type current limiting element 91 to turn OFF the P-type current limiting element 91 (the P-type current limiting element 91 is shown by dashed lines), and applies VCMN to the node CMN connected to the gate terminal of the N-type current limiting element 90 to turn ON the N-type current limiting element 90.

The global bit line decoder and driver circuit 98 applies a reference voltage (0 V in this example) to the global bit line 56, and the word line decoder and driver circuit 74 applies a voltage VHR1 to the word line 52a so that the voltage across both ends of the selected memory cell 51 is equal to or more than a voltage VHR required for high resistance writing of the selected memory cell 51, thereby causing a flow of a current in a direction in which the selected memory cell 51 changes to the high resistance state.

Here, the current limiting control circuit 99 applies the same voltage VCMN as in low resistance writing to the node CMN connected to the gate terminal of the N-type current limiting element 90, to turn ON the N-type current limiting element 90.

In this state, the source of the N-type current limiting element 90 including an NMOS transistor is on the side of the contact with the global bit line 56 set to 0 V. Such an N-type current limiting element 90 has a low substrate bias effect, and also the gate voltage VCMN of the N-type current limiting element 90 is sufficiently higher than the threshold voltage Vt of the NMOS transistor. Accordingly, the N-type current limiting element 90 can function as a bit line selection switch element having a current drive capability of a current IHR1 for high resistance writing, which is higher than the limited current value ILR1 in low resistance writing (no current limitation is performed).

That is, by merely setting a voltage required for high resistance writing of the selected memory cell 51 to the selected word line 52a while setting the gate voltage VCMN of the N-type current limiting element 90 to the same value as in low resistance writing, a larger current than in low resistance writing can be caused to flow through the selected memory cell 51, ensuring that the selected memory cell 51 is written to the high resistance state. According to the above-mentioned control, when changing the (4n+1)th layer memory cell M1 to the high resistance state, the memory cell M1 can be reliably changed to the high resistance state by causing a larger current than in low resistance writing to flow through the memory cell M1.

Figure 18C:
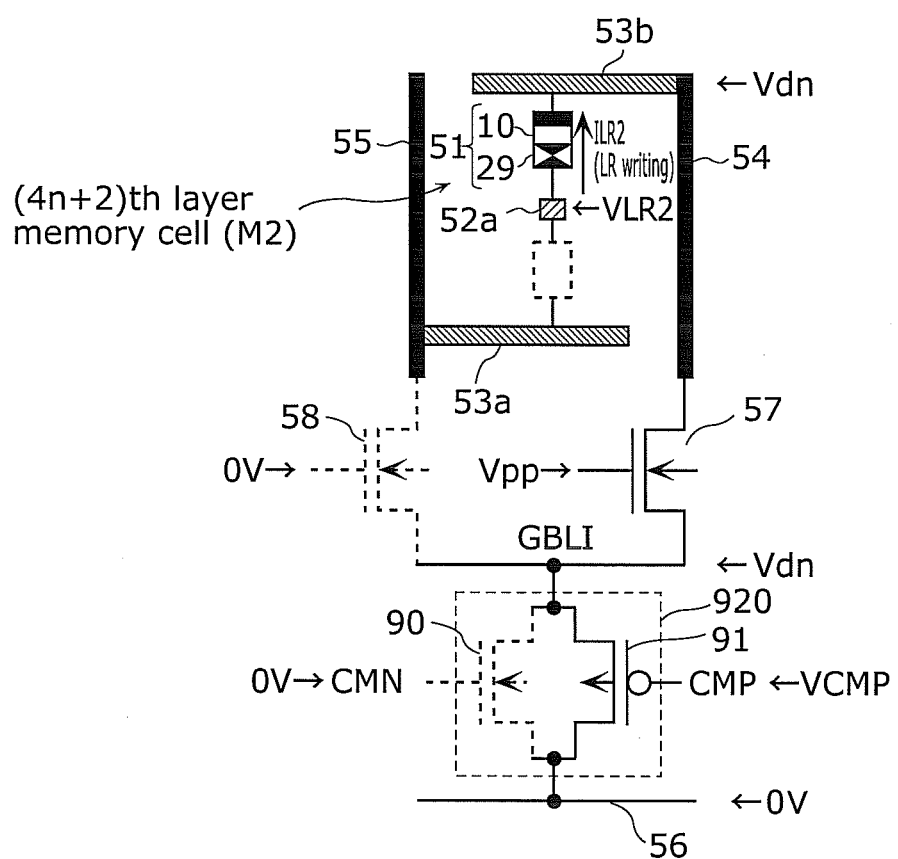
FIG. 18C is a diagram for describing a low resistance writing operation of a (4n+2)th layer memory cell in the source follower mode.

(C) Operation of Writing the Memory Cell M2 in the (4n+2)th Layer (n is a Natural Number) to the Low Resistance State FIG. 18C is an equivalent circuit diagram showing an element connection structure from the global bit line 56 to the word line 52a in the cross section diagram in FIG. 11, for describing an operation of writing the (4n+2)th layer memory cell M2 to the low resistance state.

In FIG. 18C, reference numeral 51 is the selected memory cell M2 in the (4n+2)th layer (M1 is shown by a dashed line box), 57 is the even layer bit line selection switch element including an NMOS transistor, 90 is the N-type current limiting element including an NMOS transistor, and 91 is the P-type current limiting element including a PMOS transistor.

The N-type current limiting element 90 and the P-type current limiting element 91 are connected in parallel with each other at their source and drain terminals, thereby constituting the bidirectional current limiting circuit 920. In this operation, a higher voltage is applied to the word line 52a with respect to the global bit line 56 so that a current flows in a direction of the word line 52a→the selected memory cell 51→the bit line 53b→the even layer bit line selection switch element 57→the bidirectional current limiting circuit 920→the global bit line 56.

When writing the memory cell M2 to the low resistance state, the sub-bit line selection circuit 73 applies an even layer bit line selection signal voltage of Vpp to the gate terminal of the even layer bit line selection switch element 57 to turn ON the even layer bit line selection switch element 57, and applies an odd layer bit line selection signal voltage of 0 V to the gate terminal of the odd layer bit line selection switch element 58 to turn OFF the odd layer bit line selection switch element 58 (the odd layer bit line selection switch element 58 is shown by dashed lines).

In this case, the current limiting control circuit 99 applies 0 V to the node CMN connected to the gate terminal of the N-type current limiting element 90 to turn OFF the N-type current limiting element 90 (the N-type current limiting element 90 is shown by dashed lines), and applies the voltage VCMP to the node CMP connected to the gate terminal of the P-type current limiting element 91 to turn ON the P-type current limiting element 91.

The word line decoder and driver circuit 74 applies a voltage VLR2 to the word line 52a connected to the selected memory cell 51 so that the voltage across both ends of the selected memory cell 51 is equal to or more than the voltage VLR required for low resistance writing of the selected memory cell 51, and the global bit line decoder and driver circuit 98 applies a reference voltage (0 V in this example) to the global bit line 56, thereby causing a flow of a current in a direction in which the selected memory cell 51 changes to the low resistance state.

Here, the current limiting control circuit 99 applies such a voltage VCMP that limits the current flowing through the P-type current limiting element 91 to a predetermined current value ILR2, to the node CMP connected to the gate terminal of the P-type current limiting element 91. This exploits characteristics that, since the source of the P-type current limiting element 91 including a PMOS transistor is on the side of the contact with the even layer bit line selection switch element 57, the voltage applied across both ends of the selected memory cell 51 is limited to a voltage Vdn (VLR2−Vdn=VLR) as a result of a drop of a threshold voltage Vtp including the substrate bias effect from the gate voltage VCMP of the P-type current limiting element 91, thus enabling the PMOS transistor to function as a constant current source in the source follower mode.

That is, by setting the gate voltage VCMP of the P-type current limiting element 91 to an appropriate value, a current limited to a predetermined current value can be caused to flow through the selected memory cell 51 in a direction from the word line 52a to the bit line 53b, allowing the memory cell 51 to be set to a predetermined low resistance state. According to the above-mentioned control, when changing the (4n+2)th layer memory cell M2 to the low resistance state, the memory cell M2 can be changed to the low resistance state of a desired resistance value by current limitation in the source follower mode.

The predetermined current limit value ILR2 is set to be equal to the predetermined current limit value ILR1 when writing the (4n+1)th memory cell to the low resistance state as described in (A), by adjusting the gate voltages VCMN and VCMP and the transistor sizes of the N-type current limiting element 90 and the P-type current limiting element 91.

Figure 18D:
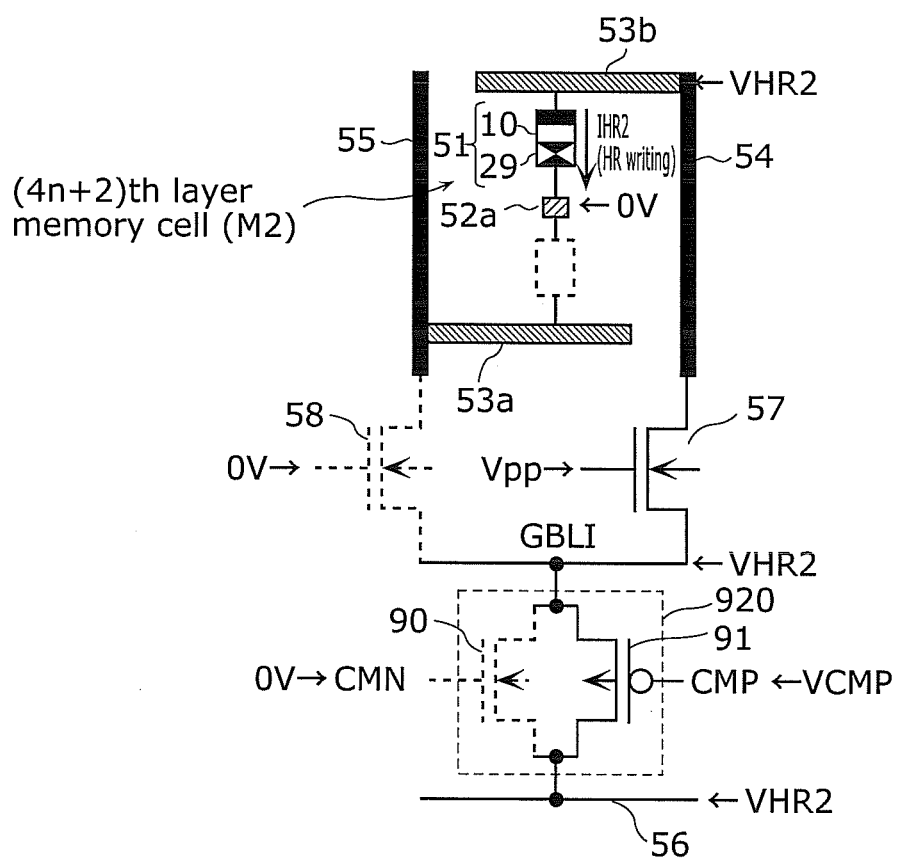
FIG. 18D is a diagram for describing a high resistance writing operation of the (4n+2)th layer memory cell in the source follower mode.

(D) Operation of Writing the Memory Cell M2 in the (4n+2)th Layer (n is a Natural Number) to the High Resistance State FIG. 18D is an equivalent circuit diagram showing an element connection structure from the global bit line 56 to the word line 52a in the cross section diagram in FIG. 11, for describing an operation of writing the (4n+2)th layer memory cell M2 to the high resistance state. Though the same structure as in FIG. 18C is used here, a voltage is applied so that the global bit line 56 is higher in voltage than the word line 52a, to cause a flow of a current in a direction from the bit line 53b to the word line 52a.

When writing the memory cell M2 to the high resistance state, too, the sub-bit line selection circuit 73 applies an even layer bit line selection signal voltage of Vpp to the gate terminal of the even layer bit line selection switch element 57 to turn ON the even layer bit line selection switch element 57, and applies an odd layer bit line selection signal voltage of 0 V to the gate terminal of the odd layer bit line selection switch element 58 to turn OFF the odd layer bit line selection switch element 58 (the odd layer bit line selection switch element 58 is shown by dashed lines).

In this case, too, the current limiting control circuit 99 applies 0 V to the node CMN connected to the gate terminal of the N-type current limiting element 90 to turn OFF the N-type current limiting element 90 (the N-type current limiting element 90 is shown by dashed lines), and applies the voltage VCMP to the node CMP connected to the gate terminal of the P-type current limiting element 91 to turn ON the P-type current limiting element 91.

The word line decoder and driver circuit 74 applies a reference voltage (0 V in this example) to the word line 52a, and the global bit line decoder and driver circuit 98 applies a voltage VHR2 to the global bit line 56 so that the voltage across both ends of the selected memory cell 51 is equal to or more than the voltage VHR required for high resistance writing of the selected memory cell 51, thereby causing a flow of a current in a direction in which the selected memory cell 51 changes to the high resistance state.

Here, the current limiting control circuit 99 applies the same voltage VCMP as in low resistance writing to the node CMP connected to the gate terminal of the P-type current limiting element 91, to turn ON the P-type current limiting element 91.

In this state, the source of the P-type current limiting element 91 including a PMOS transistor is on the side of the contact with the global bit line 56 set to VHR2. Such a P-type current limiting element 91 has a low substrate bias effect, and also the gate voltage VCMP of the P-type current limiting element 91 is sufficiently lower than the threshold voltage Vt of the PMOS transistor. Accordingly, the P-type current limiting element 91 can function as a bit line selection switch element having a current drive capability of a current IHR2 for high resistance writing, which is higher than the limited current value ILR2 in low resistance writing.

That is, by merely setting a voltage required for high resistance writing of the selected memory cell 51 to the global bit line 56 while setting the gate voltage VCMP of the P-type current limiting element 91 to the same value as in low resistance writing, a larger current than in low resistance writing can be caused to flow through the selected memory cell 51, ensuring that the selected memory cell 51 is written to the high resistance state. According to the above-mentioned control, when changing the (4n+2)th layer memory cell M2 to the high resistance state, the memory cell M2 can be reliably changed to the high resistance state by causing a larger current than in low resistance writing to flow through the memory cell M2.

Figure 18E:
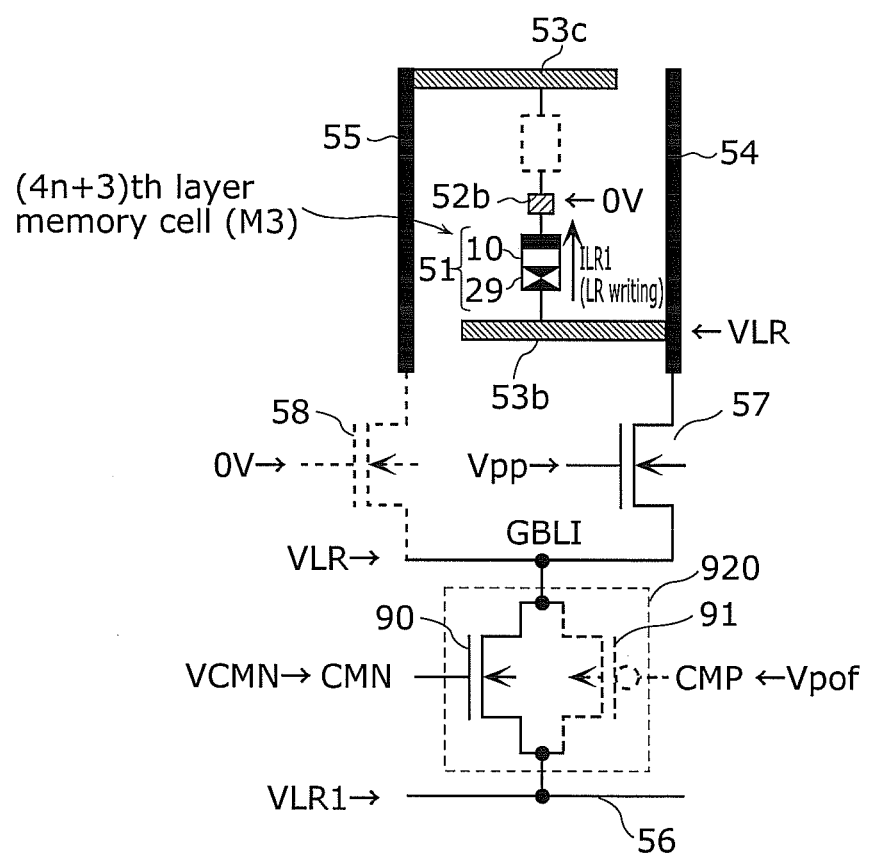
FIG. 18E is a diagram for describing a low resistance writing operation of a (4n+3)th layer memory cell in the source follower mode.

(E) Operation of Writing the Memory Cell M3 in the (4n+3)th Layer (n is a Natural Number) to the Low Resistance State FIG. 18E is an equivalent circuit diagram showing an element connection structure from the global bit line 56 to the word line 52b in the cross section diagram in FIG. 11, for describing an operation of writing the (4n+3)th layer memory cell M3 to the low resistance state.

The equivalent circuit diagram in FIG. 18E differs from the equivalent circuit diagram in FIG. 18A in the placement layer of the memory cell 51, the word line and the bit line related to the memory cell 51, and the bit line selection switch element for selecting the odd layer or even layer bit line, but the other parts are the same as in FIG. 18A. Accordingly, only the difference from FIG. 18A is described below.

In FIG. 18E, reference numeral 51 is the selected memory cell M3 in the (4n+3)th layer, 57 is the even layer bit line selection switch element including an NMOS transistor, 90 is the N-type current limiting element including an NMOS transistor, and 91 is the P-type current limiting element including a PMOS transistor.

The N-type current limiting element 90 and the P-type current limiting element 91 are connected in parallel with each other at their source and drain terminals, thereby constituting the bidirectional current limiting circuit 920. In this operation, a higher voltage is applied to the global bit line 56 with respect to the word line 52b so that a current flows in a direction of the global bit line 56→the bidirectional current limiting circuit 920→the even layer bit line selection switch element 57→the bit line 53b→the selected memory cell 51→the word line 52b.

When writing the memory cell M3 to the low resistance state, the sub-bit line selection circuit 73 applies an even layer bit line selection signal voltage of Vpp to the gate terminal of the even layer bit line selection switch element 57 to turn ON the even layer bit line selection switch element 57, and applies an odd layer bit line selection signal voltage of 0 V to the gate terminal of the odd layer bit line selection switch element 58 to turn OFF the odd layer bit line selection switch element 58 (the odd layer bit line selection switch element 58 is shown by dashed lines). Here, Vpp is a voltage that is sufficiently higher than the threshold voltage of the even layer bit line selection switch element 57, and is stepped-up to be equal to or more than the power voltage Vcc.

The operating conditions of the bidirectional current limiting circuit 920, the global bit line 56, and the word line 52$b$ are the same as in (A) (the word line 52$b$ is operated in the same way as the word line 52$a$), and so their description is omitted here.

According to the above-mentioned control, when changing the (4n+3)th layer memory cell M3 to the low resistance state, the memory cell M3 can be changed to the low resistance state of a desired resistance value by current limitation in the source follower mode.

Figure 18F:
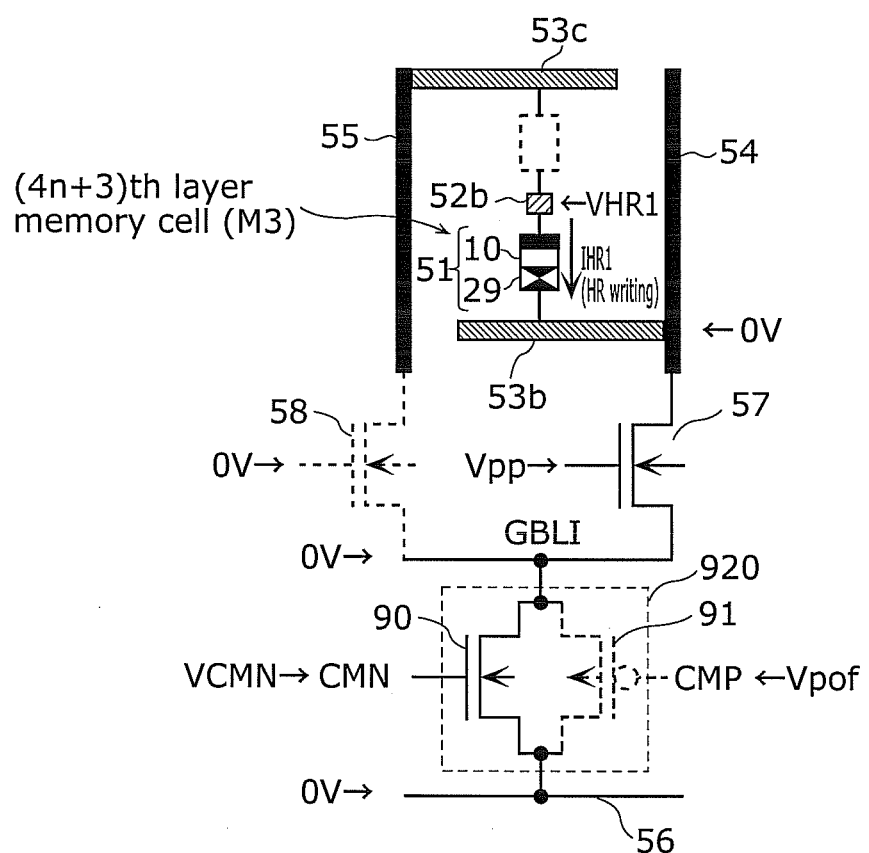
FIG. 18F is a diagram for describing a high resistance writing operation of the (4n+3)th layer memory cell in the source follower mode.

(F) Operation of Writing the Memory Cell M3 in the (4n+3)th Layer (n is a Natural Number) to the High Resistance State FIG. 18F is an equivalent circuit diagram showing an element connection structure from the global bit line 56 to the word line 52$b$ in the cross section diagram in FIG. 11, for describing an operation of writing the (4n+3)th layer memory cell M3 to the high resistance state.

The equivalent circuit diagram in FIG. 18F differs from the equivalent circuit diagram in FIG. 18B in the placement layer of the memory cell 51, the word line and the bit line related to the memory cell 51, and the bit line selection switch element for selecting the odd layer or even layer bit line, but the other parts are the same as in FIG. 18B. Accordingly, only the difference from FIG. 18B is described below.

Though the same structure as in FIG. 18E is used in FIG. 18F, a higher voltage is applied to the word line 52$b$ with respect to the global bit line 56, to cause a flow of a current in a direction from the word line 52$b$ to the bit line 53$b$.

When writing the memory cell M3 to the high resistance state, too, the sub-bit line selection circuit 73 applies an even layer bit line selection signal voltage of Vpp to the gate terminal of the even layer bit line selection switch element 57 to turn ON the even layer bit line selection switch element 57, and applies an odd layer bit line selection signal voltage of 0 V to the gate terminal of the odd layer bit line selection switch element 58 to turn OFF the odd layer bit line selection switch element 58 (the odd layer bit line selection switch element 58 is shown by dashed lines).

The operating conditions of the bidirectional current limiting circuit 920, the global bit line 56, and the word line 52$b$ are the same as in (B) (the word line 52$b$ is operated in the same way as the word line 52$a$), and so their description is omitted here.

According to the above-mentioned control, when changing the (4n+3)th layer memory cell M3 to the high resistance state, the memory cell M3 can be reliably changed to the high resistance state by causing a larger current than in low resistance writing to flow through the memory cell M3.

Figure 18G:
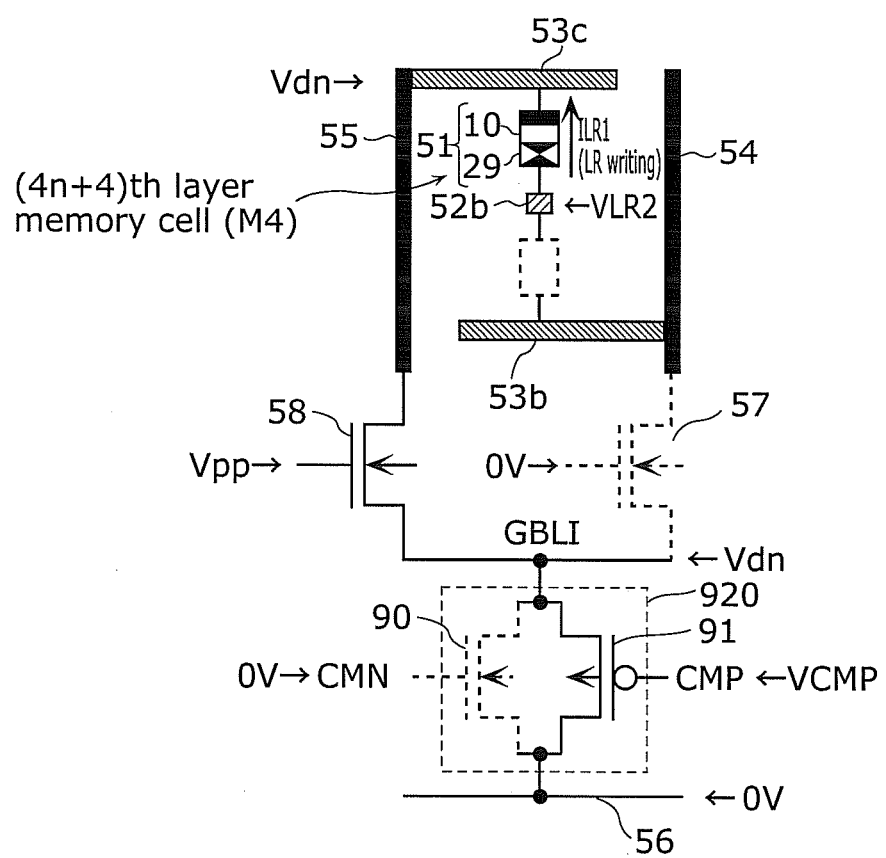
FIG. 18G is a diagram for describing a low resistance writing operation of a (4n+4)th layer memory cell in the source follower mode.

(G) Operation of Writing the Memory Cell M4 in the (4n+4)th Layer (n is a Natural Number) to the Low Resistance State FIG. 18G is an equivalent circuit diagram showing an element connection structure from the global bit line 56 to the word line 52$b$ in the cross section diagram in FIG. 11, for describing an operation of writing the (4n+4)th layer memory cell M4 to the low resistance state.

The equivalent circuit diagram in FIG. 18G differs from the equivalent circuit diagram in FIG. 18C in the placement layer of the memory cell 51, the word line and the bit line related to the memory cell 51, and the bit line selection switch element for selecting the odd layer or even layer bit line, but the other parts are the same as in FIG. 18C. Accordingly, only the difference from FIG. 18C is described below.

In FIG. 18G, reference numeral 51 is the selected memory cell M4 in the (4n+4)th layer, 58 is the odd layer bit line selection switch element including an NMOS transistor, 90 is the N-type current limiting element including an NMOS transistor, and 91 is the P-type current limiting element including a PMOS transistor.

The N-type current limiting element 90 and the P-type current limiting element 91 are connected in parallel with each other at their source and drain terminals, thereby constituting the bidirectional current limiting circuit 920. In this operation, a higher voltage is applied to the word line 52$b$ with respect to the global bit line 56 so that a current flows in a direction of the word line 52$b$→the selected memory cell 51→the bit line 53$c$→the odd layer bit line selection switch element 58→the bidirectional current limiting circuit 920→the global bit line 56.

When writing the memory cell M4 to the low resistance state, the sub-bit line selection circuit 73 applies an odd layer bit line selection signal voltage of Vpp to the gate terminal of the odd layer bit line selection switch element 58 to turn ON the odd layer bit line selection switch element 58, and applies an even layer bit line selection signal voltage of 0 V to the gate terminal of the even layer bit line selection switch element 57 to turn OFF the even layer bit line selection switch element 57 (the even layer bit line selection switch element 57 is shown by dashed lines).

The operating conditions of the bidirectional current limiting circuit 920, the global bit line 56, and the word line 52$b$ are the same as in (C) (the word line 52$b$ is operated in the same way as the word line 52$a$), and so their description is omitted here.

According to the above-mentioned control, when changing the (4n+4)th layer memory cell M4 to the low resistance state, the memory cell M4 can be changed to the low resistance state of a desired resistance value by current limitation in the source follower mode.

Figure 18H:
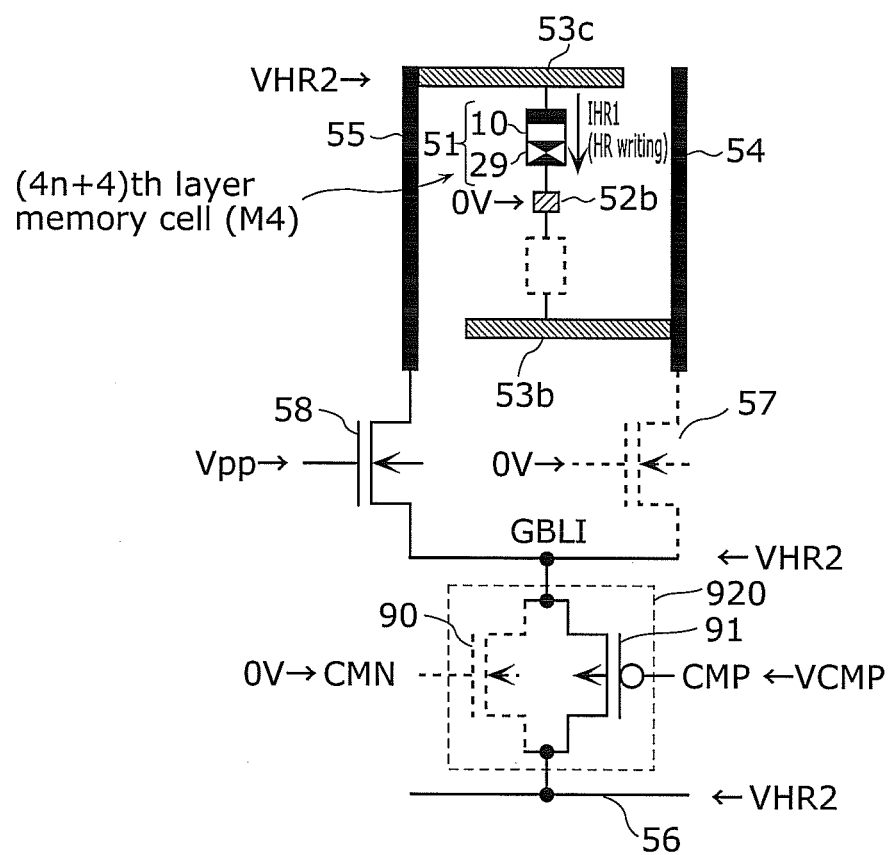
FIG. 18H is a diagram for describing a high resistance writing operation of the (4n+4)th layer memory cell in the source follower mode.

(H) Operation of Writing the Memory Cell M4 in the (4n+4)th Layer (n is a Natural Number) to the High Resistance State FIG. 18H is an equivalent circuit diagram showing an element connection structure from the global bit line 56 to the word line 52$b$ in the cross section diagram in FIG. 11, for describing an operation of writing the (4n+4)th layer memory cell M4 to the high resistance state.

The equivalent circuit diagram in FIG. 18H differs from the equivalent circuit diagram in FIG. 18D in the placement layer of the memory cell 51, the word line and the bit line related to the memory cell 51, and the bit line selection switch element for selecting the odd layer or even layer bit line, but the other parts are the same as in FIG. 18D. Accordingly, only the difference from FIG. 18D is described below.

Though the same structure as in FIG. 18G is used in FIG. 18H, a higher voltage is applied to the global bit line 56 with respect to the word line 52$b$, to cause a flow of a current in a direction from the bit line 53$c$ to the word line 52$b$.

When writing the memory cell M4 to the high resistance state, too, the sub-bit line selection circuit 73 applies an odd layer bit line selection signal voltage of Vpp to the gate terminal of the odd layer bit line selection switch element 58 to turn ON the odd layer bit line selection switch element 58 and applies an even layer bit line selection signal voltage of 0 V to the gate terminal of the even layer bit line selection switch element 57 to turn OFF the even layer bit line selection switch element 57 (the even layer bit line selection switch element 57 is shown by dashed lines).

The operating conditions of the bidirectional current limiting circuit 920, the global bit line 56, and the word line 52b are the same as in (D) (the word line 52b is operated in the same way as the word line 52a), and so their description is omitted here.

According to the above-mentioned control, when changing the (4n+4)th layer memory cell M4 to the high resistance state, the memory cell M4 can be reliably changed to the high resistance state by causing a larger current than in low resistance writing to flow through the memory cell M4.

Note that these operations are performed through selection of the memory cell layer, the word line, and the global bit line according to the address designated from outside.

Moreover, the writing to the low resistance state or the high resistance state is carried out by applying the above-mentioned voltages to the selected word line and the selected global bit line for a predetermined time (e.g. pulse drive of about 50 ns).

Besides, each unselected bit line other than the selected bit line and each unselected word line other than the selected word line may be set in a high impedance state, or a voltage may be applied to turn OFF a diode in each unselected memory cell.

As described above, in the source follower mode, when an odd layer memory cell is selected, the current limiting control circuit 99 controls the gate voltages of the N-type current limiting element 90 and the P-type current limiting element 91 so that one of the N-type current limiting element 90 and the P-type current limiting element 91 is ON and the other one of the N-type current limiting element 90 and the P-type current limiting element 91 is OFF (the N-type current limiting element 90 is ON in the above example). When an even layer memory cell is selected, on the other hand, the current limiting control circuit 99 controls the gate voltages of the N-type current limiting element 90 and the P-type current limiting element 91 so that the other one of the N-type current limiting element 90 and the P-type current limiting element 91 is ON and the one of the N-type current limiting element 90 and the P-type current limiting element 91 is OFF (the P-type current limiting element 91 is ON in the above example). Depending on whether the writing target memory cell is the odd layer memory cell or the even layer memory cell, the current limiting control circuit 99 turns ON only one of the N-type current limiting element 90 and the P-type current limiting element 91 that has a higher substrate bias effect in the case where the current for low resistance writing (flowing in a direction from the first variable resistance layer to the second variable resistance layer) flows between the selected global bit line and the selected word line through the NMOS transistor in the N-type current limiting element 90 and in the case where the current flows between the selected global bit line and the selected word line through the PMOS transistor in the P-type current limiting element 91. In this way, the memory cell is written to the low resistance state.

In the case of writing the memory cell to the low resistance state by voltage application that sets the voltage of the selected global bit line higher than the voltage of the selected word line (the case where the odd layer memory cell is selected and the second variable resistance layer is formed on the upper surface of the first variable resistance layer in the variable resistance element in the memory cell, in the above example), the current limiting control circuit 99 turns ON only the NMOS transistor in the N-type current limiting element 90. In the case of writing the memory cell to the low resistance state by voltage application that sets the voltage of the selected global bit line lower than the voltage of the selected word line (the case where the even layer memory cell is selected and the second variable resistance layer is formed on the upper surface of the first variable resistance layer in the variable resistance element in the memory cell, in the above example), the current limiting control circuit 99 turns ON only the PMOS transistor in the P-type current limiting element 91. In these operations of writing to the low resistance state, the current flowing through one of the N-type current limiting element 90 and the P-type current limiting element 91 in the case where the odd layer memory cell is selected and the current flowing through the other one of the N-type current limiting element 90 and the P-type current limiting element 91 in the case where the even layer memory cell is selected are opposite in current direction, and equal in absolute value within a predetermined range of variations. The predetermined range of variations is 10%, as an example.

The following method is used to adjust the limited current value. The current limiting control circuit 99 adjusts the gate voltage of the NMOS transistor in the N-type current limiting element 90 and the gate voltage of the PMOS transistor in the P-type current limiting element 91, so that the limited current value flowing through one of the N-type current limiting element 90 and the P-type current limiting element 91 which is a current limiting element capable of limiting the current flow in the direction of changing the memory cell to the low resistance state in the case where the odd layer memory cell is selected and the limited current value flowing through the other one of the N-type current limiting element 90 and the P-type current limiting element 91 which is a current limiting element capable of limiting the current flow in the direction of changing the memory cell to the low resistance state in the case where the even layer memory cell is selected are equal to each other. This makes it possible to reduce variations in resistance value between the even layer memory cell and the odd layer memory cell.

Moreover, depending on the writing target layer, the current limiting control circuit 99 applies the same voltage to the gate terminal of the N-type current limiting element 90 or the P-type current limiting element 91, both in the case of writing the writing target memory cell to the high resistance state and in the case of writing the writing target memory cell to the low resistance state. In detail, in the above example, when the even layer memory cell is selected, the current limiting control circuit 99 uniformly applies a first voltage (VCMP in the above example) to the gate terminal of the P-type current limiting element 91 in both cases (while applying 0 V to the gate terminal of the N-type current limiting element 90 to turn OFF the N-type current limiting element 90). When the odd layer memory cell is selected, the current limiting control circuit 99 uniformly applies a second voltage (VCMN in the above example) to the gate terminal of the N-type current limiting element 90 in both cases (while applying Vpof to the gate terminal of the P-type current limiting element 91 to turn OFF the P-type current limiting element 91).

In more detail, let VLR be the voltage applied across both ends of the memory cell when writing the memory cell to the low resistance state, and Vtn be the threshold voltage of the NMOS transistor in the N-type current limiting element 90. The current limiting control circuit 99 applies a voltage equal to or more than (Vtn+VLR) to the gate terminal of the N-type current limiting element 90, to turn ON the N-type current limiting element 90. On the other hand, the current limiting control circuit 99 applies 0 V to the gate terminal of the P-type current limiting element 91 (the limited current value when writing to the low resistance state is adjusted by the selected word line voltage VLR2), to turn ON the P-type current limiting element 91.

As described above, the source follower characteristics of the transistor in the bidirectional current limiting circuit 920 are used as the means of current limitation in low resistance writing, in such a manner that selectively switches between the NMOS transistor and the PMOS transistor constituting the bidirectional current limiting circuit 920 depending on whether the selected memory cell belongs to an odd layer or an even layer. Necessary conditions for writing the selected memory cell are summarized below.

[Necessary Conditions for Writing]

In the method according to Embodiment 1, writing to a predetermined memory cell layer is performed by respectively applying, to the PMOS transistor and the NMOS transistor constituting the bidirectional current limiting circuit 920, such gate voltages that turn ON one current limiting element out of the PMOS transistor and the NMOS transistor that is capable of a current limiting function in low resistance writing, as mentioned above.

Figure 19:
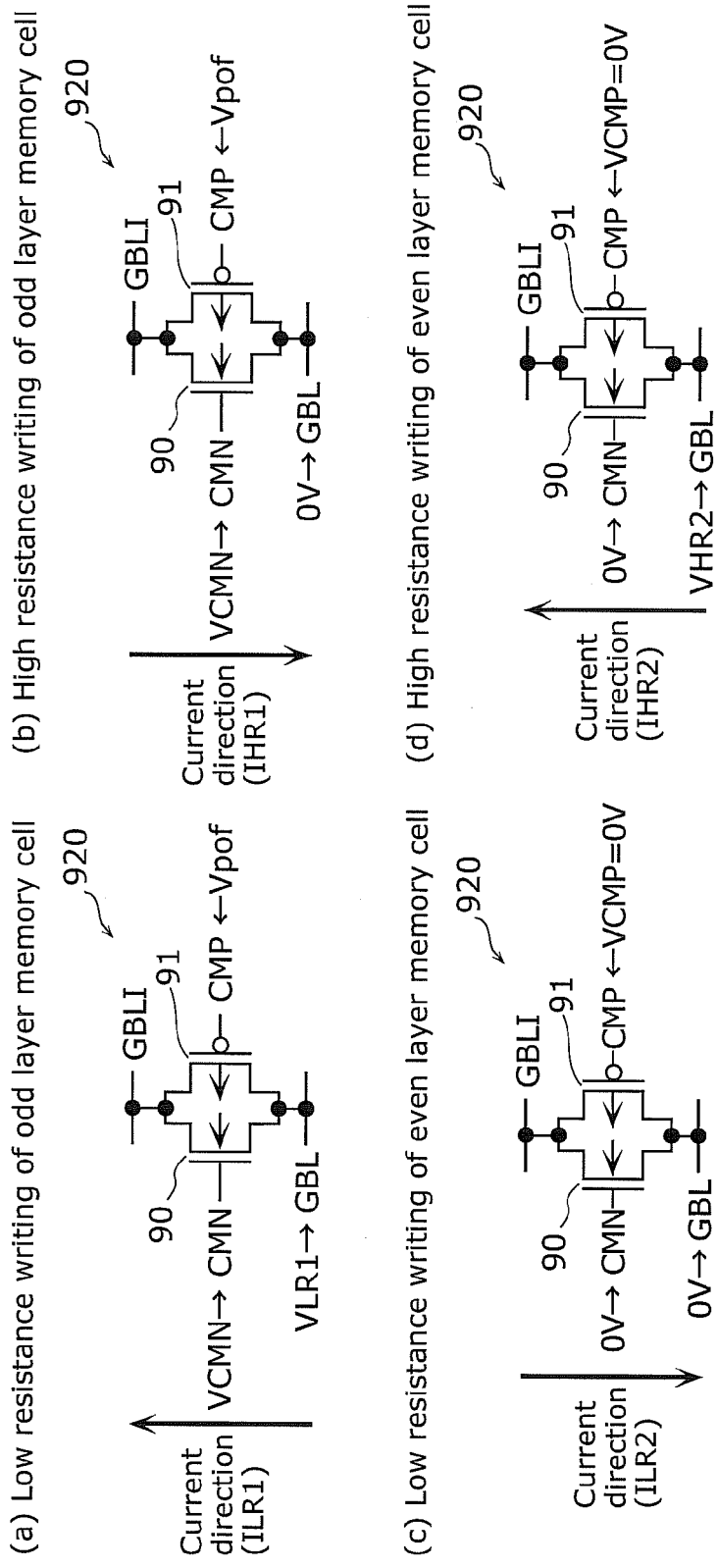
FIGS. 19(a) to 19(d) is a circuit diagram of a bidirectional current limiting circuit for describing a bias in low resistance writing of an odd layer memory cell, high resistance writing of an odd layer memory cell, low resistance writing of an even layer memory cell, and high resistance writing of an even layer memory cell in the source follower mode, respectively.

Necessary conditions for this are described in detail below, with reference to FIGS. 19(*a*) to 19(*d*) and 20(*a*) to 20(*d*). FIGS. 19(*a*) to 19(*d*) is a diagram additionally showing current-voltage states of the bidirectional current limiting circuit 920 in the diagram in FIG. 11. FIGS. 20(*a*) to 20(*d*) is an Ids-Vds characteristic diagram of the N-type current limiting element 90 and the P-type current limiting element 91. In FIGS. 20(*a*) to 20(*d*), the characteristics of the N-type current limiting element 90 are shown by dashed lines, and the characteristics of the P-type current limiting element 91 are shown by solid lines. FIGS. 19(*a*) and 20(*a*) show the state of low resistance writing of the odd layer memory cell, FIGS. 19(*b*) and 20(*b*) show the state of high resistance writing of the odd layer memory cell, FIGS. 19(*c*) and 20(*c*) show the state of low resistance writing of the even layer memory cell, and FIGS. 19(*d*) and 20(*d*) show the state of high resistance writing of the even layer memory cell. The following description is based on a premise that the variable resistance element has a structure in which the second variable resistance layer 12 is formed on the first variable resistance layer 13 as shown in FIG. 9.

Necessary conditions for writing to the odd layer memory cell are listed first. It is assumed that the gate voltages applied to the P-type current limiting element 91 and the N-type current limiting element 90 are the same in low resistance writing and in high resistance writing.

(Condition 1) In low resistance writing, the global bit line GBL is set to a higher voltage than the word line, and a current flows from the bit line 53*a* into the memory cell 51 (a current direction from the first variable resistance layer 13 to the second variable resistance layer 12 in the variable resistance element, see FIG. 18A) (FIG. 19(*a*)).

Here, the same VCMN is applied to the gate of the transistor in the bidirectional current limiting circuit 920, to turn ON the N-type current limiting element 90 that, as a result of an increase in source voltage, has a higher substrate bias effect and so has a higher transistor threshold voltage Vt. Hence, the N-type current limiting element 90 operates in the source follower mode, thereby creating a current limiting state (the current for low resistance writing is limited to ILR1 at point L in FIG. 20(*a*)).

(Condition 2) In both low resistance writing and high resistance writing (where the word line is set to a higher voltage than the global bit line GBL, and a current flows out of the memory cell 51 to the bit line 53*a* (a current direction from the second variable resistance layer 12 to the first variable resistance layer 13 in the variable resistance element, see FIG. 18B), the gate voltage VCMN is applied to the P-type current limiting element 91 to turn OFF the P-type current limiting element 91 (see FIGS. 19(*a*) and 19(*b*)). Low resistance writing and high resistance writing are both performed through only the N-type current limiting element 90. In high resistance writing, the current flows in the direction in which the substrate bias effect of the N-type current limiting element 90 is lower than in low resistance writing, so that a larger current can be caused to flow (point H (IHR1 (current for high resistance writing)>ILR1) in FIG. 20(*b*)).

Necessary conditions for writing to the even layer memory cell are listed next. Since the current directions in high resistance writing and low resistance writing are reversed from Conditions 1 to 2, the P-type current limiting element 91 and the N-type current limiting element 90 are interchanged in function.

(Condition 3) In low resistance writing, the word line is set to a higher voltage than the global bit line GBL, and a current flows out of the memory cell 51 to the bit line 53*b* (a current direction from the first variable resistance layer 13 to the second variable resistance layer 12 in the variable resistance element, see FIG. 18C).

Here, the same VCMP is applied to the gate of the transistor in the bidirectional current limiting circuit 920, to turn ON the P-type current limiting element 91 that, as a result of an increase in source voltage, has a higher substrate bias effect and so has a higher transistor threshold voltage Vt (FIG. 19(*c*)). Hence, the P-type current limiting element 91 operates in the source follower mode, thereby creating a current limiting state (the current for low resistance writing is limited to ILR2 at point L in FIG. 20(*c*)).

(Condition 4) In both low resistance writing and high resistance writing (where the global bit line GBL is set to a higher voltage than the word line, and a current flows from the bit line 53*b* into the memory cell 51 (a current direction from the second variable resistance layer 12 to the first variable resistance layer 13 in the variable resistance element, see FIG. 18D), the gate voltage VCMP (=0 V) is applied to the gate of the transistor in the bidirectional current limiting circuit 920 so that the N-type current limiting element 90 is turned OFF (see FIGS. 19(*c*) and 19(*d*)). Low resistance writing and high resistance writing are both performed through only the P-type current limiting element 91. In high resistance writing, the current flows in the direction in which the substrate bias effect of the P-type current limiting element 91 is lower than in low resistance writing, so that a larger current can be caused to flow (point H (IHR2 (current for high resistance writing) >ILR2) in FIG. 20(*d*)).

Further, the following condition is applied in order to reduce variations in resistance value between the odd layer memory cell and the even layer memory cell.

(Condition 5) The gate voltages, the write voltages, and the transistor sizes are adjusted so that the source follower current ILR1 of the N-type current limiting element 90 in Condition 1 and the source follower current ILR2 of the P-type current limiting element 91 in Condition 3 are equal.

The following describes a detailed design method for each condition.

(Regarding Condition 1)

FIG. 19(*a*) shows the voltage state of the bidirectional current limiting circuit 920 when performing low resistance writing on the odd layer memory cell. 0 V is applied to the selected word line 52*a* (see FIG. 18A), the current limiting voltage VCMN is applied to the node CMN connected to the gate terminal of the N-type current limiting element 90, and Vpof is applied to the node CMP connected to the gate terminal of the P-type current limiting element 91.

In this state, when the voltage VLR1 is applied to the global bit line GBL, the current ILR1 for low resistance writing flows through the memory cell, causing the voltage across both ends of the memory cell (i.e. the voltage between the selected word line and the intermediate node GBLI) to be equal to the voltage VLR for low resistance writing. Hence, the voltage of the intermediate node GBLI is substantially VLR. That is, the source of the N-type current limiting element 90 on the intermediate node GBLI side is VLR in voltage, and the drain of the N-type current limiting element 90 on the global bit line GBL side is VLR1 in voltage.

This being the case, since the NMOS transistor is in a state of being increased in source voltage, the threshold voltage of the NMOS transistor is Vtn' (>Vtn) which is higher than the threshold voltage Vtn in a normal state where the source voltage is 0 V.

Let Vgs be a gate voltage of a typical transistor, and Vt be a threshold voltage of the transistor. A condition for turning ON the transistor is $$Vgs > Vt.$$

Therefore, a condition for turning ON the N-type current limiting element 90 is $$VCMN - VLR > Vtn' \quad (1).$$

Moreover, a maximum current Imax that can be caused to flow through the typical transistor is $$Imax = \beta n/2 \times (Vgs - Vt)^2$$

when it reaches a saturation region (i.e. a source follower operation). Accordingly, the maximum current ILR1 that can be caused to flow through the NMOS transistor in the source follower operation is expressed as $$ILR1 = \beta n/2 \times (VCMN - VLR - Vtn')^2 \quad (2).$$

Here, $\beta n = W/L \times \mu n \times Cox$, where W denotes a channel width of the N-type current limiting element 90, L denotes a channel length of the N-type current limiting element 90, μn denotes an electron mobility, and Cox denotes an oxide film capacitance per unit area.

(Regarding Condition 2)

In the operating condition of Condition 1 (FIG. 19(*a*)), the source terminal of the P-type current limiting element 91 is on the global bit line GBL side that is higher in voltage. A condition for turning OFF the P-type current limiting element 91 is $$VCMN \geq VLR1 - |Vtp| \quad (3).$$

When performing high resistance writing on the odd layer memory cell, the applied voltage is reversed in direction from the state in Condition 1, so that the source and the drain of the N-type current limiting element 90 are replaced with each other. The N-type current limiting element 90 operates in a direction in which the substrate bias effect is lower, and has the normal threshold voltage Vtn (<Vtn').

In this case, the N-type current limiting element 90 is turned ON when VCMN>Vtn. Though the current flowing through the N-type current limiting element 90 depends on the voltage VHR1 for high resistance writing applied to the word line 52*a* (while the global bit line GBL is 0 V as shown in FIG. 19(*b*)), the current in the saturation region of the N-type current limiting element 90 can be caused to flow at the maximum (see FIG. 20(*b*)).

That is, $$IHR1 \leq \beta n/2 \times (VCMN - Vtn)^2 \quad (4).$$

Appropriately adjusting the voltage VHR1 for high resistance writing makes it possible to satisfy IHR1>ILR1.

(Regarding Condition 3)

Though the same method as in Condition 1 is employed, the P-type current limiting element 91 operates in the source follower mode instead of the N-type current limiting element 90 because the voltage direction is reversed.

FIG. 19(*c*) shows the voltage state of the bidirectional current limiting circuit 920 when performing low resistance writing on the even layer memory cell. VLR2 is applied to the selected word line 52*a* (see FIG. 18C), 0 V as an example of the current limiting voltage VCMP is applied to the node CMP connected to the gate terminal of the P-type current limiting element 91, and 0 V (=VCMP) as an example is applied to the node CMN connected to the gate terminal of the N-type current limiting element 90.

In this state, when 0 V is applied to the global bit line GBL, the current ILR2 for low resistance writing flows through the memory cell, causing the voltage across both ends of the memory cell (i.e. the voltage between the selected word line and the intermediate node GBLI) to be equal to the voltage VLR for low resistance writing. Hence, the voltage of the intermediate node GBLI is substantially (VLR2−VLR). That is, the source of the P-type current limiting element 91 on the intermediate node GBLI side is (VLR2−VLR) in voltage, and the drain of the P-type current limiting element 91 on the global bit line GBL side is 0 V in voltage.

This being the case, since the PMOS transistor is in a state of being decreased in source voltage, the threshold voltage of the PMOS transistor is |Vtp'| which is higher than the threshold voltage |Vtp| in a normal state (where the source voltage is VLR2, as an example).

A condition for turning ON the P-type current limiting element 91 is, from |Vgs|>|Vt|, $$VLR2 - VLR > |Vtp| \quad (5).$$

Moreover, the maximum current ILR2 that can be caused to flow through the PMOS transistor when it reaches the saturation region (i.e. in the source follower operation) is, from $I = \beta p/2 \times (|Vgs| - |Vtp|)^2$, expressed as $$ILR2 = \beta p/2 \times (VLR2 - VLR - |Vtp'|)^2 \quad (6).$$

Here, $\beta p = W/L \times \mu p \times Cox$, where W denotes a channel width of the P-type current limiting element 91, L denotes a channel length of the P-type current limiting element 91, μp denotes a hole mobility, and Cox denotes an oxide film capacitance per unit area.

(Regarding Condition 4)

In the operating condition of Condition 4, the source terminal of the N-type current limiting element 90 is on the global bit line GBL side that is lower in voltage. A condition for turning OFF the N-type current limiting element 90 is $$VCMP \leq |Vtn| \quad (7).$$

When performing high resistance writing, the applied voltage is reversed in direction from the state in Condition 3, so that the source and the drain of the P-type current limiting element 91 are replaced with each other. The P-type current limiting element 91 operates in a direction in which the substrate bias effect is lower, and has the normal threshold voltage Vtp (|Vtp|<|Vtp'|).

Let VHR2 be the voltage for high resistance writing applied to the global bit line GBL. The P-type current limiting element 91 is turned ON when $$VCMP < VHR2 - |Vtp|.$$

Though the current flowing through the P-type current limiting element 91 depends on the voltage VHR2 for high resistance writing, the current in the saturation region of the P-type current limiting element 91 can be caused to flow at the maximum.

That is, $$IHR2 \leq \beta p/2 \times (VHR2-VCMP-|Vtp|)^2.$$

When VCMP=0 V, $$IHR2 \leq \beta p/2 \times (VHR2-|Vtp|)^2 \qquad (8)$$

Appropriately adjusting the voltage VHR2 for high resistance writing makes it possible to satisfy IHR2>ILR2.

(Regarding Condition 5)

ILR1=ILR2 in Condition 5 can be written as $$\beta n/2 \times (VCMN-VLR-Vtn')^2 = \beta p/2 \times (VLR2-VLR-|Vtp'|)^2 \qquad (9)$$

from Expressions (2) and (6). This relation is satisfied by adjusting βn, βp, VCMN, and VLR2. Here, βn and βp are each a term proportional to a current drive capability of a transistor per unit length, where PMOS is typically about ½ in current drive capability of NMOS. Accordingly, by designing the transistor of the P-type current limiting element 91 to have the gate width (W) about twice the gate width of the transistor of the N-type current limiting element 90, in general only the magnitude relation between the squared terms in Expression (9) needs to be taken into consideration.

Besides, since the threshold voltages of NMOS and PMOS may be substantially equal in absolute value, the threshold voltages are set to be equal (Vtn'=|Vtp'|). As a result, the squared terms each relate to the relation of the gate voltage with respect to the source voltage. Therefore, by setting substantially the same relation for PMOS and NMOS, Expression (9) can be satisfied. That is, the following relational expression holds.

From VCMN−VLR=VLR2−VLR, $$VCMN=VLR2 \qquad (10).$$

Though the above describes the case where βn and βp or the thresholds of the PMOS transistor and the NMOS transistor are the same for the sake of simplicity, they may instead be set to different values.

The following describes an example.

FIG. 21 is a graph showing the set voltage ranges of the node CMP and the node CMN connected to the gate terminals, in Conditions 1 to 5 described above.

The following examines a situation where a condition that maximizes the current limit is set in each of the case where the odd layer memory cell is selected and the case where the even layer memory cell is selected in FIG. 21, as an example.

From (1), the voltage condition of the voltage VCMN applied to the node CMN is $$VCMN>VLR+Vtn'.$$

Meanwhile, the current flowing through the memory cell in low resistance writing is $$ILR1=\beta n/2 \times (VCMN-VLR-Vtn')^2$$

in Expression (2), and $$ILR2=\beta p/2 \times (VLR2-VLR-|Vtp'|)^2$$

in Expression (6). When the gate voltage VCMN=VLR1 is applied, Expression (2) is $$ILR1=\beta n/2 \times (VLR1-VLR-Vtn')^2 \qquad (11).$$

In the case where design is made such that βp=βn and Vtn=|Vtp| as mentioned earlier, by performing voltage control such that VLR1=VLR2, the drive currents of (i) and (ii) in FIG. 21 become equal to each other. Thus, the same resistance value can be set in the even layer and the odd layer.

When comparing Expressions (2) and (4), the threshold is Vtn'>Vtn, and the entry of Vgs is different. Hence, it is clear that $$VCMN>VCMN-VLR.$$

Accordingly, $$IHR1>ILR1.$$

When comparing Expressions (6) and (8), the threshold is |Vtp'|>|Vtp|, and the entry of Vgs is different. Hence, by setting VLR2 and VHR2 so that the relation $$VHR2>VLR2-VLR$$

holds, $$IHR2>ILR2$$

can be satisfied. Typically, VLR2=VHR2, so that IHR2>ILR2 can be achieved.

Thus, the current in high resistance writing is higher than the current in low resistance writing for both the odd layer and the even layer, indicating that Condition 5 is satisfied.

In FIG. 21, a voltage difference A (=VLR1−VLR) corresponds to a voltage drop due to an impedance between the source and the drain of the N-type current limiting element 90 when the voltage VLR1 for low resistance writing is applied to the global bit line GBL to cause the current ILR1 for low resistance writing to flow. A voltage difference B (=VLR2−VLR) corresponds to a voltage drop due to an impedance between the source and the drain of the P-type current limiting element 91 when the voltage VLR2 for low resistance writing is applied to the selected word line to cause the current ILR2 for low resistance writing to flow. This being so, the relation (VLR2−VLR<VLR<VLR1) can be satisfied by designing the transistor width W of each of the P-type current limiting element 91 and the N-type current limiting element 90 to an appropriate width or more so that the impedance of the transistor in low resistance writing is lower than the low resistance state of the memory cell (the impedance of the transistor is equal to or less than VLR/ILR1 or VLR/ILR2).

Table 2 shows set voltages of main signals in association with each of the operations of the memory cells M1 to M4 of the different layers.

TABLE 2

| | Writing to odd layer | | Writing to even layer | |
|---|---|---|---|---|
| | LR (A, E) | HR (B, F) | LR (C, G) | HR (D, H) |
| Gate voltage of odd layer bit line selection switch element 58 | Vpp (A) 0 V (E) | Vpp (B) 0 V (F) | 0 V (C) Vpp (G) | 0 V (D) Vpp (H) |
| Gate voltage of even layer bit line selection switch element 57 | 0 V (A) Vpp (E) | 0 V (B) Vpp (F) | Vpp (C) 0 V (G) | Vpp (D) 0 V (H) |
| Voltage of CMN | VCMN | | 0 V | |
| Voltage of CMP | | Vpof | VCMP = 0 V | |
| Global bit line | VLR1 | 0 V | 0 V | VHR2 |
| Selected word line | 0 V | VHR1 | VLR2 | 0 V |
| Drive current of N-type current limiting element 90 | βn/2 × (VCMN − VLR − Vtn')² | ≦ · βn/2 × (VCMN − Vtn)² | | 0 |
| Drive current of P-type current limiting element 91 | | 0 | βp/2 × (VLR2 − VLR − |Vtp'|)² | ≦ βp/2 × (VHR2 − |Vtp|)² |

The odd layer bit line selection switch element 58 and the even layer bit line selection switch element 57 each include an NMOS transistor in this embodiment. It is desirable to apply, as the gate voltage Vpp in the ON state, at least a voltage higher than (VHR2+Vtn) to the even layer bit line selection signal or the odd layer bit line selection signal, for a sufficient reduction in impedance when the N-type current limiting element 90 or the P-type current limiting element 91 functions as a current limiter.

Though the design methods of Conditions 1 to 5 are described above based on the operation principle, there are various variations in actual circuit operations. Accordingly, even when design is made such that βp=βn, for example, there is a possibility that the resistance value set in the even layer and the resistance value set in the odd layer do not exactly match. The conditions such as the equality relations described here have an acceptable error range of about 10% as with a typical variation tolerance, though depending on factors such as specifications of products envisioned.

Moreover, the voltages VCMP, VCMN, VLR1, VHR1, VLR2, and VHR2 designed based on these conditions may be subject to fine adjustment in a manufacturing stage by a trimming means typically known as a fuse programming circuit, to achieve more optimal states.

It is not desirable that a difference in characteristics between the odd layer bit line selection switch element 58 and the even layer bit line selection switch element 57 causes a difference in current limiting effect between when the first layer memory cell is selected and when the second layer memory cell is selected. Hence, the gate voltage of each bit line selection switch element may be set to be higher than at least the gate voltage VCMN of the N-type current limiting element 90, with a voltage stepped-up from the power voltage of the whole circuit or VCMN by about the threshold voltage being applied to each of the even layer bit line selection signal and the odd layer bit line selection signal.

As can be understood from the above description, the voltage applied to the global bit line or the word line needs to be at least equal to or more than a total sum of the write voltage of the variable resistance element, the threshold voltage VF of the diode element (a total sum of the write voltage and VF substantially corresponds to the voltage VLR or VHR for the resistance change of the memory cell 51), the threshold voltage of the even layer bit line selection switch element or the odd layer bit line selection switch element, and the threshold voltage Vtn or Vtp of the N-type current limiting element 90 or the P-type current limiting element 91. In the above example, a voltage of about 5 V is necessary as a voltage for driving the cross point memory.

As a result of the voltage settings described above, current limiting writing for setting the resistance value of the low resistance state can be stably performed for all layers.

Besides, the voltages of the node CMN and the node CMP are the same in low resistance writing and high resistance writing of the memory cell of the same layer (see Tables 1 to 2), and so low resistance writing and high resistance writing can be performed in the same manner merely by changing the voltages of the global bit line 56 and the selected word line 52 related to the selected memory cell.

Therefore, even in the case where low resistance writing and high resistance writing for the memory cell of the same layer are performed in a plurality of blocks in the memory cell array 200 at the same time, the same voltage values can be used for VCMN0 to VCMN15 and VCMP0 to VCMP15 supplied on a block-by-block basis as shown in FIG. 14. Since only one current limiting control circuit is required, simpler circuitry can be achieved. In addition, it is also possible to easily and quickly execute inverse writing methods such as a method whereby, in low resistance writing, high resistance writing is first performed to create the high resistance state and then low resistance writing is performed and a method whereby, in high resistance writing, low resistance writing is first performed to create the low resistance state and then high resistance writing is performed.

As described above, according to the present invention, a multilayer cross point memory capable of stably performing current limiting writing for setting the resistance value of the low resistance state for all layers can be realized in a nonvolatile memory device of a multilayer cross point memory structure in which cross point memory array layers of the same structure are stacked.

Embodiment 2

In Embodiment 1, in the operation of writing to the multilayer cross point nonvolatile memory device, only one transistor out of the N-type current limiting element 90 and the P-type current limiting element 91 that has a higher substrate bias effect in a direction in which a current for low resistance writing flows through the memory cell is activated depending on the writing target memory array layer to which the memory cell belongs, to thereby perform the low resistance writing operation. In such low resistance writing, the current flow is limited in the source follower operation mode (i.e. the source follower mode).

Embodiment 2 is based on the same structure in which the N-type current limiting element 90 and the P-type current limiting element 91 are included, but differs in control method. Depending on the writing target memory array layer, a desired gate voltage is applied to the gate terminal of each of the N-type current limiting element 90 and the P-type current limiting element 91 so that one current limiting element is used for low resistance writing and the other current limiting element is used for high resistance writing. In this case, when causing the current in the low resistance writing direction to flow through the memory cell of the writing target layer, a transistor out of the N-type current limiting element 90 and the P-type current limiting element 91 that has a lower substrate bias effect is activated to perform the low resistance writing operation. An operation mode (saturation current limiting mode) in which an appropriate gate voltage is set to limit the current flow so that this transistor operates in a saturation region is described here. When causing the current in the high resistance writing direction to flow, a transistor out of the N-type current limiting element 90 and the P-type current limiting element 91 that is different from the one in low resistance writing is used in a sufficient ON state.

In this mode, a voltage generation circuit for applying a desired gate voltage to the current limiting circuit is further included.

[Description of Operating Voltage Setting]

In the saturation current limiting mode, the nonvolatile memory device has the same structure as above, so that eight types of operation states (A') to (H') are assumed as in the above embodiment.

Table 3 shows set voltages of main signals in the diagram of the basic structure shown in FIG. 11, in association with each of the operations of the memory cells M1 to M4 of the different layers. In the table, "(ON: SAT)" means that the current limiting element is current-limited in the saturation region.

TABLE 3

|  | Writing to M1 | | Writing to M2 | | Writing to M3 | | Writing to M4 | |
| --- | --- | --- | --- | --- | --- | --- | --- | --- |
|  | LR (A') | HR (B') | LR (C') | HR (D') | LR (E') | HR(F') | LR (G') | HR (H') |
| Gate voltage of odd layer bit line selection switch element 58 | Vpp (ON) | Vpp (ON) | 0 V (OFF) | 0 V (OFF) | 0 V (OFF) | 0 V (OFF) | Vpp (ON) | Vpp (ON) |
| Gate voltage of even layer bit line selection switch element 57 | 0 V (OFF) | 0 V (OFF) | Vpp (ON) | Vpp (ON) | Vpp (ON) | Vpp (ON) | 0 V (OFF) | 0 V (OFF) |
| Voltage of CMN | Vnsn (OFF) | Vnsn (ON) | VCMN (ON: SAT) | VCMN (OFF) | Vnsn (OFF) | Vnsn (ON) | VCMN (ON: SAT) | VCMN (OFF) |
| Voltage of CMP | VCMP (ON: SAT) | VCMP (OFF) | Vnsp (OFF) | Vnsp (ON) | VCMP (ON: SAT) | VCMP (OFF) | Vnsp (OFF) | Vnsp (ON) |
| Global bit line | VLR3 | 0 V | 0 V | VHR4 | VLR3 | 0 V | 0 V | VHR4 |
| Selected word line | 0 V | VHR3 | VLR4 | 0 V | 0 V | VHR3 | VLR4 | 0 V |

The following describes examples of writing the memory cells 51 included in the first to fourth layer memory cells 51*a* to 51*d* as designated by M1 to M4 in FIG. 11, with reference to FIGS. 22A to 22H.

In this method, only one of the N-type current limiting element 90 and the P-type current limiting element 91 is turned ON, depending on whether to perform low resistance writing or high resistance writing on the memory cell of the same layer. That is, in the case of the current direction for writing to the low resistance state, one of the N-type current limiting element 90 and the P-type current limiting element 91 is set to an ON state of being current-limited by predetermined saturation region characteristics. In the case of the current direction for writing to the high resistance state, the other one of the N-type current limiting element 90 and the P-type current limiting element 91 is set to a sufficient ON state.

Figure 22A:
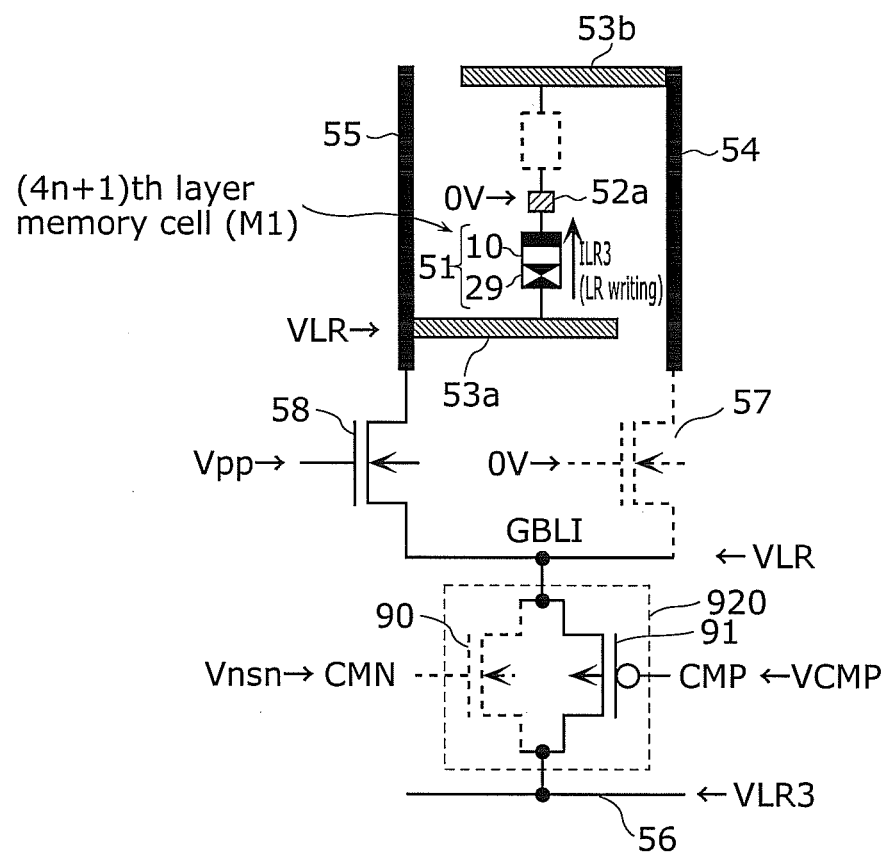
FIG. 22A is a diagram for describing a low resistance writing operation of the (4n+1)th layer memory cell in the saturation current limiting mode.

(A') Operation of Writing the Memory Cell M1 in the (4n+1)th Layer (n is a Natural Number) to the Low Resistance State FIG. 22A is an equivalent circuit diagram showing an element connection structure from the global bit line 56 to the word line 52*a* in the cross section diagram in FIG. 11, for describing an operation of writing the (4n+1)th layer memory cell M1 to the low resistance state.

In FIG. 22A, reference numeral 51 is the selected memory cell M1 in the (4n+1)th layer, 57 is the even layer bit line selection switch element including an NMOS transistor, 58 is the odd layer bit line selection switch element including an NMOS transistor, 90 is the N-type current limiting element including an NMOS transistor, and 91 is the P-type current limiting element including a PMOS transistor. The N-type current limiting element 90 and the P-type current limiting element 91 are connected in parallel with each other at their source and drain terminals, thereby constituting the bidirectional current limiting circuit 920. In the low resistance writing operation, a voltage VLR3 equal to or more than the voltage VLR required for low resistance writing is applied to the global bit line 56 with respect to the word line 52*a* so that a current flows in a direction of the global bit line 56→the bidirectional current limiting circuit 920→the odd layer bit line selection switch element 58→the bit line 53*a*→the selected memory cell 51→the word line 52*a*.

When writing the memory cell M1 to the low resistance state, the sub-bit line selection circuit 73 applies an odd layer bit line selection signal voltage of Vpp to the gate terminal of the odd layer bit line selection switch element 58 to turn ON the odd layer bit line selection switch element 58, and applies an even layer bit line selection signal voltage of 0 V to the gate terminal of the even layer bit line selection switch element 57 to turn OFF the even layer bit line selection switch element 57 (the even layer bit line selection switch element 57 is shown by dashed lines). Here, Vpp is a voltage that is sufficiently higher than the threshold voltage of the odd layer bit line selection switch element 58, and is stepped-up to be equal to or more than the power voltage Vcc.

In this case, the current limiting control circuit 99 applies a predetermined voltage Vnsn to the node CMN connected to the gate terminal of the N-type current limiting element 90, to turn OFF the N-type current limiting element 90. The current limiting control circuit 99 also applies the voltage VCMP that limits the current flowing through the selected memory cell 51 to a predetermined current ILR3 to the node CMP connected to the gate terminal of the P-type current limiting element 91, to set the P-type current limiting element 91 to an ON state of being current-limited to a predetermined current value. The word line decoder and driver circuit 74 applies 0 V (reference voltage) to the word line 52*a* connected to the selected memory cell 51, and the global bit line decoder and driver circuit 98 applies the voltage VLR3 to the global bit line 56 so that the voltage applied to the selected memory cell 51 is equal to or more than the voltage VLR required for low resistance writing, thereby causing the current ILR3 to flow in a direction in which the selected memory cell 51 changes to the low resistance state.

Here, the P-type current limiting element 91 including a PMOS transistor operates in the saturation current region. In the case where the gate voltage VCMP of the P-type current limiting element 91 is a predetermined constant potential lower than the voltage VLR3 of the global bit line 56 by the threshold |Vtp| of the P-type current limiting element 91, the P-type current limiting element 91 can function as a constant current source.

That is, by setting the gate voltage VCMP of the P-type current limiting element 91 to an appropriate value with respect to the voltage VLR3 of the global bit line 56, a current limited to the predetermined current ILR3 for low resistance writing can be caused to flow through the selected memory cell 51 in a direction from the bit line 53a to the word line 52a to perform low resistance writing, enabling the memory cell 51 to be set to the low resistance state of a predetermined resistance value. According to the above-mentioned control, when changing the (4n+1)th layer memory cell M1 to the low resistance state, the memory cell M1 can be changed to the desired low resistance state by limiting the current for low resistance writing in the saturation current limiting mode.

Figure 22B:
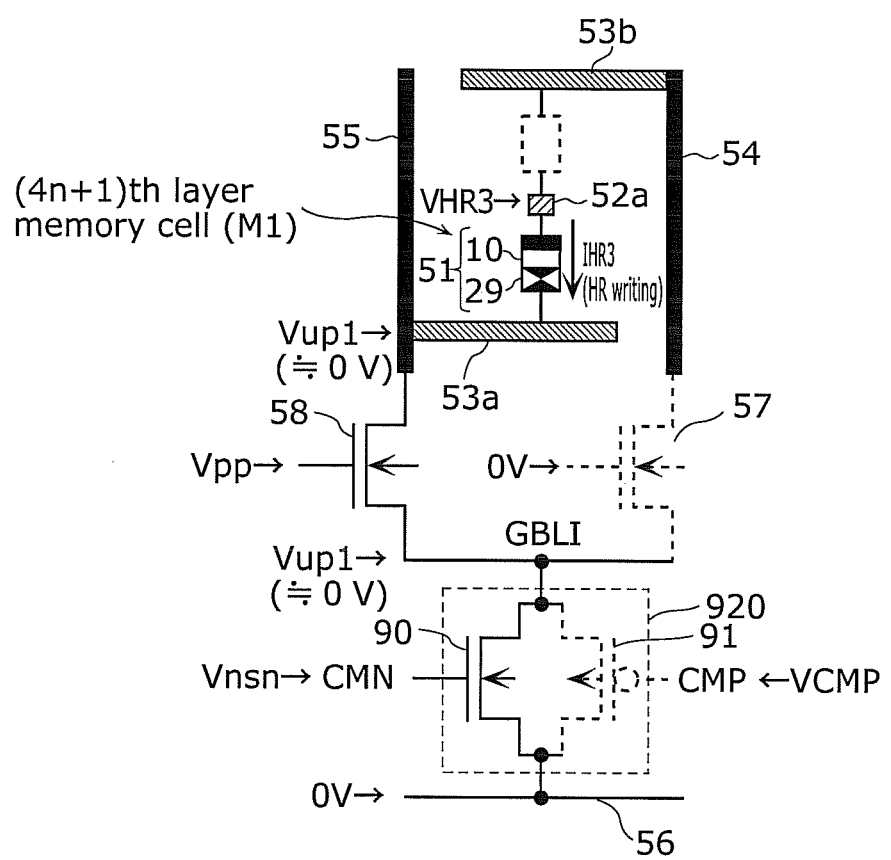
FIG. 22B is a diagram for describing a high resistance writing operation of the (4n+1)th layer memory cell in the saturation current limiting mode.

(B') Operation of Writing the Memory Cell M1 in the (4n+1)th Layer (n is a Natural Number) to the High Resistance State FIG. 22B is an equivalent circuit diagram showing an element connection structure from the global bit line 56 to the word line 52a in the cross section diagram in FIG. 11, for describing an operation of writing the (4n+1)th layer memory cell M1 to the high resistance state. Though the same structure as in FIG. 22A is used here, a higher voltage VHR3 is applied to the word line 52a with respect to the global bit line 56, to cause a flow of a current in a direction from the word line 52a to the bit line 53a.

When writing the selected memory cell M1 to the high resistance state, too, the sub-bit line selection circuit 73 applies an odd layer bit line selection signal voltage of Vpp to the gate terminal of the odd layer bit line selection switch element 58 to turn ON the odd layer bit line selection switch element 58, and applies an even layer bit line selection signal voltage of 0 V to the gate terminal of the even layer bit line selection switch element 57 to turn OFF the even layer bit line selection switch element 57.

In this case, the current limiting control circuit 99 applies the predetermined voltage VCMP (the same VCMP as applied in (A')) to the node CMP connected to the gate terminal of the P-type current limiting element 91, to turn OFF the P-type current limiting element 91. The current limiting control circuit 99 also applies the gate voltage Vnsn (the same Vnsn as applied in (A')) for sufficiently turning ON the N-type current limiting element 90 to the node CMN connected to the gate terminal of the N-type current limiting element 90, to turn ON the N-type current limiting element 90.

The global bit line decoder and driver circuit 98 applies 0 V (reference voltage) to the global bit line 56, and the word line decoder and driver circuit 74 applies the voltage VHR3 to the word line 52a so that the voltage across both ends of the selected memory cell 51 is equal to or more than the voltage VHR required for high resistance writing, thereby causing a flow of a current in a direction in which the selected memory cell 51 changes to the high resistance state.

Here, the current limiting control circuit 99 applies the same voltage Vnsn as in low resistance writing to the node CMN connected to the gate terminal of the N-type current limiting element 90, to turn ON the N-type current limiting element 90.

In this state, the source of the N-type current limiting element 90 including an NMOS transistor is on the side of the contact with the global bit line 56 set to 0 V. Such an N-type current limiting element 90 has a low substrate bias effect, and also the gate voltage Vnsn of the N-type current limiting element 90 is sufficiently higher than the threshold voltage Vtn of the NMOS transistor. Accordingly, the N-type current limiting element 90 can function as a bit line selection switch element having a current drive capability of causing the current IHR3 for high resistance writing, which is higher than the limited current value ILR3 in low resistance writing, to flow. This causes a potential of the first layer bit line 53a and the common contact GBLI to be a voltage obtained by adding a voltage drop (substantially 0 V) in the N-type current limiting element 90 to the voltage (0 V) of the global bit line 56, i.e. a voltage Vup1 which is substantially 0 V.

That is, by merely setting the voltage required for high resistance writing of the selected memory cell 51 to the selected word line 52a while setting the gate voltage Vnsn of the N-type current limiting element 90 to the same value as in low resistance writing, a larger current than in low resistance writing can be caused to flow through the selected memory cell 51, ensuring that the selected memory cell 51 is written to the high resistance state. According to the above-mentioned control, when changing the (4n+1)th layer memory cell M1 to the high resistance state, the memory cell M1 can be reliably changed to the high resistance state by causing a larger current than in low resistance writing to flow through the memory cell M1

As is clear from (A') and (B'), in both low resistance writing and high resistance writing, the gate voltage of the N-type current limiting element 90 is Vnsn and the gate voltage of the P-type current limiting element 91 is VCMP in the bidirectional current limiting circuit 920. Thus, each gate voltage is unchanged even though the resistance change writing direction is different. The resistance change writing direction is controlled simply by setting the applied voltages of the global bit line GBL 56 and the word line 52a. In detail, in low resistance writing, 0 V is applied to the word line 52a and VLR3 is applied to the global bit line GBL 56, and the N-type current limiting element 90 is turned OFF and the P-type current limiting element 91 is set to a current-limited ON state. In high resistance writing, VHR3 is applied to the word line 52a and 0 V is applied to the global bit line GBL 56, and the N-type current limiting element 90 is turned ON and the P-type current limiting element 91 is turned OFF. This is a two-transistor switching mode in which the P-type current limiting element 91 is used in low resistance writing and the N-type current limiting element 90 is used in high resistance writing.

Thus, by using the same gate voltage of the current limiting element in high resistance writing and low resistance writing, a time required for changing the gate voltage can be saved, with it being possible to achieve a faster operation.

Figure 22C:
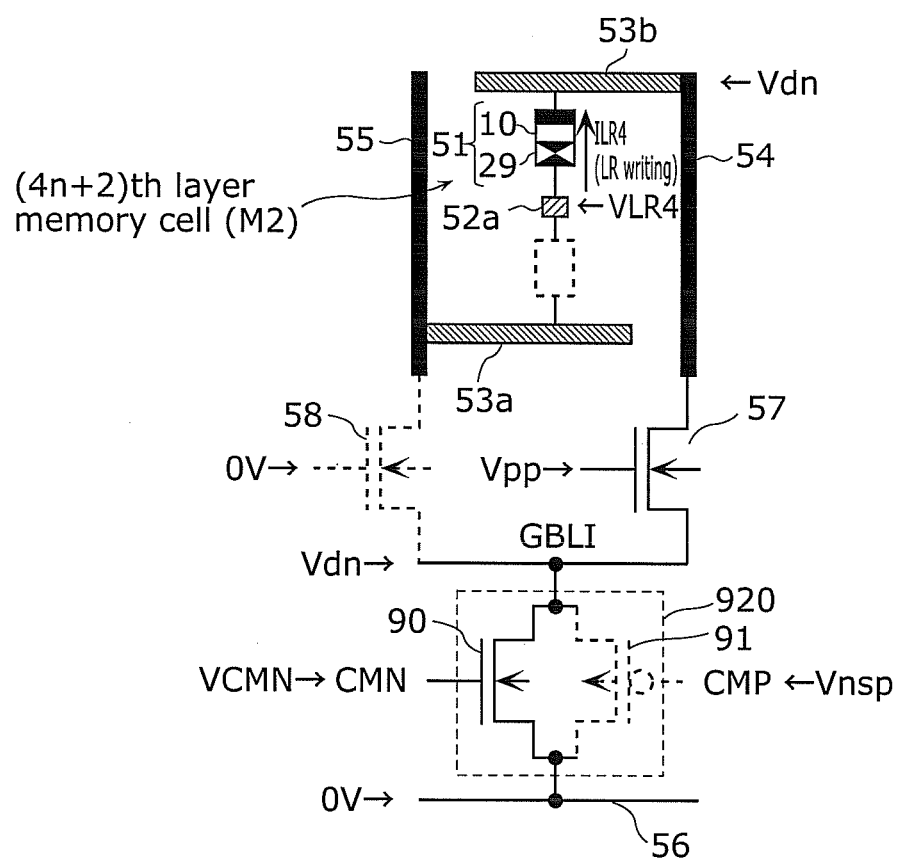
FIG. 22C is a diagram for describing a low resistance writing operation of the (4n+2)th layer memory cell in the saturation current limiting mode.

(C') Operation of Writing the Memory Cell M2 in the (4n+2)th Layer (n is a Natural Number) to the Low Resistance State FIG. 22C is an equivalent circuit diagram showing an element connection structure from the global bit line 56 to the word line 52a in the cross section diagram in FIG. 11, for describing an operation of writing the (4n+2)th layer memory cell M2 to the low resistance state.

In FIG. 22C, reference numeral 51 is the selected memory cell M2 in the (4n+2)th layer, 57 is the even layer bit line selection switch element including an NMOS transistor, 58 is the odd layer bit line selection switch element including an NMOS transistor, 90 is the N-type current limiting element including an NMOS transistor, and 91 is the P-type current limiting element including a PMOS transistor. The N-type current limiting element 90 and the P-type current limiting element 91 are connected in parallel with each other at their source and drain terminals, thereby constituting the bidirectional current limiting circuit 920. In this operation, a higher voltage VLR4 is applied to the word line 52a with respect to the global bit line 56 so that a current flows in a direction of the word line 52a→the selected memory cell 51→the bit line 53b→the even layer bit line selection switch element 57→the bidirectional current limiting circuit 920→the global bit line 56.

When writing the memory cell M2 to the low resistance state, the sub-bit line selection circuit 73 applies an even layer bit line selection signal voltage of Vpp to the gate terminal of the even layer bit line selection switch element 57 to turn ON the even layer bit line selection switch element 57, and applies an odd layer bit line selection signal voltage of 0 V to the gate terminal of the odd layer bit line selection switch element 58 to turn OFF the odd layer bit line selection switch element 58. Here, Vpp is a voltage that is sufficiently higher than the threshold voltage of the even layer bit line selection switch element 57, and is stepped-up to be equal to or more than the power voltage Vcc.

In this case, the current limiting control circuit 99 applies a predetermined voltage Vnsp to the node CMP connected to the gate terminal of the P-type current limiting element 91, to turn OFF the P-type current limiting element 91. The current limiting control circuit 99 also applies the voltage VCMN that limits the current flowing through the selected memory cell 51 to a predetermined current ILR4 to the node CMN connected to the gate terminal of the N-type current limiting element 90, to set the N-type current limiting element 90 to a predetermined ON state of being current-limited. The word line decoder and driver circuit 74 applies a voltage VLR4 to the word line 52a connected to the selected memory cell 51 so that the voltage across the selected memory cell 51 is equal to or more than the voltage VLR required for low resistance writing, and the global bit line decoder and driver circuit 98 applies 0 V (reference voltage) to the global bit line 56, thereby causing a flow of a current in a direction in which the selected memory cell 51 changes to the low resistance state.

Here, the N-type current limiting element 90 including an NMOS transistor operates in the saturation current region. In the case where the gate voltage VCMN of the N-type current limiting element 90 is a predetermined constant potential higher than the voltage (0 V) of the global bit line 56 by the threshold Vtn of the N-type current limiting element 90, the N-type current limiting element 90 can function as a constant current source.

That is, by setting the gate voltage VCMN of the N-type current limiting element 90 to an appropriate value with respect to the voltage (0 V) of the global bit line 56, a current limited to the predetermined current ILR4 can be caused to flow through the selected memory cell 51 in a direction from the word line 52a to the bit line 53b to perform low resistance writing, enabling the memory cell 51 to be set to the predetermined low resistance state. According to the above-mentioned control, when changing the (4n+2)th layer memory cell M2 to the low resistance state, the memory cell M2 can be changed to the desired low resistance state by limiting the current flow in the saturation current limiting mode.

The predetermined current ILR4 is set to be equal to the predetermined current ILR3 when writing the (4n+1)th memory cell to the low resistance state as described in (A'), by adjusting the gate voltages VCMN and VCMP and the transistor sizes of the N-type current limiting element 90 and the P-type current limiting element 91.

Figure 22D:
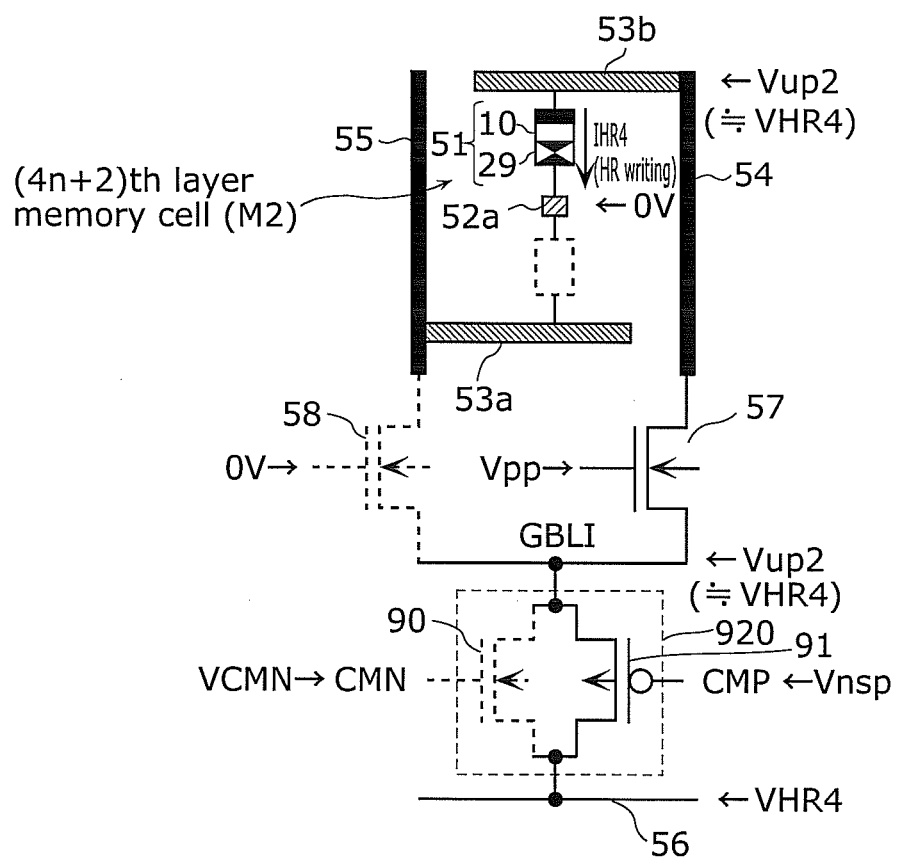
FIG. 22D is a diagram for describing a high resistance writing operation of the (4n+2)th layer memory cell in the saturation current limiting mode.

(D') Operation of Writing the Memory Cell M2 in the (4n+2)th Layer (n is a Natural Number) to the High Resistance State FIG. 22D is an equivalent circuit diagram showing an element connection structure from the global bit line 56 to the word line 52a in the cross section diagram in FIG. 11, for describing an operation of writing the (4n+2)th layer memory cell M2 to the high resistance state. Though the same structure as in FIG. 22C is used here, a higher voltage VHR4 is applied to the global bit line 56 with respect to the word line 52a, to cause a flow of a current in a direction from the bit line 53b to the word line 52a.

When writing the selected memory cell M2 to the high resistance state, too, the sub-bit line selection circuit 73 applies an even layer bit line selection signal voltage of Vpp to the gate terminal of the even layer bit line selection switch element 57 to turn ON the even layer bit line selection switch element 57, and applies an odd layer bit line selection signal voltage of 0 V to the gate terminal of the odd layer bit line selection switch element 58 to turn OFF the odd layer bit line selection switch element 58.

In this case, the current limiting control circuit 99 applies the predetermined voltage VCMN to the node CMN connected to the gate terminal of the N-type current limiting element 90, to turn OFF the N-type current limiting element 90. The current limiting control circuit 99 also applies the gate voltage Vnsp to the node CMP connected to the gate terminal of the P-type current limiting element 91, to turn ON the P-type current limiting element 91.

The word line decoder and driver circuit 74 applies 0 V (reference voltage) to the word line 52a, and the global bit line decoder and driver circuit 98 applies the voltage VHR4 to the global bit line 56 so that the voltage across both ends of the selected memory cell 51 is equal to or more than the voltage VHR required for high resistance writing, thereby causing a flow of a current IHR4 in a direction in which the selected memory cell 51 changes to the high resistance state.

Here, the current limiting control circuit 99 applies the same voltage Vnsp as in low resistance writing to the node CMP connected to the gate terminal of the P-type current limiting element 91, to turn ON the P-type current limiting element 91.

In this state, the source of the P-type current limiting element 91 including a PMOS transistor is on the side of the contact with the global bit line 56 set to VHR4. Such a P-type current limiting element 91 has a low substrate bias effect, and also the source-to-gate voltage (VHR4−Vnsp) of the P-type current limiting element 91 is sufficiently higher than the threshold voltage Vt of the PMOS transistor. Accordingly, the P-type current limiting element 91 can function as a bit line selection switch element having a current drive capability of causing the current IHR4 for high resistance writing, which is higher than the limited current value ILR4 in low resistance writing, to flow. This causes a potential of the second layer bit line 53b and the common contact GBLI to be a voltage obtained by subtracting a voltage drop (substantially 0 V) in the P-type current limiting element 91 from the voltage VHR4 of the global bit line 56, i.e. a voltage Vup2 which is substantially the same potential as the voltage VHR4.

That is, by merely setting the voltage required for high resistance writing of the selected memory cell 51 to the global bit line 56 while setting the gate voltage Vnsp of the P-type current limiting element 91 to the same value as in low resistance writing, a larger current than in low resistance writing can be caused to flow through the selected memory cell 51, ensuring that the selected memory cell 51 is written to the high resistance state. According to the above-mentioned control, when changing the (4n+2)th layer memory cell M2 to the high resistance state, the memory cell M2 can be reliably changed to the high resistance state by causing a larger current than in low resistance writing to flow through the memory cell M2.

As is clear from (C') and (D'), in both low resistance writing and high resistance writing, the gate voltage of the N-type current limiting element 90 is VCMN and the gate voltage of the P-type current limiting element 91 is Vnsp in the bidirectional current limiting circuit 920. Thus, each gate voltage is unchanged even though the resistance change writing direction is different. The resistance change writing direction is controlled simply by setting the applied voltages of the global bit line GBL 56 and the word line 52a. In detail, in low resistance writing, VLR4 is applied to the word line 52a and 0 V is applied to the global bit line GBL 56, and the N-type current limiting element 90 is set to a current-limited ON state and the P-type current limiting element 91 is turned OFF. In high resistance writing, 0 V is applied to the word line 52a and VHR4 is applied to the global bit line GBL 56, and the N-type current limiting element 90 is turned OFF and the P-type current limiting element 91 is turned ON. This is a two-transistor switching mode in which the N-type current limiting element 90 is used in low resistance writing and the P-type current limiting element 91 is used in high resistance writing.

Thus, by using the same gate voltage of the current limiting element in high resistance writing and low resistance writing, a time required for changing the gate voltage can be saved, with it being possible to achieve a faster operation.

Figure 22E:
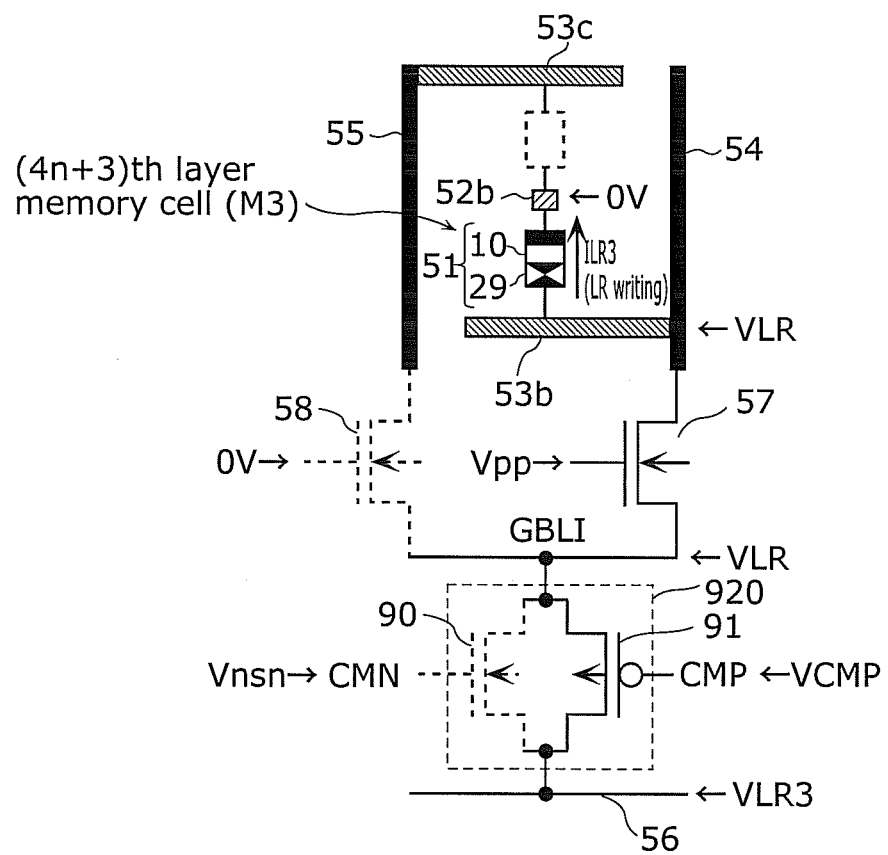
FIG. 22E is a diagram for describing a low resistance writing operation of the (4n+3)th layer memory cell in the saturation current limiting mode.

(E') Operation of Writing the Memory Cell M3 in the (4n+3)th Layer (n is a Natural Number) to the Low Resistance State FIG. 22E is an equivalent circuit diagram showing an element connection structure from the global bit line 56 to the word line 52b in the cross section diagram in FIG. 11, for describing an operation of writing the (4n+3)th layer memory cell M3 to the low resistance state.

The equivalent circuit diagram in FIG. 22E differs from the equivalent circuit diagram in FIG. 22A in the placement layer of the memory cell 51, the word line and the bit line related to the memory cell 51, and the bit line selection switch element for selecting the odd layer or even layer bit line, but the other parts are the same as in FIG. 22A. Accordingly, only the difference from FIG. 22A is described below.

In FIG. 22E, reference numeral 51 is the selected memory cell M3 in the (4n+3)th layer, 57 is the even layer bit line selection switch element including an NMOS transistor, 90 is the N-type current limiting element including an NMOS transistor, and 91 is the P-type current limiting element including a PMOS transistor.

The N-type current limiting element 90 and the P-type current limiting element 91 are connected in parallel with each other at their source and drain terminals, thereby constituting the bidirectional current limiting circuit 920. In this operation, the higher voltage VLR3 is applied to the global bit line 56 with respect to the word line 52b so that a current flows in a direction of the global bit line 56→the bidirectional current limiting circuit 920→the even layer bit line selection switch element 57→the bit line 53b→the selected memory cell 51→the word line 52b.

When writing the memory cell M3 to the low resistance state, the sub-bit line selection circuit 73 applies an even layer bit line selection signal voltage of Vpp to the gate terminal of the even layer bit line selection switch element 57 to turn ON the even layer bit line selection switch element 57, and applies an odd layer bit line selection signal voltage of 0 V to the gate terminal of the odd layer bit line selection switch element 58 to turn OFF the odd layer bit line selection switch element 58. Here, Vpp is a voltage that is sufficiently higher than the threshold voltage of the even layer bit line selection switch element 57, and is stepped-up to be equal to or more than the power voltage Vcc.

The operating conditions of the bidirectional current limiting circuit 920, the global bit line 56, and the word line 52b are the same as in (A') (the word line 52b is operated in the same way as the word line 52a), and so their description is omitted here.

According to the above-mentioned control, when changing the (4n+3)th layer memory cell M3 to the low resistance state, the memory cell M3 can be changed to the desired low resistance state by limiting the current flow in the saturation current limiting mode.

Figure 22F:
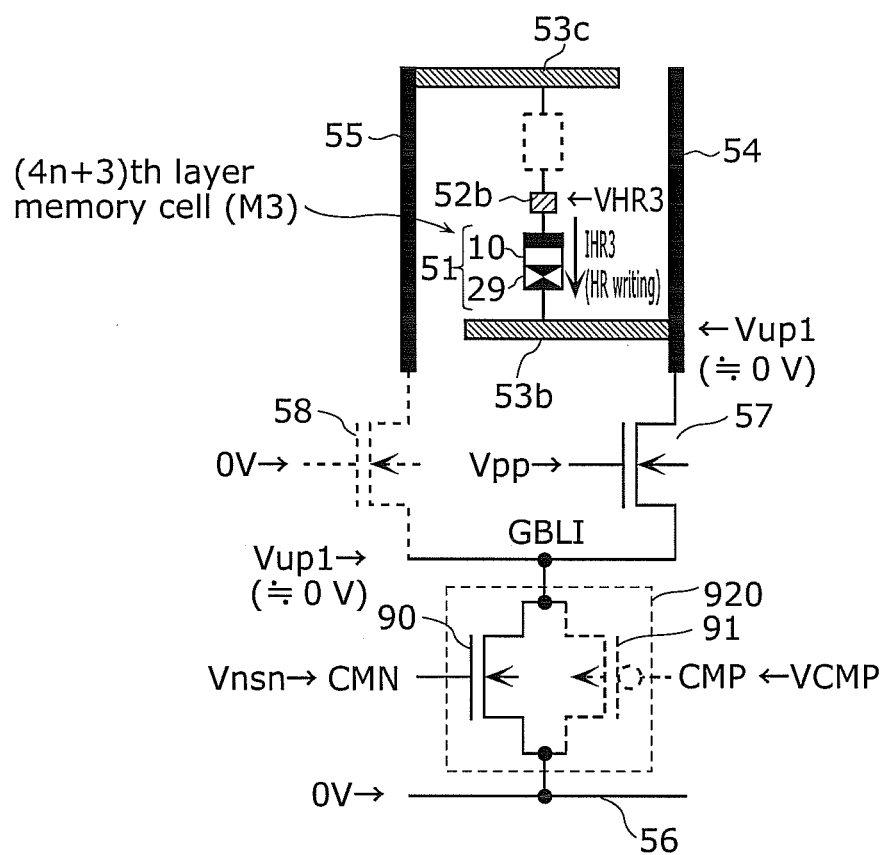
FIG. 22F is a diagram for describing a high resistance writing operation of the (4n+3)th layer memory cell in the saturation current limiting mode.

(F') Operation of Writing the Memory Cell M3 in the (4n+3)th Layer (n is a Natural Number) to the High Resistance State FIG. 22F is an equivalent circuit diagram showing an element connection structure from the global bit line 56 to the word line 52b in the cross section diagram in FIG. 11, for describing an operation of writing the (4n+3)th layer memory cell M3 to the high resistance state.

The equivalent circuit diagram in FIG. 22F differs from the equivalent circuit diagram in FIG. 22B in the placement layer of the memory cell 51, the word line and the bit line related to the memory cell 51, and the bit line selection switch element for selecting the odd layer or even layer bit line, but the other parts are the same as in FIG. 22B. Accordingly, only the difference from FIG. 22B is described below.

Though the same structure as in FIG. 22E is used in FIG. 22F, the higher voltage VHR3 is applied to the word line 52b with respect to the global bit line 56, to cause a flow of the current IHR3 in a direction from the word line 52b to the bit line 53b.

When writing the memory cell M3 to the high resistance state, too, the sub-bit line selection circuit 73 applies an even layer bit line selection signal voltage of Vpp to the gate terminal of the even layer bit line selection switch element 57 to turn ON the even layer bit line selection switch element 57, and applies an odd layer bit line selection signal voltage of 0 V to the gate terminal of the odd layer bit line selection switch element 58 to turn OFF the odd layer bit line selection switch element 58.

The operating conditions of the bidirectional current limiting circuit 920, the global bit line 56, and the word line 52b are the same as in (B') (the word line 52b is operated in the same way as the word line 52a), and so their description is omitted here.

According to the above-mentioned control, when changing the (4n+3)th layer memory cell M3 to the high resistance state, the memory cell M3 can be reliably changed to the high resistance state by causing the larger current IHR3 (>ILR3) than in low resistance writing to flow through the memory cell M3.

Figure 22G:
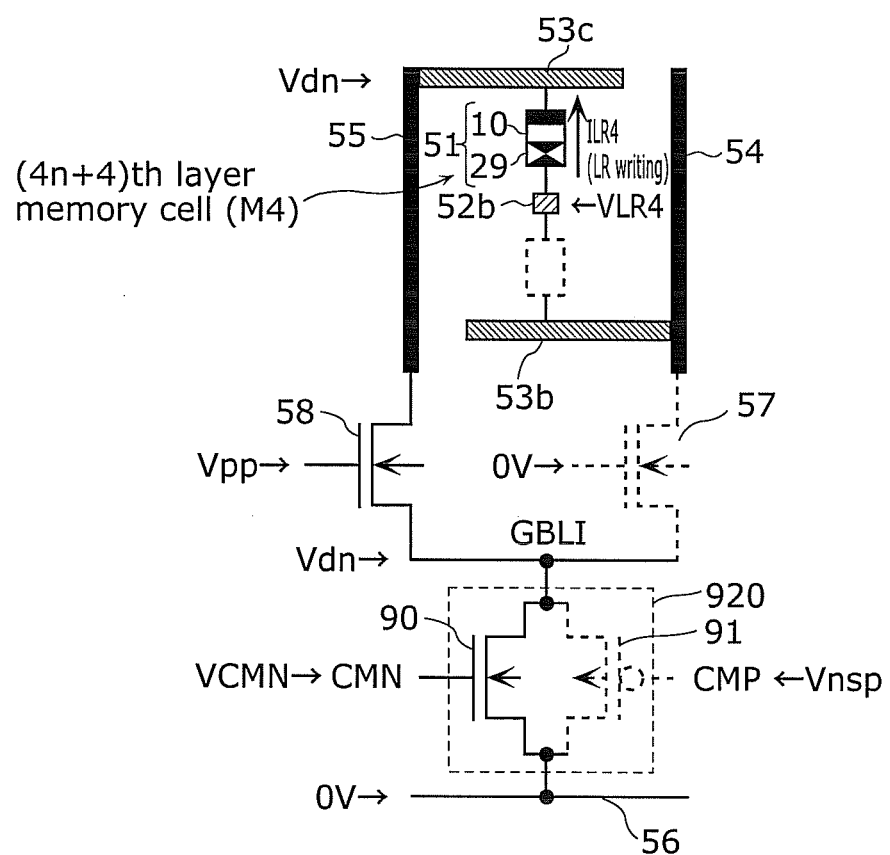
FIG. 22G is a diagram for describing a low resistance writing operation of the (4n+4)th layer memory cell in the saturation current limiting mode.

(G') Operation of Writing the Memory Cell M4 in the (4n+4)th Layer (n is a Natural Number) to the Low Resistance State FIG. 22G is an equivalent circuit diagram showing an element connection structure from the global bit line 56 to the word line 52b in the cross section diagram in FIG. 11, for describing an operation of writing the (4n+4)th layer memory cell M4 to the low resistance state.

The equivalent circuit diagram in FIG. 22G differs from the equivalent circuit diagram in FIG. 22C in the placement layer of the memory cell 51, the word line and the bit line related to the memory cell 51, and the bit line selection switch element for selecting the odd layer or even layer bit line, but the other parts are the same as in FIG. 22C. Accordingly, only the difference from FIG. 22C is described below.

In FIG. 22G, reference numeral 51 is the selected memory cell M4 in the (4n+4)th layer, 58 is the odd layer bit line selection switch element including an NMOS transistor, 90 is the N-type current limiting element including an NMOS transistor, and 91 is the P-type current limiting element including a PMOS transistor.

The N-type current limiting element 90 and the P-type current limiting element 91 are connected in parallel with each other at their source and drain terminals, thereby constituting the bidirectional current limiting circuit 920. In this operation, the higher voltage VLR4 is applied to the word line 52*b* with respect to the global bit line 56 so that a current flows in a direction of the word line 52*b*→the selected memory cell 51→the bit line 53*c*→the odd layer bit line selection switch element 58→the bidirectional current limiting circuit 920→the global bit line 56.

When writing the memory cell M4 to the low resistance state, the sub-bit line selection circuit 73 applies an odd layer bit line selection signal voltage of Vpp to the gate terminal of the odd layer bit line selection switch element 58 to turn ON the odd layer bit line selection switch element 58, and applies an even layer bit line selection signal voltage of 0 V to the gate terminal of the even layer bit line selection switch element 57 to turn OFF the even layer bit line selection switch element 57 (the even layer bit line selection switch element 57 is shown by dashed lines).

The operating conditions of the bidirectional current limiting circuit 920, the global bit line 56, and the word line 52*b* are the same as in (C') (the word line 52*b* is operated in the same way as the word line 52*a*), and so their description is omitted here.

According to the above-mentioned control, when changing the (4n+4)th layer memory cell M4 to the low resistance state, the memory cell M4 can be changed to the desired low resistance state by limiting the current flow in the saturation current limiting mode.

Figure 22H:
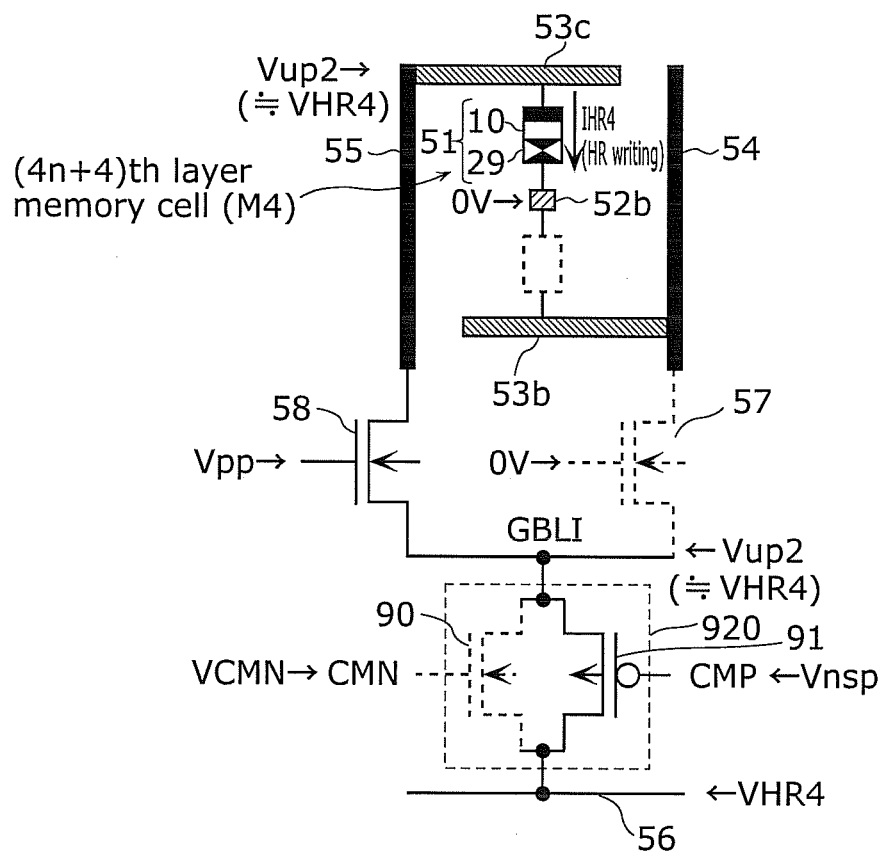
FIG. 22H is a diagram for describing a high resistance writing operation of the (4n+4)th layer memory cell in the saturation current limiting mode.

(H') Operation of Writing the Memory Cell M4 in the (4n+4)th Layer (n is a Natural Number) to the High Resistance State FIG. 22H is an equivalent circuit diagram showing an element connection structure from the global bit line 56 to the word line 52*b* in the cross section diagram in FIG. 11, for describing an operation of writing the (4n+4)th layer memory cell M4 to the high resistance state.

The equivalent circuit diagram in FIG. 22H differs from the equivalent circuit diagram in FIG. 22D in the placement layer of the memory cell 51, the word line and the bit line related to the memory cell 51, and the bit line selection switch element for selecting the odd layer or even layer bit line, but the other parts are the same as in FIG. 22D. Accordingly, only the difference from FIG. 22D is described below.

Though the same structure as in FIG. 22G is used in FIG. 22H, a higher voltage is applied to the global bit line 56 with respect to the word line 52*b*, to cause a flow of a current in a direction from the bit line 53*c* to the word line 52*b*.

When writing the memory cell M4 to the high resistance state, too, the sub-bit line selection circuit 73 applies an odd layer bit line selection signal voltage of Vpp to the gate terminal of the odd layer bit line selection switch element 58 to turn ON the odd layer bit line selection switch element 58, and applies an even layer bit line selection signal voltage of 0 V to the gate terminal of the even layer bit line selection switch element 57 to turn OFF the even layer bit line selection switch element 57.

The operating conditions of the bidirectional current limiting circuit 920, the global bit line 56, and the word line 52*b* are the same as in (D') (the word line 52*b* is operated in the same way as the word line 52*a*), and so their description is omitted here.

According to the above-mentioned control, when changing the (4n+4)th layer memory cell M4 to the high resistance state, the memory cell M4 can be reliably changed to the high resistance state by causing the larger current IHR4 (>ILR4) than in low resistance writing to flow through the memory cell M4.

Note that these operations are performed through selection of the memory cell layer, the word line, and the global bit line according to the address designated from outside.

Moreover, the writing to the low resistance state or the high resistance state is carried out by applying the above-mentioned voltages to the selected word line and the selected global bit line for a predetermined time (e.g. pulse drive of about 50 ns).

Besides, each unselected bit line other than the selected bit line and each unselected word line other than the selected word line may be set in a high impedance state, or a voltage may be applied to turn OFF a diode in each unselected memory cell.

As described above, in the saturation current limiting mode, the current limiting control circuit 99: applies, in the case where the even layer memory cell is selected, a first voltage to the gate terminal of the N-type current limiting element 90 and a second voltage to the gate terminal of the P-type current limiting element 91, and applies, in the case where the odd layer memory cell is selected, a third voltage to the gate terminal of the N-type current limiting element 90 and a fourth voltage to the gate terminal of the P-type current limiting element 91.

Moreover, (1) in the case of writing the even layer memory cell to the low resistance state, the current limiting control circuit 99 applies the first voltage and the second voltage respectively to the gate terminal of the N-type current limiting element 90 and the gate terminal of the P-type current limiting element 91 so that one of the N-type current limiting element 90 and the P-type current limiting element 91 that has a lower substrate bias effect in the case where a current for writing flows between the selected global bit line and the selected word line through the NMOS transistor in the N-type current limiting element 90 and in the case where the current flows between the selected global bit line and the selected word line through the PMOS transistor in the P-type current limiting element 91 is ON and the other one of the N-type current limiting element 90 and the P-type current limiting element 91 is OFF. (2) In the case of writing the even layer memory cell to the high resistance state, the current limiting control circuit 99 applies the first voltage and the second voltage respectively to the gate terminal of the N-type current limiting element 90 and the gate terminal of the P-type current limiting element 91 so that a current for writing flows between the selected global bit line and the selected word line in an opposite direction to the current for low resistance writing and the other one of the N-type current limiting element 90 and the P-type current limiting element 91, which is OFF in low resistance writing, is ON. (3) In the case of writing the odd layer memory cell to the low resistance state, the current limiting control circuit 99 applies the third voltage and the fourth voltage respectively to the gate terminal of the N-type current limiting element 90 and the gate terminal of the P-type current limiting element 91 so that one of the N-type current limiting element 90 and the P-type current limiting element 91 that has a lower substrate bias effect in the case where a current for writing flows between the selected global bit line and the selected word line through the NMOS transistor in the N-type current limiting element 90 and in the case where the current flows between the selected global bit line and the selected word line through the PMOS transistor in the P-type current limiting element 91 is ON and the other one of the N-type current limiting element 90 and the P-type current limiting element 91 is OFF. (4) In the case of writing the odd layer memory cell to the high resistance state, the current limiting control circuit 99 applies the third voltage and the fourth voltage respectively to the gate terminal of the N-type current limiting element 90 and the gate terminal of the P-type current limiting element 91 so that a current for writing flows between the selected global bit line and the selected word line in an opposite direction to the current for low resistance writing and the other one of the N-type current limiting element 90 and the P-type current limiting element 91, which is OFF in low resistance writing, is ON.

In more detail, the odd layer memory cell is written to the low resistance state as follows. A voltage applied across both ends of the memory cell when writing the memory cell to the low resistance state is denoted as VLR. In the case of writing the memory cell to the low resistance state by applying a higher voltage to the selected global bit line than the selected word line where a voltage difference between the selected global bit line and the selected word line is VLR3, the current limiting control circuit 99: turns ON the P-type current limiting element 91 in a current limiting state, by applying a voltage VCMP that satisfies $$VLR-|Vtp| \leq VCMP < VLR3-|Vtp|$$

to the gate terminal of the PMOS transistor in the P-type current limiting element 91 where Vtp is a threshold voltage of the PMOS transistor; and turns OFF the N-type current limiting element 90, by applying a voltage Vnsn that satisfies $$Vtn \leq Vnsn \leq VLR+Vtn$$

to the gate terminal of the NMOS transistor in the N-type current limiting element 90 where Vtn is a threshold voltage of the NMOS transistor. On the other hand, the even layer memory cell is written to the low resistance state as follows. A voltage applied across both ends of the memory cell when writing the memory cell to the low resistance state is denoted as VLR. In the case of writing the memory cell to the low resistance state by applying a lower voltage to the selected global bit line than the selected word line where a voltage difference between the selected global bit line and the selected word line is VLR4, the current limiting control circuit 99: turns ON the N-type current limiting element 90 in a current limiting state, by applying a voltage VCMN that satisfies $$Vtn \leq VCMN \leq VLR4-VLR+Vtn$$

to the gate terminal of the NMOS transistor in the N-type current limiting element 90 where Vtn is a threshold voltage of the NMOS transistor; and turns OFF the P-type current limiting element 91, by applying a voltage Vnsp that satisfies $$VLR4-VLR-|Vtp| \leq Vnsp \leq VHR4-|Vtp|$$

to the gate terminal of the PMOS transistor in the P-type current limiting element 91 where Vtp is a threshold voltage of the PMOS transistor.

Here, in the low resistance writing, the current limiting control circuit 99 applies the voltage VCMN to the gate terminal of the NMOS transistor when writing the even layer memory cell to the low resistance state and the voltage VCMP to the gate terminal of the PMOS transistor when writing the odd layer memory cell to the low resistance state, so that a current flowing between the global bit line and the word line when the P-type current limiting element 91 is ON in the case of writing the odd layer memory cell to the low resistance state and a current flowing between the global bit line and the word line when the N-type current limiting element 90 is ON in the case of writing the even layer memory cell to the low resistance state are opposite in current direction (the direction of the current flowing in the memory cell is the same), and equal in absolute value within a predetermined range of variations. The predetermined range of variations is 10%, as an example. Moreover, for the writing target layer, the current limiting control circuit 99 applies the same voltages to the gate terminals of the N-type current limiting element 90 and the P-type current limiting element 91, in the case of writing the writing target memory cell to the high resistance state and in the case of writing the writing target memory cell to the low resistance state.

[Necessary Conditions for Writing]

In the method according to Embodiment 2, writing to a predetermined memory cell layer is performed by applying such gate voltages that enable both the P-type current limiting element 91 and the N-type current limiting element 90 to be turned ON (i.e. such gate potentials that do not cause both current limiting elements to be simultaneously turned ON, but enable each current limiting element to be turned ON depending on the source potential of the current limiting element), as mentioned above.

Figure 23:
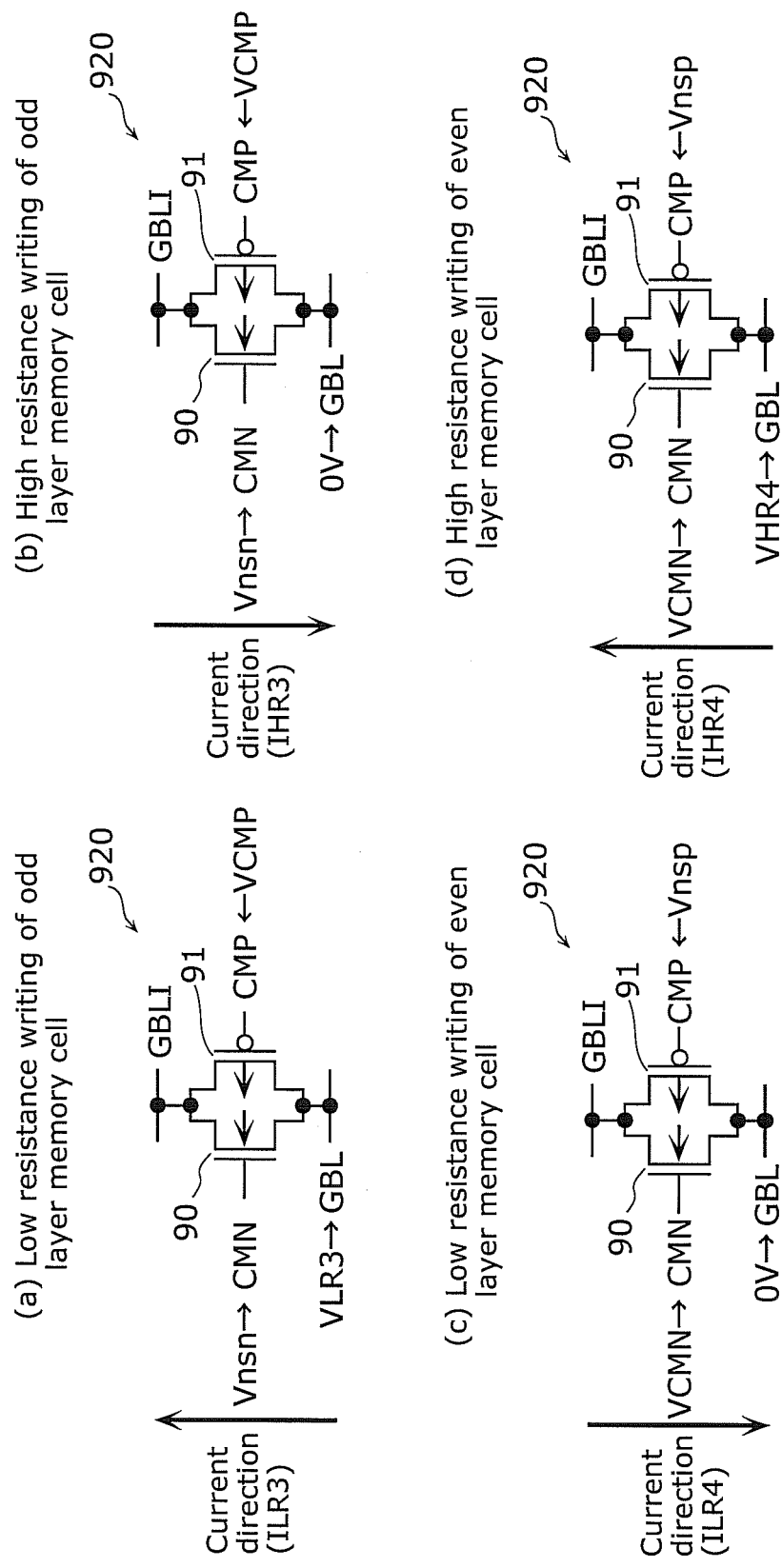
FIGS. 23(a) to 23(d) is a circuit diagram of the bidirectional current limiting circuit for describing a bias in low resistance writing of an odd layer memory cell, high resistance writing of an odd layer memory cell, low resistance writing of an even layer memory cell, and high resistance writing of an even layer memory cell in the saturation current limiting mode, respectively.

Necessary conditions for this are described in detail below, with reference to FIGS. 23(a) to 23(d) and 24(a) to 24(d). FIGS. 23(a) to 23(d) is a diagram additionally showing current-voltage states of the bidirectional current limiting circuit 920 in the diagram in FIG. 11. FIGS. 24(a) to 24(d) is a current-voltage characteristic diagram of the N-type current limiting element 90 and the P-type current limiting element 91 between GBLI and GBL. FIGS. 23(a) and 24(a) show the state of low resistance writing of the odd layer memory cell, FIGS. 23(b) and 24(b) show the state of high resistance writing of the odd layer memory cell, FIGS. 23(c) and 24(c) show the state of low resistance writing of the even layer memory cell, and FIGS. 23(d) and 24(d) show the state of high resistance writing of the even layer memory cell.

In FIG. 24, "(N)" represents characteristics of the N-type current limiting element 90, and "(P)" represents characteristics of the P-type current limiting element 91.

Necessary conditions for writing to the odd layer memory cell are listed first. Note that the gate voltages applied to the P-type current limiting element 91 and the N-type current limiting element 90 are the same in low resistance writing and high resistance writing.

(Condition 1) In low resistance writing, the global bit line GBL is set to a higher voltage than the word line (the voltage between the global bit line GBL and the word line is VLR3), and the current ILR3 flows from the bit line related to the memory cell 51 into the memory cell 51 (FIGS. 22A, 22E, and 23(a)).

In this case, the P-type current limiting element 91 having a lower substrate bias effect is turned ON, and put in a state of operating in the saturation region (point L (current ILR3) in FIG. 24(a)). Here, the gate voltage of the P-type current limiting element 91 is VCMP.

(Condition 2) In Condition 1, the N-type current limiting element 90 is turned OFF by a substrate bias effect (FIG. 24(a)). Here, the gate voltage of the N-type current limiting element 90 is Vnsn.

(Condition 3) In high resistance writing, the word line is set to a higher voltage than the global bit line GBL (the voltage between the word line and the global bit line GBL is VHR3), and the current IHR3 flows out of the memory cell 51 to the bit line related to the memory cell 51 (point H (current IHR3) in FIG. 24(b)).

In this case, the N-type current limiting element 90 changes to ON (the gate voltage is kept at Vnsn). The drive current at this time is larger than the drive current of the P-type current limiting element 91 in Condition 1 (IHR3>ILR3). Here, the gate voltage of the P-type current limiting element 91 is VCMP, and the P-type current limiting element 91 may be either ON or OFF (OFF in the example of FIG. 24(b)).

Necessary conditions for writing to the even layer memory cell are listed next. Since the current directions in high resistance writing and low resistance writing are reversed from Conditions 1 to 3, the P-type current limiting element 91 and the N-type current limiting element 90 are interchanged in function.

(Condition 4) In low resistance writing, the word line is set to a higher voltage than the global bit line GBL (the voltage between the word line and the global bit line GBL is VLR4), and the current ILR4 flows out of the memory cell 51 to the bit line related to the memory cell 51 (FIG. 23(c)).

In this case, the N-type current limiting element 90 having a lower substrate bias effect is turned ON, and put in a state of operating in the saturation region (point L (current ILR4) in FIG. 24(c)). Here, the gate voltage of the N-type current limiting element 90 is VCMN.

(Condition 5) In Condition 4, the P-type current limiting element 91 is turned OFF by a substrate bias effect (FIG. 24(c)). Here, the gate voltage of the P-type current limiting element 91 is Vnsp.

(Condition 6) In high resistance writing, the global bit line GBL is set to a higher voltage than the word line (the voltage between the global bit line GBL and the word line is VHR4), and the current IHR4 flows from the bit line related to the memory cell 51 into the memory cell 51 (point H (current IHR4) in FIG. 24(d)).

In this case, the P-type current limiting element 91 changes to ON (the gate voltage is kept at Vnsp). The drive current at this time is larger than the drive current of the N-type current limiting element 90 in Condition 4 (IHR4>ILR4). Here, the N-type current limiting element 90 may be either ON or OFF (OFF in the example of FIG. 24(d)).

Further, the following condition is applied in order to reduce variations in resistance value between the odd layer memory cell and the even layer memory cell.

(Condition 7) The saturation current of the P-type current limiting circuit 91 in Condition 1 and the saturation current of the N-type current limiting circuit 90 in Condition 4 are equal (ILR3=ILR4).

The gate voltages, the write voltages, the transistor sizes, and the like are adjusted to satisfy Conditions 1 to 7. The following describes a detailed design method for each condition.

(Regarding Condition 1)

FIG. 23(a) shows the voltage state of the bidirectional current limiting circuit 920 when performing low resistance writing on the odd layer memory cell. 0 V is applied to the selected word line 52a or 52b (not shown), the current limiting voltage VCMP is applied to the node CMP connected to the gate terminal of the P-type current limiting element 91, and the predetermined voltage Vnsn is applied to the node CMN connected to the gate terminal of the N-type current limiting element 90. Meanwhile, Vpp is applied to the gate of one of the even layer bit line selection switch element 57 and the odd layer bit line selection switch element 58 that corresponds to the selected memory cell to turn ON the bit line selection switch element, and 0 V is applied to the gate of the other bit line selection switch element to turn OFF the bit line selection switch element (not shown).

In this state, the voltage VLR3 is applied to the global bit line GBL so that the voltage across both ends of the memory cell (i.e. the voltage between the selected word line and the intermediate node GBLI) corresponds to the voltage VLR for low resistance writing (the voltage of the intermediate node GBLI is substantially VLR), thereby causing the current ILR3 for low resistance writing to flow through the selected memory cell 51. That is, the voltage of one of the source and the drain of the P-type current limiting element 91 is VLR on the intermediate node GBLI side, and the voltage of the other one of the source and the drain of the P-type current limiting element 91 is VLR3 on the global bit line GBL side.

A condition for a transistor to operate in a saturation region is $$Vds \geq Vgs - Vt$$

where Vds denotes a drain-to-source voltage of the transistor, Vgs denotes a gate-to-source voltage of the transistor, and Vt denotes a threshold voltage of the transistor.

This condition for the transistor to operate in the saturation region is applied to Condition 1, as follows. For the P-type current limiting element 91, $$Vds = VLR3 - VLR$$

$$Vgs = VLR3 - VCMP.$$

Accordingly, a condition for the P-type current limiting element 91 to operate in the saturation region is $$VLR3 - VLR \geq VLR3 - VCMP - |Vtp|$$

which can be transformed into $$VCMP \geq VLR - |Vtp| \qquad (12).$$

A condition for turning ON the P-type current limiting element 91 is, from Vgs>Vt, $$VLR3 - VCMP > |Vtp|.$$

The P-type current limiting element 91 is ON and operates in the saturation region when VCMP is in a voltage range of $$VLR - |Vtp| \leq VCMP < VLR3 - |Vtp|.$$

I=βp/2×(Vgs−Vt)$^2$, and so the saturation current flowing through the PMOS transistor is expressed as $$ILR3 = \beta p/2 \times (VLR3 - VCMP - |Vtp|)^2 \qquad (13).$$

Here, βp=W/L×μp×Cox, where W denotes a channel width of the P-type current limiting element 91, L denotes a channel length of the P-type current limiting element 91, μp denotes a hole mobility, and Cox denotes an oxide film capacitance per unit area.

(Regarding Condition 2)

A condition for turning OFF the transistor is Vgs≦Vt. In the operating condition of Condition 1, the source of the N-type current limiting element 90 is on the global bit line GBL side that is lower in voltage. When the gate voltage Vnsn is given, a condition for turning OFF the N-type current limiting element 90 is $$Vnsn - VLR \leq Vtn$$

which can be transformed into $$Vnsn \leq VLR + Vtn \qquad (14).$$

(Regarding Condition 3)

In high resistance writing, the applied voltage between the global bit line and the selected word line is reversed in direction from the state in Conditions 1 and 2, so that the source and the drain of the N-type current limiting element 90 are replaced with each other. The drain of the N-type current limiting element 90 is on the intermediate node GBLI side with a voltage of (VHR3−VHR), and the source of the N-type current limiting element 90 is on the global bit line GBL side with a voltage of 0 V.

This being so, when the gate voltage of the N-type current limiting element 90 satisfies the condition Vnsn>Vtn, the N-type current limiting element 90 changes to ON, despite that the N-type current limiting element 90 is OFF in Condition 2.

Though the current flowing through the N-type current limiting element 90 depends on the voltage VHR3 for high resistance writing, the current of the N-type current limiting element 90 in the saturation region can be caused to flow at the maximum.

That is, $$IHR3 \leq \beta n/2 \times (Vnsn-Vtn)^2 \quad (15).$$

As is clear from Expressions (13) and (15), IHR3>ILR3 can be satisfied by adjusting βp, βn, VCMP, and Vnsn.

(Regarding Condition 4)

Though the same method as in Condition 1 is employed in the case of performing low resistance writing on the even layer memory cell, the N-type current limiting element 90 operates in the saturation region instead of the P-type current limiting element 91 because the applied voltage between the global bit line and the selected word line is reversed in direction.

A condition for the N-type current limiting element 90 to operate in the saturation region is $$VLR4-VLR \geq VCMN-Vtn$$

which can be transformed into $$VCMN \leq VLR4-VLR+Vtn \quad (16).$$

When a condition for turning ON the N-type current limiting element 90 is also taken into account, the voltage range of VCMN is $$Vtn < VCMN \leq VLR4-VLR+Vtn.$$

The saturation current flowing through the N-type current limiting element 90 in this case is expressed as $$ILR4 = \beta n/2(VCMN-Vtn)^2 \quad (17).$$

(Regarding Condition 5)

Though the same method as in Condition 2 is employed, the P-type current limiting element 91 is turned OFF instead of the N-type current limiting element 90 because the applied voltage between the global bit line and the selected word line is reversed in direction.

The source of the P-type current limiting element 91 is on the global bit line GBL side that is higher in voltage. When the gate voltage Vnsp is given, a condition for turning OFF the P-type current limiting element 91 is $$(VLR4-VLR)-Vnsp \leq |Vtp|$$

which can be transformed into $$Vnsp \geq (VLR4-VLR)-|Vtp| \quad (18).$$

(Regarding Condition 6)

Though the same method as in Condition 3 is employed, the P-type current limiting element 91 is turned ON because the applied voltage between the global bit line and the selected word line is reversed in direction.

The applied voltage between the global bit line and the selected word line is reversed in direction from the state in Condition 5, so that the source and the drain of the P-type current limiting element 91 are replaced with each other. The drain of the P-type current limiting element 91 is on the intermediate node GBLI side with a voltage of VHR, and the source of the P-type current limiting element 91 is on the global bit line GBL side with a voltage of VHR4.

This being so, when the gate voltage of the P-type current limiting element 91 satisfies the condition Vnsp<VHR4−Vtp, the P-type current limiting element 91 changes to ON with the same gate voltage Vnsp, despite that the P-type current limiting element 91 is OFF in Condition 5.

Though the current flowing through the P-type current limiting element 91 depends on the voltage VHR4 for high resistance writing, the current of the P-type current limiting element 91 in the saturation region can be caused to flow at the maximum. That is, $$IHR4 \leq \beta p/2 \times (VHR4-Vnsp-|Vtp|)^2 \quad (19).$$

As is clear from Expressions (17) and (19), IHR4>ILR4 can be satisfied by adjusting βp, βn, VCMP, and Vnsn.

(Regarding Condition 7)

The saturation current of the P-type current limiting circuit 91 in Condition 1 and the saturation current of the N-type current limiting circuit 90 in Condition 4 are equal (ILR3=ILR4).

From Expressions (13) and (17), $$\beta p(VLR3-VCMP-|Vtp|)^2 = \beta n(VCMN-Vtn)^2 \quad (20).$$

This relation is satisfied by adjusting βn, βp, VCMP, VCMN, and VLR3. Here, βn and βp are each a term proportional to a current drive capability of a transistor per unit length, where PMOS is typically about ½ in current drive capability of NMOS. Accordingly, by designing the PMOS transistor of the P-type current limiting element 91 to have the transistor width (W) twice the transistor width of the NMOS transistor of the N-type current limiting element 90, in general only the magnitude relation between the squared terms in Expression (20) needs to be taken into consideration.

Besides, since the threshold voltages of the NMOS transistor and the PMOS transistor may be substantially equal in absolute value, the threshold voltages are set to be equal. As a result, the squared terms each relate to only the gate-to-source voltage (VCMN and VCMP).

Figure 25:
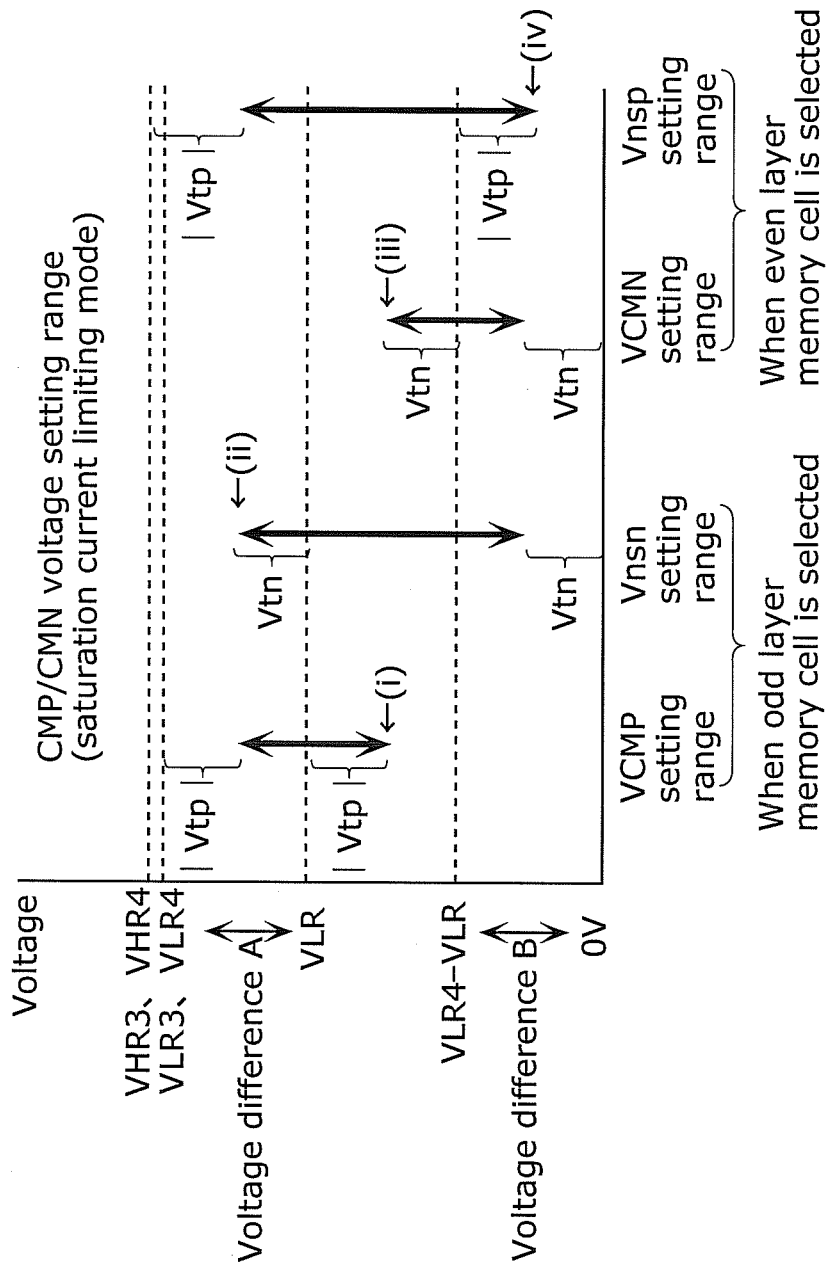
FIG. 25 is a diagram showing a set voltage range of a gate of a current limiting element in the saturation current limiting mode.

FIG. 25 is a graph showing an example of the set voltage ranges of the node CMP and the node CMN connected to the gate terminals, in Conditions 1 to 7 described above.

The following examines a situation where a condition (indicated by arrows (i) to (iv)) that maximizes the current in high resistance writing is set for each of the voltages VCMP, Vnsn, VCMN, and Vnsp, as an example.

VCMP, Vnsn, VCMN, and Vnsp are respectively $$VCMP = VLR - |Vtp|$$

$$Vnsn = VLR + Vtn$$

$$VCMN = VLR3 - VLR + Vtn = VLR4 - VLR + Vtn$$

$$Vnsp = VLR3 - VLR - |Vtp| = VLR4 - VLR - |Vtp|.$$

Regarding the current flowing through the memory cell in low resistance writing, Expression (13) is $$ILR3 = \beta p/2 \cdot (VLR3-VCMP-|Vtp|)^2 = \beta p/2 \cdot (VLR3-VLR)^2 \quad (13)'$$

and Expression (17) is $$ILR4 = \beta n/2 \cdot (VCMN-Vtn)^2 = \beta n/2 \cdot (VLR4-VLR)^2 \quad (17)'$$

which are in the same expression form. Since design is made such that βp=βn as mentioned earlier, by performing voltage control such that VLR3=VLR4, i.e. by applying the voltage of the same absolute value for low resistance writing regardless of the memory layer, the drive currents of (i) and (iii) become equal to each other. Thus, the same resistance value can be set in the even layer and the odd layer.

memory cell (the impedance of the transistor is equal to or less than VLR/ILR3 or VLR/ILR4).

Table 4 shows set voltages of main signals in association with each of the operations of the memory cells M1 to M4 of the different layers.

TABLE 4

| | Writing to odd layer memory cell | | Writing to even layer memory cell | |
|---|---|---|---|---|
| | LR (A', E') | HR (B', F') | LR (C', G') | HR (D', H') |
| Gate voltage of odd layer bit line selection switch element 58 | Vpp (A')<br>0 V (E') | Vpp (B')<br>0 V (F') | 0 V (C')<br>Vpp (G') | 0 V (D')<br>Vpp (H') |
| Gate voltage of even layer bit line selection switch element 57 | 0 V (A')<br>Vpp (E') | 0 V (B')<br>Vpp (F') | Vpp (C')<br>0 V (G') | Vpp (D')<br>0 V (H') |
| Voltage of CMN | Vth $\leq$ Vnsn $\leq$ VLR + Vth | | Vth < VCMN $\leq$ VLR4 − VLR + Vth | |
| Voltage of CMP | VLR − \|Vtp\| $\leq$ VCMP < VLR3 − \|Vtp\| | | VLR4 − VLR − \|Vtp\| $\leq$ Vnsp $\leq$ VHR4 − \|Vtp\| | |
| Global bit line | VLR3 | 0 V | 0 V | VHR4 |
| Selected word line | 0 V | VHR3 | VLR4 | 0 V |
| Drive current of N-type current limiting element 90 | 0 | $\beta n/2 \times (VLR)^2$ | $\beta n/2 \times (VLR4 − VLR)^2$ | $\geq 0$ |
| Drive current of P-type current limiting element 91 | $\beta p/2 \times (VLR3 − VLR)^2$ | $\geq 0$ | 0 | $\beta p/2 \times (VLR)^2$ |

Regarding the current flowing in high resistance writing, Expression (15) is $$IHR3 \leq \beta n/2 \times (Vnsn - Vtn)^2 = \beta n/2 \times (VLR)^2 \quad (15)'$$

and Expression (19) is $$IHR4 \leq \beta p/2 \times (VHR4 - Vnsp - |Vtp|)^2 \approx \beta p/2 \times (VLR)^2 \quad (19)'$$

There is a magnitude relation VLR4−VLR<VLR<VLR3, as shown by the vertical axis in FIG. 25. As is clear from FIG. 25, the voltage applied to the node CMN connected to the gate terminal of the N-type current limiting element 90 is higher in (ii) than in (iii). In other words, a larger current flow can be generated in (ii) than in (iii). Likewise, the voltage applied to the node CMP connected to the gate terminal of the P-type current limiting element 91 is lower in (iv) than in (i). In other words, a larger current flow can be generated in (iv) than in (i). As mentioned above, (i) and (iii) are adjusted to the same amount of current, so that the amount of current in (ii) is larger than the amount of current in (i), and the amount of current in (iv) is larger than the amount of current in (iii). This indicates that Conditions 3 and 6 are satisfied.

In FIG. 25, a voltage difference A corresponds to a voltage drop due to an impedance between the source and the drain of the P-type current limiting element 91 when the voltage VLR3 for low resistance writing is applied to the global bit line GBL to cause the current ILR3 for low resistance writing to flow through the selected memory cell. A voltage difference B corresponds to a voltage drop due to an impedance between the source and the drain of the N-type current limiting element 90 when the voltage VLR4 for low resistance writing is applied to the selected word line to cause the current ILR4 for low resistance writing to flow through the selected memory cell. This being so, the relation VLR4−VLR<VLR<VLR3 can be satisfied by designing the transistor width W of each of the P-type current limiting element 91 and the N-type current limiting element 90 to an appropriate width or more so that the impedance of the transistor in low resistance writing is lower than the low resistance state of the In Table 4, the odd layer bit line selection switch element 58 and the even layer bit line selection switch element 57 each include an NMOS transistor in this embodiment. It is desirable to at least apply, as the gate voltage, a voltage higher than (VHR4+Vtn) to each of the even layer bit line selection signal and the odd layer bit line selection signal, thereby contributing to a sufficiently low impedance of the N-type current limiting element 90 or the P-type current limiting element 91 when functioning as a current limiter.

Though the design methods of Conditions 1 to 7 are described above based on the operation principle, there are various variations in actual circuit operations. Accordingly, even when design is made such that βp=βn, for example, there is a possibility that the resistance value set in the even layer and the resistance value set in the odd layer do not exactly match. The conditions such as the equality relations described here have an acceptable error range of about 10% as with a typical variation tolerance, though depending on factors such as specifications of products envisioned.

Moreover, the voltages VCMP, Vnsn, VCMN, and Vnsp designed based on these conditions may be subject to fine adjustment in a manufacturing stage by a trimming means typically known as a fuse programming circuit, to achieve more optimal states.

Figure 26:
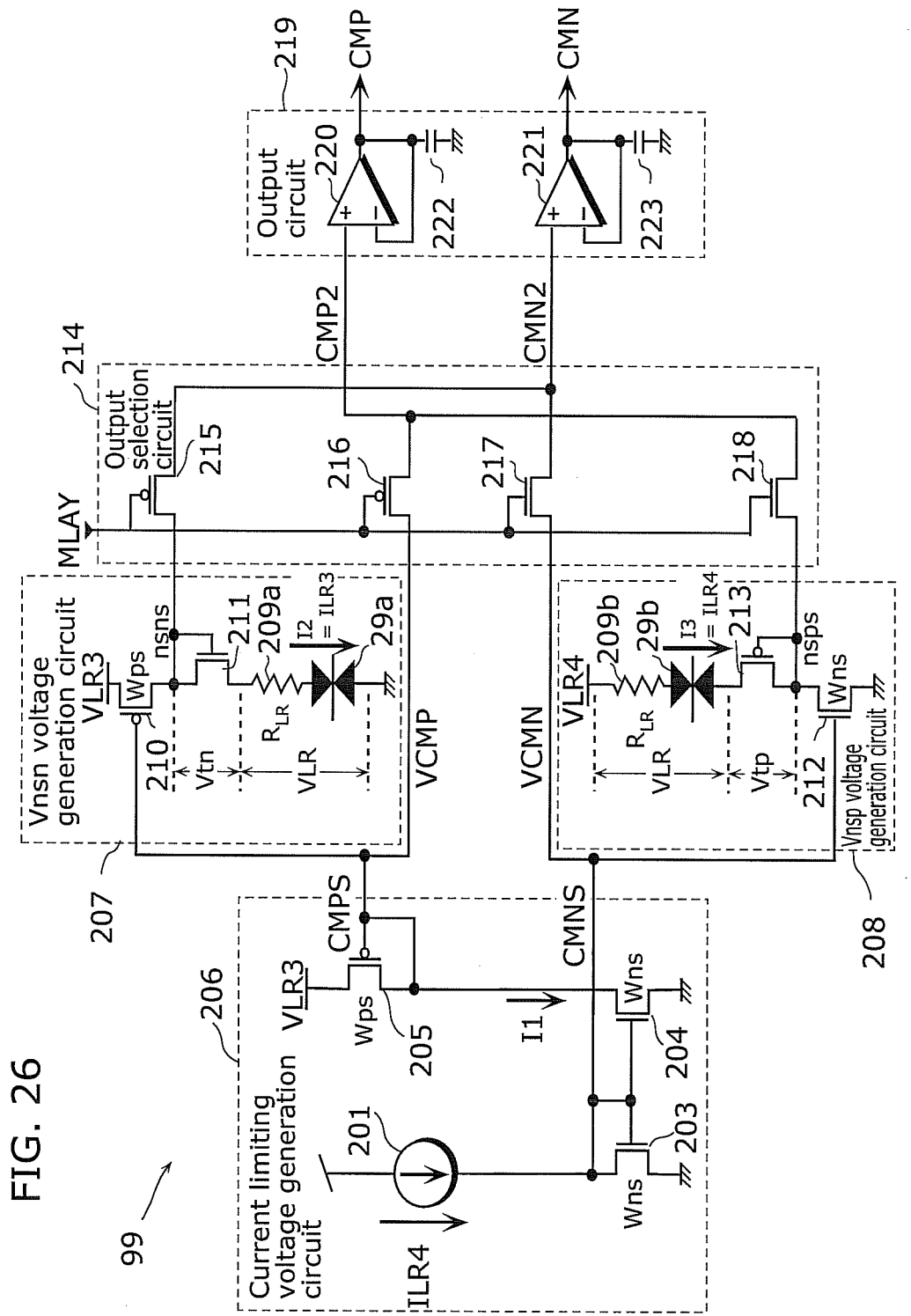
FIG. 26 is a diagram showing an example of a structure of a current limiting control circuit in the saturation current limiting mode.

FIG. 26 shows an example of a circuit structure of the current limiting control circuit 99 in the saturation current limiting mode. This current limiting control circuit 99 includes a current limiting voltage generation circuit 206, a Vnsn voltage generation circuit 207, a Vnsp voltage generation circuit 208, an output selection circuit 214, and an output circuit 219.

In FIG. 26, a constant current source 201 is a constant current source that generates the predetermined current ILR4 for low resistance writing. An NMOS transistor 203 has a source terminal connected to a ground (0 V), and a drain terminal and a gate terminal connected to each other. An NMOS transistor 204 has a source terminal connected to the ground (0 V). A PMOS transistor 205 has a source terminal connected to the voltage VLR3 for low resistance writing of the odd layer memory cell, and a drain terminal and a gate terminal connected to each other. In the current limiting voltage generation circuit 206, the constant current source 201 and the diode-connected NMOS transistor 203 are connected in series, the diode-connected PMOS transistor 205 and NMOS transistor 204 are connected in series, and the gate and drain terminals of the NMOS transistor 203 and the gate terminal of the NMOS transistor 204 are current-mirror-connected. The gate of the NMOS transistor 203 is an output terminal CMNS, and the gate of the PMOS transistor 205 is an output terminal CMPS.

Current steering elements 29a and 29b each have one end connected to the ground, and are identical to the current steering element used in the memory cell 51. Fixed resistance elements 209a and 209b are each a fixed resistance element having the same resistance value as in the low resistance state of the variable resistance element 10. An NMOS transistor 211 has a drain terminal and a gate terminal connected to each other. A PMOS transistor 210 has a source terminal connected to the power voltage VLR3, and a gate terminal connected to the output node CMPS of the current limiting voltage generation circuit 206. In the Vnsn voltage generation circuit 207, the PMOS transistor 210, the NMOS transistor 211, the fixed resistance element 209a, and the current steering element 29a are connected in series between the power voltage VLR3 and the ground, and a drain node nsns of the NMOS transistor 211 is an output terminal.

The current steering elements 29a and 29b are both bidirectional diode elements identical to the one used in the memory cell 51. The fixed resistance elements 209a and 209b are fixed resistance elements having the same resistance value as in the low resistance state of the variable resistance element 10. A PMOS transistor 213 has a drain terminal and a gate terminal connected to each other. An NMOS transistor 212 has a source terminal connected to the ground, and a gate terminal connected to the output node CMNS of the current limiting voltage generation circuit 206. In the Vnsp voltage generation circuit 208, the fixed resistance element 209b, the current steering element 29b, the PMOS transistor 213, and the NMOS transistor 212 are connected in series between the voltage VLR4 for low resistance writing of the even layer memory cell and the ground, and a drain node nsps of the PMOS transistor 213 is an output terminal.

The output selection circuit 214 selectively outputs a first input CMPS or a second input nsps as an output signal to a first output node CMP2, and selectively outputs a third input CMNS or a fourth input nsns as an output signal to a second output node CMN2, according to a signal MLAY.

The output circuit 219 includes two differential amplifiers 220 and 221 that respectively amplify in current an input signal from the first output node CMP2 and an input signal from the second output node CMN2. The differential amplifier 220 is a first differential amplifier that has a first input terminal connected to the first output node CMP2, and a second input terminal and an output terminal feedback-connected to each other. The differential amplifier 221 is a second differential amplifier that has a first input terminal connected to the second output node CMN2, and a second input terminal and an output terminal feedback-connected to each other. The output terminals of the differential amplifiers 220 and 221 are respectively connected to smoothing capacitors 222 and 223 for stable operation.

The NMOS transistor 203, the NMOS transistor 204, the NMOS transistor 212, and the N-type current limiting element 90 have the same transistor size so as to be equal in current drive capability. The PMOS transistor 205, the PMOS transistor 210, and the P-type current limiting element 91 have the same transistor size so as to be equal in current drive capability.

The following describes an operation of the current limiting control circuit 99 of this structure.

The constant current source 201 causes the current ILR4 for low resistance writing to flow through the selected memory cell of the even layer. The diode-connected NMOS transistor 203 has the same gate width Wns as the N-type current limiting element 90. Accordingly, when the current ILR4 flows, the voltage of the drain terminal of the NMOS transistor 203 in common with the voltage of the gate terminal is the current limiting voltage VCMN. This voltage VCMN is outputted to the CMNS terminal of the current limiting voltage generation circuit 206. The CMNS terminal is current-mirror-connected to the gate terminal of the NMOS transistor 204 of the same size as the NMOS transistor 203 at a mirror ratio of 1, and therefore a drain-to-source current I1 of the NMOS transistor 204 is ILR4, too. VCMP is generated so that ILR4=ILR3. The diode-connected PMOS transistor 205, to which VLR3 is applied at the source terminal, has the same gate width Wps as the P-type current limiting element 91. Accordingly, when the current I1 (=ILR3=ILR4) flows, the voltage of the drain terminal of the PMOS transistor 205 in common with the voltage of the gate terminal is the current limiting voltage VCMP. This voltage VCMP is outputted to the CMPS terminal of the current limiting voltage generation circuit 206.

When the output voltage VCMP of the CMPS terminal is inputted to the gate terminal of the PMOS transistor 210 in the Vnsn voltage generation circuit 207, a drain-to-source current I2 of the PMOS transistor 210 is equal to I1, because the PMOS transistor 210 is current-mirror-connected to the PMOS transistor 205 at a mirror ratio of 1 and the source terminals of both PMOS transistors 210 and 205 have the power voltage VLR3. That is, I2=ILR3. When the current ILR3 flows in the Vnsn voltage generation circuit 207 in which the components are connected in series, a potential difference of the current steering element 29a and the fixed resistance element 209a having the same resistance value as in the low resistance state is the voltage VLR for low resistance writing, and a potential difference of the diode-connected NMOS transistor 211 is substantially Vtn. Hence, the voltage of the intermediate node nsns has the same relation as in Expression (14), as a result of which the Vnsn voltage generation circuit 207 generates the voltage Vnsn.

When the output voltage VCMN of the CMNS terminal is inputted to the gate terminal of the NMOS transistor 212 in the Vnsp voltage generation circuit 208, a drain-to-source current I3 of the NMOS transistor 212 is equal to ILR4, because the NMOS transistor 212 is current-mirror-connected to the NMOS transistor 203 at a mirror ratio of 1 and the source terminals of both NMOS transistors 212 and 203 are connected to the ground. When the current ILR4 flows in the Vnsp voltage generation circuit 208 in which the components are connected in series, a potential difference of the current steering element 29b and the fixed resistance element 209b having the same resistance value as in the low resistance state and connected to the power voltage VLR4 at one end is the voltage VLR for low resistance writing, and a potential difference of the diode-connected PMOS transistor 213 is substantially Vtp. Hence, the voltage of the intermediate node nsps has the same relation as in Expression (18), as a result of which the Vnsp voltage generation circuit 208 generates the voltage Vnsp same as VCMN in Expression (18).

In the case where the memory cell layer to be accessed is an odd layer, when the signal MLAY="L" is inputted to the output selection circuit 214, switch elements 215 and 216 each including a PMOS transistor are ON, and switch elements 217 and 218 each including an NMOS transistor are OFF. As a result, the voltage VCMP is outputted to the first output node CMP2 of the output selection circuit 214, and the voltage Vnsn is outputted to the second output node CMN2 of the output selection circuit 214. When the signal MLAY="H" is inputted to the output selection circuit 214, on the other hand, the switch elements 215 and 216 each including a PMOS transistor are OFF, and the switch elements 217 and 218 each including an NMOS transistor are ON. As a result, the voltage Vnsp is outputted to the first output node CMP2 of the output selection circuit 214, and the voltage VCMN is outputted to the second output node CMN2 of the output selection circuit 214. Each combination of voltages selectively outputted according to the signal MLAY corresponds to the voltages inputted to the nodes CMN and CMP in the bidirectional current limiting circuit in the case of selecting the odd layer memory cell and in the case of selecting the even layer memory cell.

The voltages at the first output node CMP2 and the second output node CMN2 are respectively amplified in current by the differential amplifiers 220 and 221, and outputted to the nodes CMP and CMN as the same voltages as the input voltages. The output nodes CMP and CMN are connected in parallel with the plurality of bidirectional current limiting circuits, as shown in FIG. 13.

According to the above-mentioned structure and operation, the N-type current limiting element 90 and the P-type current limiting element 91 can be set to optimal voltages in each writing mode.

Here, the generated voltage Vnsn or Vnsp only needs to satisfy at least Expressions (15) and (14) or Expressions (19) and (18). Accordingly, the Vnsn voltage generation circuit 207 may have a structure in which the PMOS transistor 210 and the fixed resistance element 209a are connected in series, without the NMOS transistor 211. Likewise, the Vnsp voltage generation circuit 208 may have a structure in which the NMOS transistor 212 and the current steering element 29b are connected in series, without the PMOS transistor 213.

Moreover, the output voltage Vnsn to the nsns terminal and the output voltage Vnsp to the nsps terminal may be inputted from outside.

As a result of the voltage settings described above, current limiting writing for setting the resistance value of the low resistance state can be stably performed for all layers.

Besides, the voltages of the node CMN and the node CMP are the same in low resistance writing and high resistance writing of the memory cell of the same layer, and so low resistance writing and high resistance writing can be quickly performed in the same manner merely by changing the voltages of the global bit line 56 and the selected word line 52 related to the selected memory cell.

Therefore, even in the case where low resistance writing and high resistance writing for the memory cell of the same layer are performed in a plurality of blocks in the memory cell array 200 at the same time, the same voltage values can be used for VCMN0 to VCMN15 and VCMP0 to VCMP15 supplied on a block-by-block basis as shown in FIG. 14. Since only one current limiting control circuit is required, simpler circuitry can be achieved. In addition, it is also possible to easily and quickly execute inverse writing methods such as a method whereby, in low resistance writing, high resistance writing is first performed to create the high resistance state and then low resistance writing is performed and a method whereby, in high resistance writing, low resistance writing is first performed to create the low resistance state and then high resistance writing is performed.

[Method of Setting Lower Vt for Part of Transistors]

As can be understood from the description of Embodiments 1 and 2, the voltage VLR1, VLR2, VLR3, or VLR4 applied to the global bit line or the word line for low resistance writing or the voltage VHR1, VHR2, VHR3, or VHR4 applied to the global bit line or the word line for high resistance writing needs to be at least equal to or more than a total sum of the voltage for low resistance writing or high resistance writing of the variable resistance element in the memory cell 51, the threshold voltage VF of the current steering element (bidirectional diode element) (a total sum of the write voltage and VF substantially corresponds to the voltage VLR or VHR for the resistance change of the memory cell 51), the threshold voltage of the even layer bit line selection switch element or the odd layer bit line selection switch element, and the threshold voltage Vtn or Vtp of the N-type current limiting element 90 or the P-type current limiting element 91. For example, when the write voltage of the variable resistance element is about 1 V, the threshold voltage VF of the diode element is about 2 V, and the threshold voltage of the transistor of the bit line selection switch element or the current limiting element is about 0.5 V, a voltage of about 3.5 V is necessary. In actuality, a margin is provided, and the threshold voltage of the transistor is higher than 0.5 V due to a substrate bias effect. This means that a voltage of about 5 V is necessary as a voltage for driving the cross point memory.

The following modifications may be applied for further optimizing the structure or control of the cross point memory in Embodiments 1 and 2 to decrease the write voltage, thereby reducing power consumption.

[Modification 1]

Figure 27:
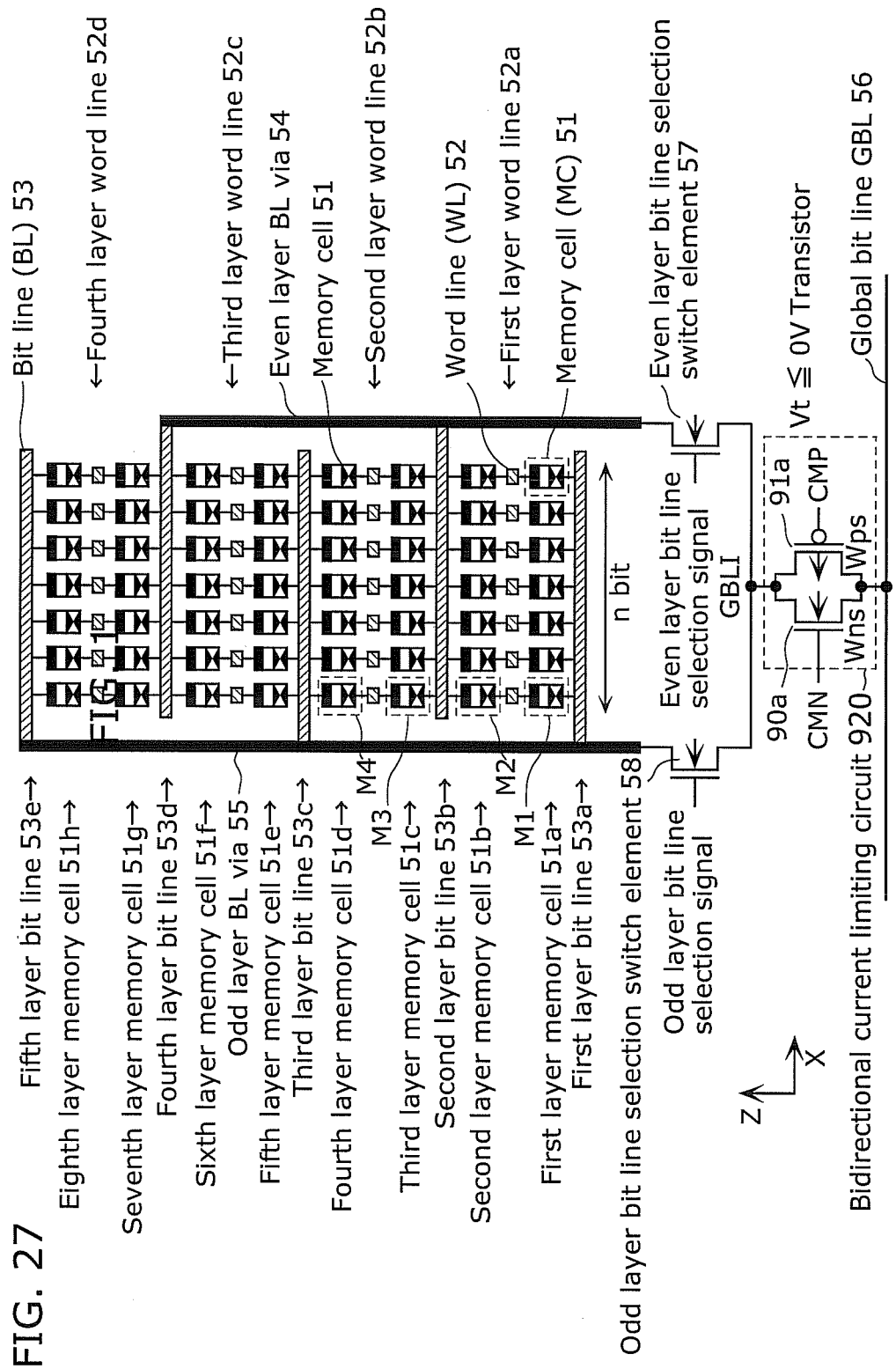
FIG. 27 is a cross section diagram of a multilayer cross point memory in Modification 1 of the embodiment of the present invention.

FIG. 27 is a diagram showing a structure in which the threshold voltages Vt of the MOS transistors in the N-type current limiting element 90 and the P-type current limiting element 91 are adjusted to 0 V in the structure shown in FIG. 11 (such N-type current limiting element and P-type current limiting element are respectively referred to as an N-type current limiting element 90a and a P-type current limiting element 91a). In this modification, the threshold voltage of the N-type current limiting element 90 is referred to as a third threshold voltage, the threshold voltage of the P-type current limiting element 91 as a fourth threshold voltage, the threshold voltage of the other NMOS transistors as a first threshold voltage, and the threshold voltage of the other PMOS transistors as a second threshold voltage. Changing the threshold voltage Vt only for a predetermined transistor can be easily realized by a generally known method such as providing a mask only in this transistor to prevent ion implantation for Vt adjustment or changing the dose amount of ion implantation for Vt adjustment only in this region.

Instead of setting the threshold to 0 V, the type of implanted ion may be changed only in this region to form a depression transistor so that the N-type current limiting element 90a is set to a normally ON state by a negative threshold voltage and the P-type current limiting element 91a is set to a normally ON state by a positive threshold voltage.

Moreover, a voltage that is equal to or more than a total sum of the voltage VLR or VHR for the resistance change of the memory cell 51 and the threshold voltage Vt of the selection switch and that is a power voltage of the cross point variable resistance nonvolatile memory device or a result of stepping-up the power voltage is used as a high level of the even layer bit line selection signal or the odd layer bit line selection signal, thereby minimizing an impedance of the even layer bit line selection switch element 57 or the odd layer bit line selection switch element 58 in the ON state.

According to this structure, the voltage VLR1, VLR2, VLR3, or VLR4 between the global bit line and the word line for low resistance writing can be decreased by the threshold voltage of the transistor.

Such a structure is possible because the N-type current limiting element 90*a* or the P-type current limiting element 91*a* functions not as a switch but as a resistor having a bidirectional current limiting capability.

Note that the threshold voltage may be set to not 0 V but a negative voltage in depression type.

Thus, the write voltage VLR1, VLR2, VLR3, or VLR4 can be decreased by about the threshold voltage of the transistor, and accordingly the voltage VHR1, VHR2, VHR3, or VHR4 can be decreased, too. This contributes to lower power consumption in addition to stable writing operations.

In Modification 1, relatively high voltages are used as the drive voltage of the even layer bit line selection signal or the odd layer bit line selection signal and the gate voltage of the N-type current limiting element 90*a*, as mentioned above. However, this only involves transistor gate driving, and so does not affect power consumption as much as the reduction in write voltage VLR1, VLR2, VLR3, or VLR4.

[Modification 2]

Figure 28:
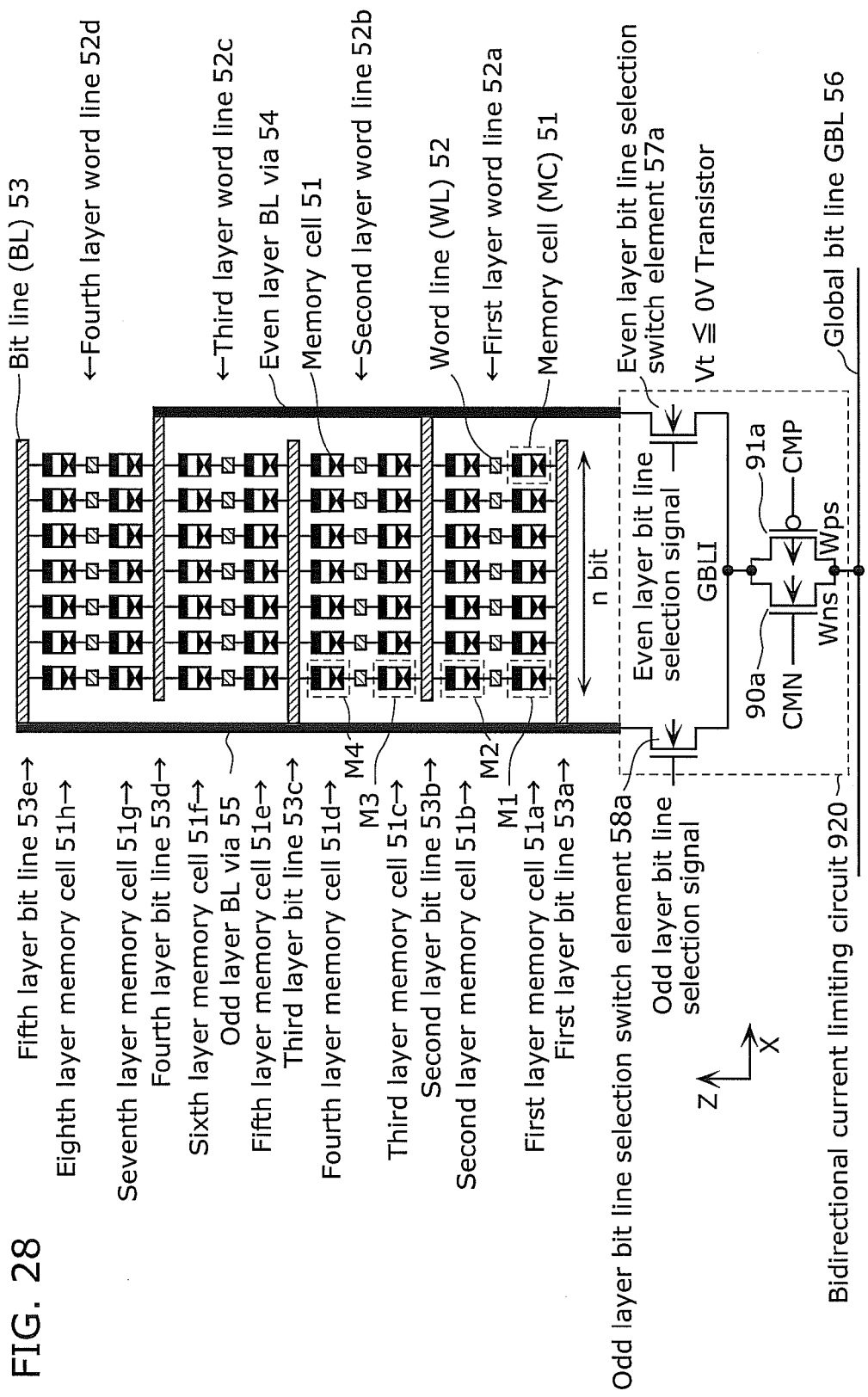
FIG. 28 is a cross section diagram of a multilayer cross point memory in Modification 2 of the embodiment of the present invention.

FIG. 28 is a diagram showing a structure in which the threshold voltages Vt of the NMOS transistors in the even layer bit line selection switch element 57 and the odd layer bit line selection switch element 58 are also set to the third threshold voltage equal to or less than 0 V, in the structure shown in FIG. 27 (such even layer bit line selection switch element and odd layer bit line selection switch element are respectively referred to as an even layer bit line selection switch element 57*a* and an odd layer bit line selection switch element 58*a*).

Figure 29:
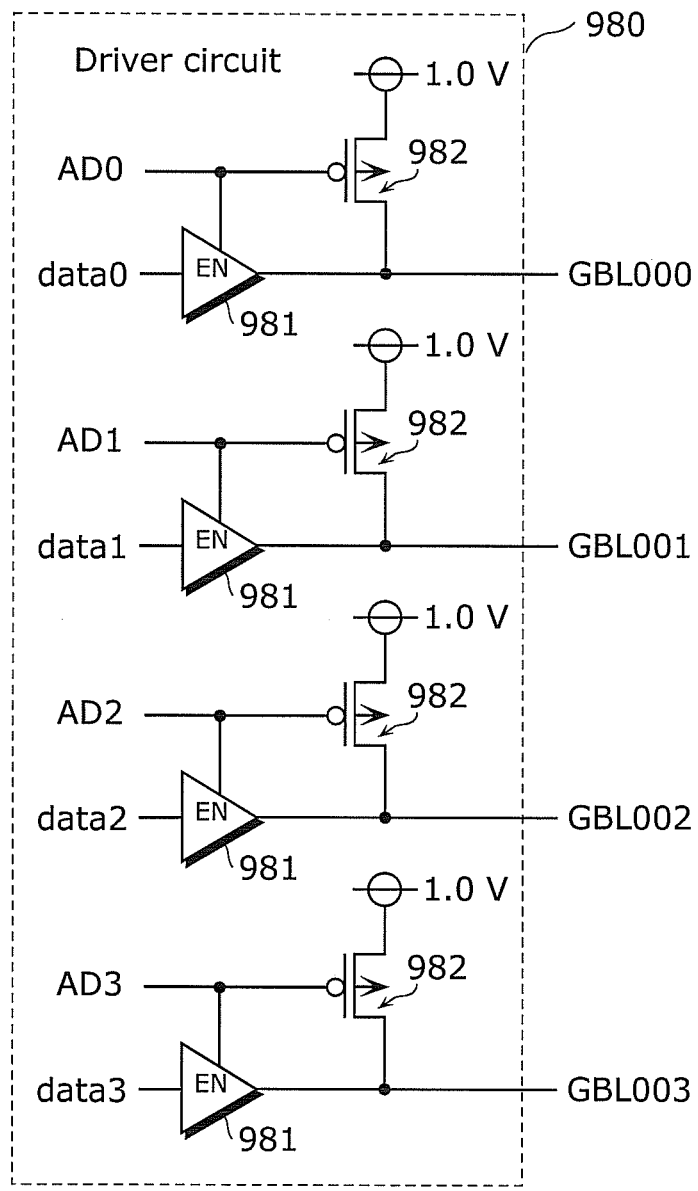
FIG. 29 is a diagram showing a global bit line driver circuit in Modification 2 of the embodiment of the present invention.

FIG. 29 shows an example of a driver circuit 980 in the global bit line decoder and driver circuit 98 used in Modification 2. The driver circuit 980 includes: a tri-state buffer 981 that outputs one of a first voltage output state corresponding to a high level of a write voltage and a second voltage output state corresponding to a low level of the write voltage in an activated state, and outputs a high impedance state in an inactivated state; and a pull-up element 982 having one end wired-connected to an output terminal of the tri-state buffer 981 and another end connected to a third voltage equal to or more than a sum of absolute values of the first threshold voltage and the third threshold voltage. When writing to the memory cell 51, the global bit line decoder and driver circuit 98 applies the third voltage to each unselected global bit line. When reading from the memory cell 51, the global bit line decoder and driver circuit 98 applies the third voltage to each unselected global bit line. The third voltage is preferably a bit line voltage for setting the memory cell 51 to an unselected state.

In more detail, the driver circuit 980 includes the tri-state buffer 981 and the pull-up element 982 which is a PMOS transistor wired-connected to the output of the tri-state buffer 981. data0, data1, data2, or data3 for designating write data is inputted to the tri-state buffer 981, and a decode signal AD0, AD1, AD2, or AD3 for designating global bit line selection is connected to an enable terminal EN of the tri-state buffer 981. The decode signal AD0, AD1, AD2, or AD3 is equally connected to a gate terminal of the pull-up element 982, while a voltage source set to about 1 V is connected to a source of the pull-up element 982.

In FIG. 14, four driver circuits 980 of the same structure are respectively connected to the global bit lines GBL000, GBL001, GBL002, and GBL003.

Figure 30:
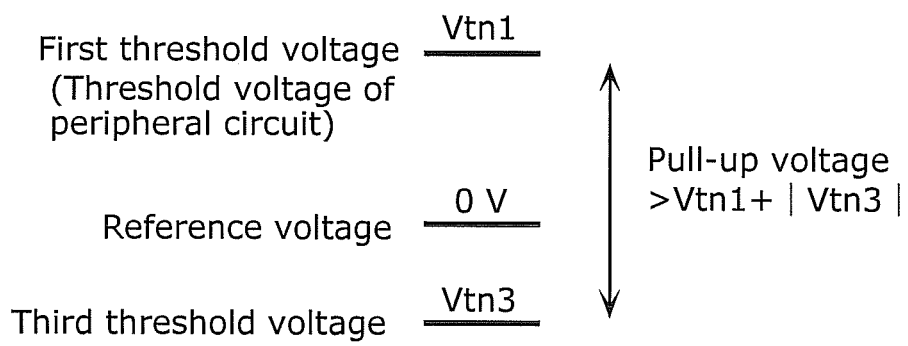
FIG. 30 is a voltage relation diagram related to a method of setting a source voltage of a pull-up element.

FIG. 30 is a voltage relation diagram for a method of setting the source voltage of the pull-up element 982. Vtn1 denotes the first threshold voltage which is the threshold voltage of each NMOS transistor included in the peripheral circuitry such as the write circuit and the read circuit, and Vtn3 denotes the third threshold voltage which is the threshold voltage of each NMOS transistor in the even layer bit line selection switch element 57 (57*a*) and the odd layer bit line selection switch element 58 (58*a*). Though the threshold voltage is set to 0 V in this modification, a lower limit of the set threshold voltage including variations is shown in FIG. 30. The source voltage is set to (Vtn1+|Vtn3|) or higher, within a range that does not exceed the unselected bit line voltage.

An operation principle of the above-mentioned structure is described below.

In Modification 2, the threshold voltages of the even layer bit line selection switch element 57*a* and the odd layer bit line selection switch element 58*a* are set to 0 V, too. This makes it possible to omit a means of stepping-up the gate voltage in the selected state, and further reduce the write voltage. However, there is also a possibility that, even when the gate voltage is set to 0 V in the unselected state, a leakage current occurs between the unselected global bit line and the unselected bit line due to an OFF leakage current, causing an increase in current consumption and an error in reading operation.

Such a leakage current can be prevented by applying a negative voltage equal to or less than the third threshold voltage Vtn3 as the gate voltage of the even layer bit line selection switch element 57*a* or the odd layer bit line selection switch element 58*a* in the unselected state. However, this method is not desirable because a negative voltage generation circuit is needed, which causes an increase in circuit area and cancels out the advantageous effect of omitting the step-up means.

In view of this, Modification 2 employs a method of turning OFF the transistor by setting the source voltage higher than the gate voltage or the substrate voltage so that the gate-to-source voltage is effectively made equal to or less than the threshold voltage of a typical transistor.

In FIG. 29, 1.0 V is applied to the unselected global bit line, as a voltage equal to or more than the threshold voltage. For example, in the case where the global bit line GBL000 is selected, a high level is inputted to the decode signal AD0 of the tri-state buffer 981 to activate the tri-state buffer 981, and information designated by the write data signal data° is provided to the global bit line GBL000.

In the case where the global bit line GBL000 is unselected, on the other hand, a low level is inputted to the decode signal AD0, and the tri-state buffer 981 outputs a high impedance. This turns ON the pull-up element 982 (PMOS transistor), and the source voltage 1.0 V of the pull-up element 982 is set in the global bit line GBL000.

Figure 31:
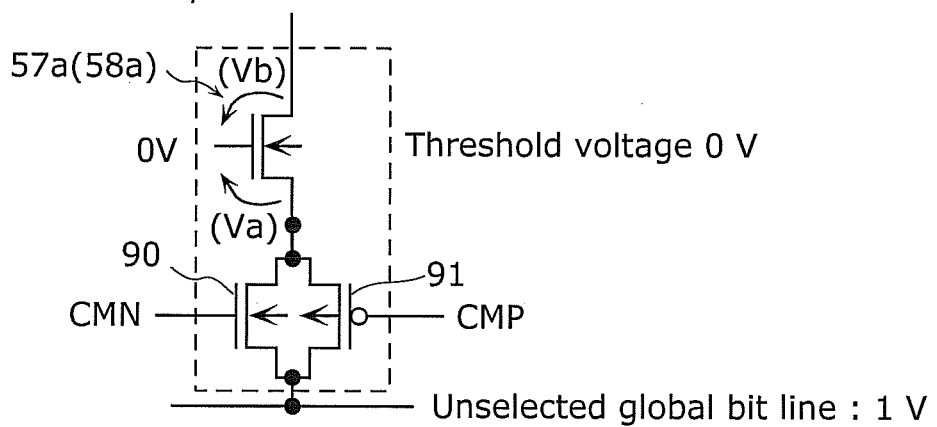
FIG. 31 is an equivalent circuit diagram of a current limiting element and an even layer bit line selection switch element or an odd layer bit line selection switch element.

FIG. 31 shows an equivalent circuit of the even layer or odd layer selection switch element and the current limiting element between the global bit line and the bit line.

In FIG. 31, "(Va)" and "(Vb)" respectively indicate the gate voltage Vg as viewed from the source and the drain of the NMOS transistor (the even layer bit line selection switch element 57*a* or the odd layer bit line selection switch element 58*a*). In the unselected state, the gate voltage is 0 V. Meanwhile, the voltage of the unselected global bit line is 1 V, and the voltage of the bit line is about ½ of the voltage applied across both ends of the memory cell in the writing or reading operation (about 1 V to 2 V in reading, and about 2 V to 3 V in writing).

Accordingly, Vg (i.e. (Va)) as viewed from the global bit line side is −1 V, and also Vg (i.e. (Vb)) as viewed from the bit line side is −1 V to −3 V. Both when viewed from the global bit line side and when viewed from the bit line side, the gate-to-source voltage Vg of the bit line selection switch element is sufficiently lower than the threshold voltage (0 V), so that the even layer bit line selection switch element 57a and the odd layer bit line selection switch element 58a are each effectively turned OFF. As a result, the leakage current to the unselected global bit line can be reduced.

In such a case, there is a need to generate a predetermined voltage between the power voltage and 0 V as the reference voltage. The use of a conventionally known means such as a resistive division method can easily realize this with a smaller circuit size than a step-up circuit or a negative voltage generation circuit.

Though the source voltage of the pull-up element 982 is set to be equal to or more than Vtn1+|Vtn3|, it is more desirable to set the source voltage equal to the unselected bit line voltage, i.e. set the (Va) side voltage and (Vb) side voltage in FIG. 31 at the same potential, with it being possible to suppress the leakage current.

As described above, in Modification 2, the drive voltage of each of the even layer bit line selection signal and the odd layer bit line selection signal and the gate voltage of the N-type current limiting element 90 can be decreased in voltage as compared with Modification 1. Since there is no need to provide a step-up circuit for these voltages, both a voltage reduction and a simpler circuit structure can be achieved.

Though 0 V or a negative voltage is set as a threshold voltage of a predetermined transistor, in actual manufacturing there are variations among a large number of transistors, and the threshold voltage is distributed in positive or negative voltages even when, for example, the threshold voltage is determined as 0 V. The threshold voltage typically varies by 50 mV to 100 mV. Accordingly, the threshold voltage is equal to or less than 100 mV in the case of an NMOS transistor, and equal to or more than −100 mV in the case of a PMOS transistor.

The cross point variable resistance nonvolatile memory device in this embodiment is formed so that a threshold voltage of a typical transistor is 500 mV in the case of an NMOS transistor and −500 mV in the case of a PMOS transistor, as in a typical LSI. Therefore, by decreasing the threshold voltage to 0 V or less in order to reduce the voltage for the writing operation according to the present invention, a remarkable advantageous effect of a voltage reduction of about 500 mV can be achieved.

However, the present invention also includes such an instance where, when a typical transistor includes a high withstand voltage transistor or the like with a threshold voltage of 1 V or more, the threshold voltage of each transistor described in Modification 1 or 2 is not necessarily set to 0 V or below but is decreased by about 500 mV.

As described above, according to the present invention, a multilayer cross point memory capable of stably performing current limiting writing for setting the resistance value of the low resistance state for all layers can be realized in a nonvolatile memory device of a multilayer cross point memory structure in which cross point memory array layers of the same structure are stacked.

Though the cross point variable resistance nonvolatile memory device according to the present invention has been described above by way of Embodiments 1 and 2 and Modifications 1 and 2, the present invention is not limited to such. Modifications obtained by applying various changes conceivable by a person skilled in the art to the embodiments and the modifications and any combinations of the components in the embodiments and the modifications are also included in the present invention without departing from the scope of the present invention.

For example, though the second variable resistance layer 12 is located above in the orientation of the variable resistance element 10 in the Z direction in FIG. 11, the cross point variable resistance nonvolatile memory device according to the present invention may have each variable resistance element of the opposite orientation. In such a cross point variable resistance nonvolatile memory device, the memory cells M1, M2, M3, and M4 in FIG. 11 respectively correspond to M4, M3, M2, and M1 in terms of the relations between the memory cell 51 and the bit line 53 and the word line 52 which sandwich the memory cell 52. Hence, the present invention can be realized by changing the control methods in accordance with this.

Though the oxygen-deficient transition metal oxide in the first variable resistance layer and the second variable resistance layer is tantalum oxide in the above embodiments, the first variable resistance layer and the second variable resistance layer in the variable resistance element according to the present invention are each not limited to this material, so long as it is a variable resistance layer: that has resistance change characteristics of reversibly changing between at least two states including a low resistance state and a high resistance state by application of voltages of different polarities; and that, in low resistance writing, is limited in current and, in high resistance writing, stably operates when a voltage higher in absolute value than and opposite in polarity to a voltage for low resistance writing is applied. In detail, the variable resistance layer may comprise at least one material selected from the group consisting of oxygen-deficient hafnium oxide and zirconium oxide, other than oxygen-deficient tantalum oxide. The variable resistance layer having the stack structure of such oxygen-deficient transition metal oxide, like the variable resistance layer having the stack structure of oxygen-deficient tantalum oxide, exhibits bidirectional resistance change characteristics of changing from the high resistance state to the low resistance state when a negative voltage is applied to the electrode on the side of the second variable resistance layer lower in oxygen deficiency with respect to the electrode on the side of the first variable resistance layer higher in oxygen deficiency, and changing from the low resistance state to the high resistance state when a positive voltage is applied to the electrode on the side of the second variable resistance layer with respect to the electrode on the side of the first variable resistance layer. Oxygen-deficient hafnium oxide and zirconium oxide can be formed by reactive sputtering in which sputtering is performed using hafnium and zirconium targets in an inert gas atmosphere containing oxygen, as with oxygen-deficient tantalum oxide. An oxygen concentration in a film can be adjusted by adjusting an oxygen concentration in the atmosphere during sputtering.

That is, though the variable resistance layer has the stack structure of tantalum oxide in the above embodiments, the present invention is not limited to this, and the advantageous effects of the present invention can also be achieved by materials other than tantalum oxide. For instance, the variable resistance layer may have the stack structure of hafnium (Hf) oxide, the stack structure of zirconium (Zr) oxide, or the like.

Moreover, the first variable resistance layer and the second variable resistance layer may comprise different metals. Here, it is preferable that the metal of the second variable resistance layer lower in oxygen deficiency has a lower standard electrode potential than the metal of the first variable resistance layer higher in oxygen deficiency. Since a smaller standard electrode potential facilitates oxidation, it is preferable that the metal of the second variable resistance layer lower in oxygen deficiency has a lower standard electrode potential than the metal of the first variable resistance layer higher in oxygen deficiency. This is because a resistance change phenomenon due to an oxidation reduction reaction is more likely to occur near an interface between the second variable resistance layer higher in oxygen content than the first variable resistance layer and the electrode connected to the second variable resistance layer. The same advantageous effects can also be achieved using other materials, so long as the variable resistance element in the cross point variable resistance nonvolatile memory device according to the present invention has the same resistance change characteristics.

The transition metal oxide layer sandwiched between the upper and lower electrodes includes an oxide layer of tantalum, hafnium, zirconium, or the like as a main variable resistance layer for performing a resistance change, and may additionally include, for example, a slight amount of other chemical element. It is also possible to intentionally include the other chemical element in a small amount, for resistance value fine adjustment and the like. The present invention also includes such an instance. For example, by adding nitrogen to the variable resistance layer, the variable resistance layer is increased in resistance value, which contributes to an improved resistance change reaction.

Accordingly, regarding the variable resistance element in which oxygen-deficient transition metal oxide is used in the variable resistance layer, in the case where the variable resistance layer includes a first region (first variable resistance layer) comprising a first oxygen-deficient transition metal oxide having a composition expressed as $MO_x$ and a second region (second variable resistance layer) comprising a second oxygen-deficient transition metal oxide having a composition expressed as $MO_y$ (where x<y), the first region and the second region may comprise a predetermined impurity (e.g. an additive for resistance value adjustment) in addition to the corresponding transition metal oxide.

When a resistance film is formed by sputtering, there is an instance where a slight amount of chemical element is unintentionally mixed into the resistance film due to residual gas, gas emission from a vacuum vessel wall, or the like. The present invention also includes such an instance where a slight amount of chemical element is mixed into the resistance film.

Though the electrode (second electrode) placed in contact with the second variable resistance layer (higher-oxygen-concentration oxide layer) comprises Pt (platinum) in the above embodiments, the electrode may be formed using at least one material having a higher standard electrode potential than the transition metal of the variable resistance layer, such as Au (gold), Ir (iridium), Pd (palladium), Cu (copper), Ag (silver), and the like. It is also preferable that the electrode (first electrode) placed in contact with the first variable resistance layer (lower-oxygen-concentration oxide layer) comprises a material (e.g. W, Ni, TaN, or the like in the case where the second electrode comprises the above-mentioned precious metal material) having a lower standard electrode potential than the material of the second electrode. In addition, it is more preferable that the first electrode comprises a material having a standard electrode potential equal to or lower than the standard electrode potential of the transition metal of the variable resistance layer.

A higher standard electrode potential leads to less oxidation. In the case where the standard electrode potential is higher than the standard electrode potential of the transition metal of the variable resistance layer, the variable resistance layer near their interface is more likely to be oxidized. In the case of the opposite structure, the variable resistance layer near their interface is less likely to be oxidized. Thus, a resistance change phenomenon is more likely to occur at the variable resistance layer near the interface of the electrode higher in standard electrode potential. This contributes to a stable operation.

This can be generalized as follows. It is preferable that the standard electrode potential $V_2$ of the second electrode and the standard electrode potential $V_M$ of the transition metal in the variable resistance layer have a relation $V_2 > V_M$, and also the standard electrode potential $V_2$ of the second electrode and the standard electrode potential $V_1$ of the first electrode have a relation $V_2 > V_1$. It is further preferable that there is a relation $V_1 \leq V_M$.

Such a structure enables a resistance change phenomenon to be stably induced in the second variable resistance layer in contact with the second electrode.

INDUSTRIAL APPLICABILITY

As described above, according to the present invention, variable resistance elements can be formed in the same orientation in all layers by providing a bidirectional current limiting writing circuit for setting a resistance value of a low resistance state, in a cross point variable resistance nonvolatile memory device and in particular a high-integration and small-area cross point variable resistance nonvolatile memory device having, in a small layout area, multiple memory cell arrays of a multilayer memory structure in which cross points are stacked. Hence, the present invention is useful as a low-cost nonvolatile memory device having stable resistance change characteristics.

REFERENCE SIGNS LIST

| | |
|---|---|
| 10 | Variable resistance element |
| 11 | Upper electrode (third electrode) |
| 12 | Second variable resistance layer |
| 13 | First variable resistance layer |
| 14 | Lower electrode |
| 21 | Upper electrode (second electrode) |
| 22 | Current steering layer |
| 23 | Lower electrode (first electrode) |
| 26 to 28 | Via |
| 29, 29a, 29b | Current steering element |
| 51 | Memory cell |
| 52, 52a to 52d | Word line |
| 53, 53a to 53e | Bit line |
| 54 | Even layer bit line via |
| 55 | Odd layer bit line via |
| 56 | Global bit line |
| 57, 57a, 65 to 68 | Even layer bit line selection switch element |
| 58, 58a, 61 to 64 | Odd layer bit line selection switch element |
| 70 | Upper wire |
| 71 | Lower wire |
| 73 | Sub-bit line selection circuit |
| 74 | Word line decoder and driver circuit |
| 90, 90a, 92, 94, 96 | N-type current limiting element |
| 91, 91a, 93, 95, 97 | P-type current limiting element |
| 98 | Global bit line decoder and driver circuit |
| 99 | Current limiting control circuit |
| 100, 200 | Memory cell array |
| 105 | Write circuit |
| 106 | Read circuit |

| | |
|---|---|
| 107 | Data input-output circuit |
| 108 | Pulse generation circuit |
| 109 | Control circuit |
| 110 | Address input circuit |
| 190, 203, 204, 211, 212, 578 | NMOS transistor |
| 201 | Constant current source |
| 205, 210, 213 | PMOS transistor |
| 206 | Current limiting voltage generation circuit |
| 207 | Vnsn voltage generation circuit |
| 208 | Vnsp voltage generation circuit |
| 209a, 209b | Fixed resistance element |
| 214 | Output selection circuit |
| 215 to 218 | bit line selection switch element |
| 219 | Output circuit |
| 220, 221 | Differential amplifier |
| 222, 223 | Smoothing capacitor |
| 300 | Main part |
| 920 | Bidirectional current limiting circuit |
| 980 | Driver circuit |
| 981 | Tri-state buffer |
| 982 | Pull-up element |

The invention claimed is:

1. A cross point variable resistance nonvolatile memory device comprising:
   a substrate;
   a memory cell array formed on said substrate and having a plurality of memory cells each of which includes a variable resistance element and a bidirectional current steering element, said variable resistance element reversibly changing between at least two states including a low resistance state and a high resistance state by application of voltages of different polarities, and said current steering element being connected in series with said variable resistance element and having nonlinear current-voltage characteristics,
      wherein each of said plurality of memory cells is placed at a different one of cross points of a plurality of bit lines and a plurality of word lines so as to be sandwiched between a corresponding bit line and a corresponding word line, said plurality of bit lines being formed in a plurality of layers and extending in an X direction, and said plurality of word lines being formed in layers between said plurality of bit lines and extending in a Y direction,
      a memory cell of said plurality of memory cells that is placed at a cross point of a bit line and a word line above said bit line is an odd layer memory cell,
      a memory cell of said plurality of memory cells that is placed at a cross point of a bit line and a word line below said bit line is an even layer memory cell,
      a plurality of XZ planes that each correspond to a different one of a plurality of bit line groups and are aligned in the Y direction are a plurality of vertical array planes, each of the plurality of bit line groups being composed of said plurality of bit lines aligned in a Z direction which is a layer stacking direction,
      said plurality of vertical array planes share said plurality of word lines that perpendicularly pass through each of said plurality of vertical array planes,
      in each of said plurality of vertical array planes, bit lines in all even layers of the plurality of layers are commonly connected to a first via extending in the Z direction, and bit lines in all odd layers of the plurality of layers are commonly connected to a second via extending in the Z direction,
      said variable resistance element in each of said plurality of memory cells: includes a first electrode, a variable resistance layer, and a second electrode that are stacked in the Z direction so that said variable resistance layer is sandwiched between said first electrode and said second electrode; is asymmetrical in that said variable resistance element differs in structure between when viewed in a direction from said first electrode to said second electrode and when viewed in a direction from said second electrode to said first electrode; and has characteristics of changing to the high resistance state when a voltage equal to or more than a predetermined voltage is applied to said second electrode with respect to said first electrode and changing to the low resistance state when a voltage equal to or more than a predetermined voltage is applied to said first electrode with respect to said second electrode, and
      said variable resistance element in said even layer memory cell and said variable resistance element in said odd layer memory cell are positioned in the same orientation in the Z direction;
   a plurality of global bit lines each of which is provided for a different one of said plurality of vertical array planes;
   a plurality of first bit line selection switch elements each of which is provided for a different one of said plurality of vertical array planes, and has one end connected to the first via;
   a plurality of second bit line selection switch elements each of which is provided for a different one of said plurality of vertical array planes, and has one end connected to the second via;
   a plurality of bidirectional current limiting circuits each of which is provided for a different one of said plurality of vertical array planes, said bidirectional current limiting circuit being positioned between a global bit line corresponding to said vertical array plane and each of an other end of a first bit line selection switch element corresponding to said vertical array plane and an other end of a second bit line selection switch element corresponding to said vertical array plane, and limiting each bidirectional current flowing between said global bit line and each of said first bit line selection switch element and said second bit line selection switch element;
   a current limiting control circuit that controls said bidirectional current limiting circuit;
   a global bit line decoder and driver that supplies a signal for selecting a memory cell and writing or reading said memory cell, to any of said plurality of global bit lines;
   a word line decoder and driver that supplies a signal for selecting said memory cell and writing or reading said memory cell, to any of said plurality of word lines;
   a write circuit that writes data to said memory cell selected by said global bit line decoder and driver and said word line decoder and driver;
   a read circuit that reads data from said memory cell selected by said global bit line decoder and driver and said word line decoder and driver; and
   a control circuit that controls said global bit line decoder and driver, said word line decoder and driver, said write circuit, and said read circuit,
   wherein said bidirectional current limiting circuit includes an N-type current limiting element and a P-type current limiting element that are connected in parallel with each other, said N-type current limiting element including an NMOS transistor, and said P-type current limiting element including a PMOS transistor, and
   when changing said selected memory cell to the low resistance state, said current limiting control circuit activates one current limiting element, from among said N-type current limiting element and said P-type current limiting element, that is more capable of limiting an amount of current flowing in said selected memory cell.

2. The cross point variable resistance nonvolatile memory device according to claim 1,
wherein said write circuit, said read circuit, and said control circuit each include at least one of an NMOS transistor having a first threshold voltage and a PMOS transistor having a second threshold voltage,
said NMOS transistor in said N-type current limiting element has a third threshold voltage lower than the first threshold voltage, and
said PMOS transistor in said P-type current limiting element has a fourth threshold voltage higher than the second threshold voltage.

3. The cross point variable resistance nonvolatile memory device according to claim 2,
wherein said first bit line selection switch element and said second bit line selection switch element each include an NMOS transistor having the third threshold voltage.

4. The cross point variable resistance nonvolatile memory device according to claim 3,
wherein said global bit line decoder and driver includes:
a buffer circuit that at least outputs one of an output state of a first voltage and an output state of a second voltage in an activated state, and at least outputs a high impedance state in an inactivated state, the first voltage and the second voltage respectively corresponding to a high level and a low level of a write voltage; and
a pull-up element having one end connected to an output terminal of said buffer circuit, and an other end connected to a power source having a third voltage that is equal to or more than a sum of absolute values of the first threshold voltage and the third threshold voltage.

5. The cross point variable resistance nonvolatile memory device according to claim 4,
wherein said global bit line decoder and driver applies the third voltage to an unselected global bit line, when writing said memory cell.

6. The cross point variable resistance nonvolatile memory device according to claim 4,
wherein said global bit line decoder and driver applies the third voltage to an unselected global bit line, when reading said memory cell.

7. The cross point variable resistance nonvolatile memory device according to claim 4,
wherein the third voltage is a bit line voltage for setting a memory cell to an unselected state.

8. The cross point variable resistance nonvolatile memory device according to claim 1,
wherein said second electrode has a standard electrode potential that is higher than a standard electrode potential of a transition metal in said variable resistance layer, and higher than a standard electrode potential of said first electrode.

9. The cross point variable resistance nonvolatile memory device according to claim 1,
wherein said variable resistance layer includes:
a first region that comprises a first oxygen-deficient transition metal oxide having a composition expressed as $MO_x$, and is in contact with said first electrode; and
a second region that comprises a second oxygen-deficient transition metal oxide having a composition expressed as $MO_y$, where x<y, and is in contact with said second electrode.

10. The cross point variable resistance nonvolatile memory device according to claim 1,
wherein said current limiting control circuit:
controls, in the case where said even layer memory cell is selected, gate voltages of said N-type current limiting element and said P-type current limiting element so that one of said N-type current limiting element and said P-type current limiting element is ON and an other one of said N-type current limiting element and said P-type current limiting element is OFF, and controls, in the case where said odd layer memory cell is selected, the gate voltages of said N-type current limiting element and said P-type current limiting element so that the other one of said N-type current limiting element and said P-type current limiting element is ON and the one of said N-type current limiting element and said P-type current limiting element is OFF;
performs low resistance writing on said memory cell by, depending on whether said memory cell subjected to the low resistance writing is said even layer memory cell or said odd layer memory cell, turning ON only one of said N-type current limiting element and said P-type current limiting element that has a higher substrate bias effect in the case where a current for the low resistance writing flows between said selected global bit line and said selected word line through said NMOS transistor in said N-type current limiting element and in the case where the current flows between said selected global bit line and said selected word line through said PMOS transistor in said P-type current limiting element; and
performs high resistance writing on said memory cell by, depending on whether said memory cell subjected to the high resistance writing is said even layer memory cell or said odd layer memory cell, turning ON only one of said N-type current limiting element and said P-type current limiting element that has a lower substrate bias effect in the case where a current for the high resistance writing flows between said selected global bit line and said selected word line through said NMOS transistor in said N-type current limiting element and in the case where the current flows between said selected global bit line and said selected word line through said PMOS transistor in said P-type current limiting element.

11. The cross point variable resistance nonvolatile memory device according to claim 10,
wherein said current limiting control circuit: turns ON only said NMOS transistor in said N-type current limiting element, in the case of performing the low resistance writing on said memory cell by applying a higher voltage to said selected global bit line than said selected word line; and turns ON only said PMOS transistor in said P-type current limiting element, in the case of performing the low resistance writing on said memory cell by applying a lower voltage to said selected global bit line than said selected word line.

12. The cross point variable resistance nonvolatile memory device according to claim 10,
wherein in the low resistance writing, a current flowing through one of said N-type current limiting element and said P-type current limiting element in the case where said odd layer memory cell is selected and a current flowing through an other one of said N-type current limiting element and said P-type current limiting element in the case where said even layer memory cell is selected are opposite in current direction, and equal in absolute value within a predetermined range of variations.

13. The cross point variable resistance nonvolatile memory device according to claim 12,
  wherein said current limiting control circuit adjusts a gate voltage of said NMOS transistor in said N-type current limiting element and a gate voltage of said PMOS transistor in said P-type current limiting element so that a current for the low resistance writing flowing through one of said N-type current limiting element and said P-type current limiting element in the case where said odd layer memory cell is selected and a current for the low resistance writing flowing through an other one of said N-type current limiting element and said P-type current limiting element in the case where said even layer memory cell is selected are equal in amount.

14. The cross point variable resistance nonvolatile memory device according to claim 12,
  wherein a gate width of said PMOS transistor in said P-type current limiting element is substantially twice a gate width of said NMOS transistor in said N-type current limiting element.

15. The cross point variable resistance nonvolatile memory device according to claim 10,
  wherein said current limiting control circuit applies the same first gate voltage to said N-type current limiting element in the case of writing said memory cell to the high resistance state and in the case of writing said memory cell to the low resistance state, and applies the same second gate voltage to said P-type current limiting element in the case of writing said memory cell to the high resistance state and in the case of writing said memory cell to the low resistance state.

16. The cross point variable resistance nonvolatile memory device according to claim 10,
  wherein said current limiting control circuit turns ON said N-type current limiting element by applying a voltage equal to or more than Vtn+VLR to a gate terminal of said N-type current limiting element, where VLR is a voltage applied across both ends of said memory cell when writing said memory cell to the low resistance state, and Vtn is a threshold voltage of said NMOS transistor in said N-type current limiting element.

17. The cross point variable resistance nonvolatile memory device according to claim 10,
  wherein said current limiting control circuit turns ON said P-type current limiting element by applying a voltage of 0 V to a gate terminal of said P-type current limiting element.

18. The cross point variable resistance nonvolatile memory device according to claim 10, further comprising
  a sub-bit line selection circuit that controls said first bit line selection switch element and said second bit line selection switch element,
  wherein, in the case where said second electrode is positioned above said first electrode in the Z direction in said variable resistance element in said memory cell:
  said sub-bit line selection circuit turns ON said second bit line selection switch element and said current limiting control circuit turns ON said N-type current limiting element, when writing said odd layer memory cell that corresponds to any of said bit lines in the odd layers;
  said sub-bit line selection circuit turns ON said second bit line selection switch element and said current limiting control circuit turns ON said P-type current limiting element, when writing said even layer memory cell that corresponds to any of said bit lines in the odd layers;
  said sub-bit line selection circuit turns ON said first bit line selection switch element and said current limiting control circuit turns ON said N-type current limiting element, when writing said odd layer memory cell that corresponds to any of said bit lines in the even layers; and
  said sub-bit line selection circuit turns ON said first bit line selection switch element and said current limiting control circuit turns ON said P-type current limiting element, when writing said even layer memory cell that corresponds to any of said bit lines in the even layers.

19. The cross point variable resistance nonvolatile memory device according to claim 10, further comprising
  a sub-bit line selection circuit that controls said first bit line selection switch element and said second bit line selection switch element,
  wherein, in the case where said first electrode is positioned above said second electrode in the Z direction in said variable resistance element in said memory cell:
  said sub-bit line selection circuit turns ON said second bit line selection switch element and said current limiting control circuit turns ON said P-type current limiting element, when writing said odd layer memory cell that corresponds to any of said bit lines in the odd layers;
  said sub-bit line selection circuit turns ON said second bit line selection switch element and said current limiting control circuit turns ON said N-type current limiting element, when writing said even layer memory cell that corresponds to any of said bit lines in the odd layers;
  said sub-bit line selection circuit turns ON said first bit line selection switch element and said current limiting control circuit turns ON said P-type current limiting element, when writing said odd layer memory cell that corresponds to any of said bit lines in the even layers; and
  said sub-bit line selection circuit turns ON said first bit line selection switch element and said current limiting control circuit turns ON said N-type current limiting element, when writing said even layer memory cell that corresponds to any of said bit lines in the even layers.

20. The cross point variable resistance nonvolatile memory device according to claim 1,
  wherein said current limiting control circuit:
  applies, in the case where said even layer memory cell is selected, a first voltage to a gate terminal of said N-type current limiting element and a second voltage to a gate terminal of said P-type current limiting element, and applies, in the case where said odd layer memory cell is selected, a third voltage to the gate terminal of said N-type current limiting element and a fourth voltage to the gate terminal of said P-type current limiting element;
  applies, in the case of writing said even layer memory cell to the low resistance state, the first voltage and the second voltage respectively to the gate terminal of said N-type current limiting element and the gate terminal of said P-type current limiting element so that one of said N-type current limiting element and said P-type current limiting element that has a lower substrate bias effect in the case where a current for the low resistance writing flows between said selected global bit line and said selected word line through said NMOS transistor in said N-type current limiting element and in the case where the current flows between said selected global bit line and said selected word line through said PMOS transistor in said P-type current limiting element is ON and an other one of said N-type current limiting element and said P-type current limiting element is OFF;
  applies, in the case of writing said even layer memory cell to the high resistance state, the first voltage and the second voltage respectively to the gate terminal of said N-type current limiting element and the gate terminal of said P-type current limiting element so that a current for the high resistance writing flows between said selected global bit line and said selected word line in an opposite direction to the current for the low resistance writing and the other one of said N-type current limiting element and said P-type current limiting element, which is OFF in the low resistance writing, is ON;

applies, in the case of writing said odd layer memory cell to the low resistance state, the third voltage and the fourth voltage respectively to the gate terminal of said N-type current limiting element and the gate terminal of said P-type current limiting element so that one of said N-type current limiting element and said P-type current limiting element that has a lower substrate bias effect in the case where a current for the low resistance writing flows between said selected global bit line and said selected word line through said NMOS transistor in said N-type current limiting element and in the case where the current flows between said selected global bit line and said selected word line through said PMOS transistor in said P-type current limiting element is ON and an other one of said N-type current limiting element and said P-type current limiting element is OFF; and applies, in the case of writing said odd layer memory cell to the high resistance state, the third voltage and the fourth voltage respectively to the gate terminal of said N-type current limiting element and the gate terminal of said P-type current limiting element so that a current for the high resistance writing flows between said selected global bit line and said selected word line in an opposite direction to the current for the low resistance writing and the other one of said N-type current limiting element and said P-type current limiting element, which is OFF in the low resistance writing, is ON.

21. The cross point variable resistance nonvolatile memory device according to claim 20, wherein a voltage applied across both ends of said memory cell when writing said memory cell to the low resistance state is VLR, in the case of writing said memory cell to the low resistance state by applying a higher voltage to said selected global bit line than said selected word line where a voltage difference between said selected global bit line and said selected word line is VLR3, said current limiting control circuit: turns ON said P-type current limiting element in saturation region characteristics of said PMOS transistor, by applying a voltage VCMP that satisfies VLR−|Vtp|≦VCMP<VLR3−|Vtp| to the gate terminal of said PMOS transistor in said P-type current limiting element; and turns OFF said N-type current limiting element, by applying a voltage Vnsn that satisfies Vtn≦Vnsn≦VLR+Vtn to the gate terminal of said NMOS transistor in said N-type current limiting element, and in the case of writing said memory cell to the low resistance state by applying a lower voltage to said selected global bit line than said selected word line where a voltage difference between said selected global bit line and said selected word line is VLR4, said current limiting control circuit: turns ON said N-type current limiting element in saturation region characteristics of said NMOS transistor, by applying a voltage VCMN that satisfies Vtn<VCMN≦VLR4−VLR+Vtn to the gate terminal of said NMOS transistor in said N-type current limiting element; and turns OFF said P-type current limiting element, by applying a voltage Vnsp that satisfies VLR4−VLR−|Vtp|≦Vnsp≦VHR4−|Vtp| to the gate terminal of said PMOS transistor in said P-type current limiting element.

22. The cross point variable resistance nonvolatile memory device according to claim 21, wherein in the low resistance writing, said current limiting control circuit applies the voltage VCMN to the gate terminal of said NMOS transistor and the voltage VCMP to the gate terminal of said PMOS transistor so that a current flowing when said P-type current limiting element is ON and a current flowing when said N-type current limiting element is ON are opposite in current direction, and equal in absolute value within a predetermined range of variations.

23. The cross point variable resistance nonvolatile memory device according to claim 21, wherein a gate width of said PMOS transistor in said P-type current limiting element is substantially twice a gate width of said NMOS transistor in said N-type current limiting element.

24. The cross point variable resistance nonvolatile memory device according to claim 20, wherein said current limiting control circuit applies the same voltage to the gate terminal of said N-type current limiting element or the gate terminal of said P-type current limiting element in the case of writing said memory cell to the high resistance state and in the case of writing said memory cell to the low resistance state.

25. The cross point variable resistance nonvolatile memory device according to claim 20, further comprising a sub-bit line selection circuit that controls said first bit line selection switch element and said second bit line selection switch element, wherein, in the case where said second electrode is positioned above said first electrode in the Z direction in said variable resistance element in said memory cell:

said sub-bit line selection circuit turns ON said second bit line selection switch element and said current limiting control circuit applies a voltage Vnsn to the gate terminal of said N-type current limiting element and a voltage VCMP to the gate terminal of said P-type current limiting element, when writing said odd layer memory cell that corresponds to any of said bit lines in the odd layers;

said sub-bit line selection circuit turns ON said second bit line selection switch element and said current limiting control circuit applies a voltage VCMN to the gate terminal of said N-type current limiting element and a voltage Vnsp to the gate terminal of said P-type current limiting element, when writing said even layer memory cell that corresponds to any of said bit lines in the odd layers;

said sub-bit line selection circuit turns ON said first bit line selection switch element and said current limiting control circuit applies the voltage Vnsn to the gate terminal of said N-type current limiting element and the voltage VCMP to the gate terminal of said P-type current limiting element, when writing said odd layer memory cell that corresponds to any of said bit lines in the even layers; and said sub-bit line selection circuit turns ON said first bit line selection switch element and said current limiting control circuit applies the voltage VCMN to the gate terminal of said N-type current limiting element and the voltage Vnsp to the gate terminal of said P-type current limiting element, when writing said even layer memory cell that corresponds to any of said bit lines in the even layers.

26. The cross point variable resistance nonvolatile memory device according to claim 20, further comprising
a sub-bit line selection circuit that controls said first bit line selection switch element and said second bit line selection switch element,
wherein, in the case where said first electrode is positioned above said second electrode in the Z direction in said variable resistance element in said memory cell:
said sub-bit line selection circuit turns ON said second bit line selection switch element and said current limiting control circuit applies a voltage VCMN to the gate terminal of said N-type current limiting element and a voltage Vnsp to the gate terminal of said P-type current limiting element, when writing said odd layer memory cell that corresponds to any of said bit lines in the odd layers;
said sub-bit line selection circuit turns ON said second bit line selection switch element and said current limiting control circuit applies a voltage Vnsn to the gate terminal of said N-type current limiting element and a voltage VCMP to the gate terminal of said P-type current limiting element, when writing said even layer memory cell that corresponds to any of said bit lines in the odd layers;
said sub-bit line selection circuit turns ON said first bit line selection switch element and said current limiting control circuit applies the voltage VCMN to the gate terminal of said N-type current limiting element and the voltage Vnsp to the gate terminal of said P-type current limiting element, when writing said odd layer memory cell that corresponds to any of said bit lines in the even layers; and
said sub-bit line selection circuit turns ON said first bit line selection switch element and said current limiting control circuit applies the voltage Vnsn to the gate terminal of said N-type current limiting element and the voltage VCMP to the gate terminal of said P-type current limiting element, when writing said even layer memory cell that corresponds to any of said bit lines in the even layers.

27. The cross point variable resistance nonvolatile memory device according to claim 20,
wherein said current limiting control circuit includes:
a constant current source that generates a first current;
a first NMOS transistor having a first source terminal connected to a ground and a first drain terminal and a first gate terminal connected to each other, the first drain terminal being connected to an output terminal of said constant current source;
a second NMOS transistor having a second source terminal connected to the ground and a second gate terminal connected to the first gate terminal of said first NMOS transistor so that said second NMOS transistor is current-mirror-connected to said first NMOS transistor;
a first PMOS transistor having a third source terminal connected to a first power source and a third drain terminal and a third gate terminal connected to each other, the third drain terminal being connected to a second drain terminal of said second NMOS transistor, said first power source having the same voltage as a voltage applied to said global bit line when writing said memory cell that corresponds to any of said bit lines in the odd layers to the low resistance state;
a second power source that generates the third voltage which is a voltage for turning OFF said P-type current limiting element when writing said memory cell that corresponds to any of said bit lines in the even layers to the low resistance state, where a voltage generated at the first drain terminal of said first NMOS transistor is the first voltage and a voltage generated at the third drain terminal of said first PMOS transistor is the second voltage;
a third power source that generates the fourth voltage which is a voltage for turning OFF said N-type current limiting element when writing said memory cell that corresponds to any of said bit lines in the odd layers to the low resistance state; and
an output selection circuit that selectively outputs the first voltage and the third voltage in the case of writing said memory cell that corresponds to any of said bit lines in the even layers, and selectively outputs the second voltage and the fourth voltage in the case of writing said memory cell that corresponds to any of said bit lines in the odd layers,
said current limiting control circuit applies the first voltage to the gate terminal of said N-type current limiting element and the third voltage to the gate terminal of said P-type current limiting element, when writing said memory cell that corresponds to any of said bit lines in the even layers to the low resistance state, and
said current limiting control circuit applies the second voltage to the gate terminal of said P-type current limiting element and the fourth voltage to the gate terminal of said N-type current limiting element, when writing said memory cell that corresponds to any of said bit lines in the odd layers to the low resistance state.

28. The cross point variable resistance nonvolatile memory device according to claim 27,
wherein said current limiting control circuit further includes:
a second PMOS transistor;
a third NMOS transistor; and
a first pseudo memory cell in which a first fixed resistance element and said current steering element are connected in series with each other, said first fixed resistance element having a resistance value corresponding to the low resistance state of said variable resistance element,
said third NMOS transistor has a fourth drain terminal and a fourth gate terminal connected to each other,
said second PMOS transistor has a fifth source terminal connected to said first power source and a fifth drain terminal connected to the fourth drain terminal of said third NMOS transistor,
said third NMOS transistor has a fourth source terminal connected to one end of said first pseudo memory cell an other end of which is connected to the ground,
when a voltage generated at the fourth drain terminal of said third NMOS transistor is a fifth voltage, said current limiting control circuit further includes:
a fourth NMOS transistor;
a third PMOS transistor; and
a second pseudo memory cell in which a second fixed resistance element and said current steering element are connected in series with each other, said second fixed resistance element having a resistance value corresponding to the low resistance state of said variable resistance element,
said third PMOS transistor has a sixth drain terminal and a sixth gate terminal connected to each other,
said second pseudo memory cell has one end connected to a fourth power source and an other end connected to a sixth source terminal of said third PMOS transistor, said fourth power source having the same voltage as a voltage that is applied to said selected word line when writing said memory cell that corresponds to any of said bit lines in the even layers to the low resistance state, said fourth NMOS transistor has a seventh drain terminal connected to the sixth drain terminal of said third PMOS transistor, and a seventh source terminal connected to the ground, and when a voltage generated at the sixth drain terminal of said third PMOS transistor is a sixth voltage, said current limiting control circuit:

applies the first voltage to the gate terminal of said N-type current limiting element and the sixth voltage to the gate terminal of said P-type current limiting element, when writing said memory cell that corresponds to any of said bit lines in the even layers to the low resistance state; and applies the second voltage to the gate terminal of said P-type current limiting element and the fifth voltage to the gate terminal of said N-type current limiting element, when writing said memory cell that corresponds to any of said bit lines in the odd layers to the low resistance state.

29. The cross point variable resistance nonvolatile memory device according to claim 27, wherein said current limiting control circuit further includes a differential amplifier that amplifies a current drive capability at each of two output terminals of said output selection circuit.

* * * * *